(12) United States Patent
Takeda et al.

(10) Patent No.: US 7,830,703 B2
(45) Date of Patent: Nov. 9, 2010

(54) SEMICONDUCTOR DEVICE AND MANUFACTURING METHOD THEREOF

(75) Inventors: Koichi Takeda, Minato-ku (JP); Masahiro Nomura, Minato-ku (JP); Kiyoshi Takeuchi, Minato-ku (JP); Hitoshi Wakabayashi, Minato-ku (JP); Shigeharu Yamagami, Minato-ku (JP); Risho Koh, Minato-ku (JP); Koichi Terashima, Minato-ku (JP); Katsuhiko Tanaka, Minato-ku (JP); Masayasu Tanaka, Minato-ku (JP)

(73) Assignee: NEC Corporation, Tokyo (JP)

( * ) Notice: Subject to any disclaimer, the term of this patent is extended or adjusted under 35 U.S.C. 154(b) by 602 days.

(21) Appl. No.: 11/570,037

(22) PCT Filed: May 25, 2005

(86) PCT No.: PCT/JP2005/009570

§ 371 (c)(1),
(2), (4) Date: Feb. 16, 2007

(87) PCT Pub. No.: WO2005/119763

PCT Pub. Date: Dec. 15, 2005

(65) Prior Publication Data

US 2008/0079077 A1   Apr. 3, 2008

(30) Foreign Application Priority Data

Jun. 4, 2004  (JP) .............................. 2004-167466

(51) Int. Cl.
G11C 11/00  (2006.01)
(52) U.S. Cl. ............... 365/154; 257/903; 257/E21.661; 257/E27.098; 365/63

(58) Field of Classification Search ................. 257/903, 257/E21.661, E27.098, 204, 206; 365/63, 365/154, 156
See application file for complete search history.

(56) References Cited

U.S. PATENT DOCUMENTS 5,852,572 A * 12/1998 Jung et al. ................... 365/154

(Continued)

FOREIGN PATENT DOCUMENTS

JP   64-8670 A   1/1989

(Continued)

OTHER PUBLICATIONS

Park et al., "Static Noise Margin of the Full DG-CMOS SRAM Cell Using Bulk FinFETs (Omega MOSFETs)," In: IEEE International Electron Devices MEtting, 2002. IEDM '02 Technical Digest, pp. 411-414.*

(Continued)

*Primary Examiner*—Dang T Nguyen
*Assistant Examiner*—Alexander Sofocleous
(74) *Attorney, Agent, or Firm*—Sughrue Mion, PLLC

(57) ABSTRACT

A semiconductor device having SRAM cell units each comprising a pair of a first driving transistor and a second driving transistor, a pair of a first load transistor and a second load transistor, and a pair of a first access transistor and a second access transistor, wherein each of the transistors comprises a semiconductor layer projecting upward from a substrate plane, a gate electrode extending on opposite sides of the semiconductor layer so as to stride over a top of the semiconductor layer, a gate insulating film interposed between the gate electrode and the semiconductor layer, and a pair of source/drain areas formed in the semiconductor layer; and the first and second driving transistors each have a channel width larger than that of at least either each of the load transistors or each of the access transistors.

35 Claims, 36 Drawing Sheets

U.S. PATENT DOCUMENTS

| | | | |
|---|---|---|---|
| 6,413,802 B1 * | 7/2002 | Hu et al. | 438/151 |
| 6,534,805 B1 * | 3/2003 | Jin | 257/206 |
| 6,706,571 B1 * | 3/2004 | Yu et al. | 438/157 |
| 6,795,332 B2 * | 9/2004 | Yamaoka et al. | 365/154 |
| 6,803,610 B2 * | 10/2004 | Koolhaas et al. | 257/204 |
| 6,806,539 B2 * | 10/2004 | Aoki | 257/351 |
| 6,924,560 B2 * | 8/2005 | Wang et al. | 257/67 |
| 6,924,561 B1 * | 8/2005 | Hill et al. | 257/401 |
| 6,940,106 B2 * | 9/2005 | Shino | 257/206 |
| 6,977,837 B2 * | 12/2005 | Watanabe et al. | 365/156 |
| 7,079,413 B2 * | 7/2006 | Tsukamoto et al. | 365/154 |
| 7,164,175 B2 * | 1/2007 | Kawasaki et al. | 257/401 |
| 7,589,993 B2 * | 9/2009 | Yamaoka et al. | 365/154 |
| 2004/0046214 A1 * | 3/2004 | Ishigaki et al. | 257/393 |
| 2007/0257227 A1 * | 11/2007 | Yamada et al. | 252/62 |

FOREIGN PATENT DOCUMENTS

| | | | |
|---|---|---|---|
| JP | 2-263473 A | | 10/1990 |
| JP | 2002118255 A | * | 4/2002 |
| JP | 2002368135 A | * | 12/2002 |
| JP | 2003229575 A | * | 8/2003 |
| JP | 2005142289 A | * | 6/2005 |
| WO | WO 2005-036651 A1 | | 4/2005 |

OTHER PUBLICATIONS

Jeong-Hwan Yang, et al, "Fully Working 1.25 $\mu m^2$ 6T-SRAM Cell with 45nm Gate Length Triple Gate Transistors", Technology Development Team and Home Platform Team. System LSI Division, Samsung Electronics, pp. 0/7803-7872-5/03.

E.J. Nowak. et al, "IDEM Technical Digest International Electron Devices Meeting", San Francisco, CA, Dec. 8-11, 2002, pp. 0/7803-7462-2/02.

Fu-Lian Yang, et al, "A 65nm Node Strained SOI Technology with Slim Spacer", Taiwan Semiconductor Manufacturing Company, pp. 0-78037872-5/03.

* cited by examiner (a) RELATED ART (b) RELATED ART (a)

(b)

(c)

(a)

(b)

(a)  (b)

(a)　　　　　　　(b)

(a)  (b)

(a)  (b)

(a)  (b)

(a)  (b)

(a)     (b)

(a)  (b)

US 7,830,703 B2

SEMICONDUCTOR DEVICE AND MANUFACTURING METHOD THEREOF

This application claims priority from PCT Application No. PCT/JP2005009570 filed May 25, 2005, and from Japanese Patent Application No. 2004-167466 filed Dec. 15, 2005, which applications are incorporated herein by reference.

TECHNICAL FIELD

The present invention relates to a semiconductor device and a method for manufacturing this semiconductor device, and in particular, to a semiconductor storage device comprising an SRAM (Static Random Access Memory) and a method for manufacturing this semiconductor device.

BACKGROUND ART

SRAM memory cells that are semiconductor storage elements have a basic structure described below.

As shown in a circuit diagram in FIG. 1, the SRAM memory cell is composed of a flip flop circuit serving as an information storage section, and a pair of access transistors $A_1$ and $A_2$ which controls the conduction between and the flip flop circuit and data lines (bit lines $BL_1$ and $BL_2$) through which information is written or read. The flip flop circuit is composed of, for example, a pair of CMOS inverters each composed of one driving transistor $D_1$ ($D_2$) and one load transistor $L_1$ ($L_2$).

One of source and drain areas of the access transistor $A_1$ ($A_2$) is connected to a drain of the load transistor $L_1$ ($L_2$) and driving transistor $D_1$ ($D_2$). The other is connected to the bit line $BL_1$ ($BL_2$). Further, gates of the pair of access transistors $A_1$ and $A_2$ each constitute a part of a word line WL and are connected together.

A gate of the driving transistor $D_1$ and load transistor $L_1$ constituting one of the CMOS inverters is connected to a drain (storage node $N_2$) of the driving transistor $D_2$ and load transistor $L_2$ constituting the other CMOS inverter. Further, a gate of the driving transistor $D_2$ and load transistor $L_2$ constituting the latter CMOS inverter is connected to a drain (storage node $N_1$) of the driving transistor $D_1$ and load transistor $L_1$ constituting the former CMOS inverter. Thus, between the pair of CMOS inverters, the I/O section of one of the CMOS inverters is cross coupled to the gate of the other CMOS inverter via a pair of wires 11 and 12 called local wires.

A reference voltage (Vss, for example, GND) is supplied to a source area of each of the driving transistors $D_1$ and $D_2$. A power supply voltage (VDD) is supplied to a source area of each of the load transistors $L_1$ and $L_2$.

The above SRAM cell offers excellent element characteristics such as its resistance to noise and low power consumption during standby. However, the SRAM cell disadvantageously requires a larger cell area because of the need for six transistors for one memory cell, the need for a large number of wires, and the need for the element isolation between a p-type MOS and an n-type MOS in the same cell.

As one type of MIS type field effect transistor (hereinafter referred to as "FET"), what is called an FIN type FET has been proposed. The FIN type FET has a rectangular parallelepiped semiconductor portion that projects perpendicularly to a substrate plane and a gate electrode that strides over a top surface of the rectangular parallelepiped semiconductor portion from one side to the other side. A gate insulating film is interposed between the rectangular parallelepiped semiconductor portion and the gate electrode. A channel is formed mainly along the opposite sides of the rectangular parallelepiped semiconductor portion. Such a FIN type FET is known to be advantageous for miniaturization because the channel width can be set perpendicularly to a substrate plane. The FIN type FET is also known to be advantageous for the improvement of various characteristics such as the improvement of a cutoff characteristic and carrier mobility and the reduction of a short channel effect and punch through.

As such a FIN type FET, Patent Document 1 (Japanese Patent Laid-Open No. 64-8670) discloses a MOS field effect transistor characterized in that a semiconductor portion having a source area, a drain area, and a channel area is shaped like a rectangular parallelepiped having sides almost perpendicular to the plane of a wafer substrate, in that the height of the rectangular parallelepiped semiconductor portion is larger than its width, and in that a gate electrode extends perpendicularly to the plane of the wafer substrate.

Patent Document 1 illustrates a form in which a part of the rectangular parallelepiped semiconductor portion is a part of the silicon wafer substrate and a form in which a part of the rectangular parallelepiped semiconductor portion is a part of a single crystal silicon layer in an SOI (Silicon On Insulator) substrate. The former is shown in FIG. 2(a) and the latter is shown in FIG. 2(b).

In the form shown in FIG. 2(a), a part of a silicon wafer substrate 101 is a rectangular parallelepiped portion 103. A gate electrode 105 extends along the opposite sides of the rectangular parallelepiped portion 103 over its top. The rectangular parallelepiped portion 103 has a source area and a drain area formed opposite the respective sides of the gate electrode. A channel is formed under an insulating film 104 under the gate electrode. The channel width is equal to double the height h of the rectangular parallelepiped portion 103. The gate length corresponds to the width L of the gate electrode 105. The rectangular parallelepiped portion 103 is composed of an inner unetched part of a trench formed by anisotropically etching the silicon wafer substrate 101. The gate electrode 105 is provided on an insulating film 102 formed in the trench so as to stride over the rectangular parallelepiped portion 103.

In the form shown in FIG. 2(b), an SOI substrate is provided which comprises a silicon wafer substrate 111, an insulating layer 112, and a silicon single crystal layer. The silicon single crystal layer is patterned to form a rectangular parallelepiped portion 113. A gate electrode 115 is provided on the exposed insulating layer 112 so as to stride over the rectangular parallelepiped portion 113. The rectangular parallelepiped portion 113 has a source area and a drain area formed opposite the respective sides of a gate electrode. A channel is formed under an insulating film 114 under the gate electrode. The channel width is equal to the sum of double the height a of the rectangular parallelepiped portion 113 and the width b of the rectangular parallelepiped portion 113. The gate length corresponds to the width L of the gate electrode 115.

On the other hand, Patent Document 2 (Japanese Patent Laid-Open No. 2002-118255) discloses a FIN type FET having a plurality of rectangular parallelepiped semiconductor portions (projecting semiconductor layers 213), for example, as shown in FIGS. 3(a) to 3(c). FIG. 3(b) is a sectional view taken along line B-B in FIG. 3(a). FIG. 2(c) is a sectional view taken along line C-C in FIG. 3(a). This FIN type FET has the plurality of projecting semiconductor layers 213 composed of a part of a well layer 211 in a silicon substrate 210 and arranged parallel to one another. A gate electrode 216 is provided so as to stride over the central part of these projecting semiconductor layers. The gate electrode 216 is formed so as to extend from a top surface of an insulating film 214 along the sides of the projecting semiconductor layers 213. An insulating film 218 is interposed between the projecting semiconductor layers and the gate electrode. A channel 215 is formed in the projecting semiconductor layer under the gate electrode. Further, a source/drain area 217 is formed in each projecting semiconductor layer. A high concentration impurity layer (punch through stopper layer) is provided in an area 212 under the source/drain area 217. Upper layer wires 229 and 230 are provided via an interlayer insulating film 226 and are connected to the source/drain area 207 and the gate electrode 216, respectively, via contact plugs 228. Patent Document 2 states that this structure enables the sides of the projecting semiconductor layer to be used as the channel width, allowing the planar area to be reduced compared to conventional planar FETs.

In recent years, attempts have been made to apply these FIN type FETs to SRAMs. For example, Patent Document 3 (Japanese Patent Laid-Open No. 2-263473) describes an example in which FIN type FETs are applied to some of the transistors (having gates composed of word lines) constituting memory cells in an SRAM. Non-Patent Document 1 (Fu-Liang Yang et al, IEDM (International Electron Devices Meeting), 2003, p. 627 to 630) shows the possibility of applying FIN type FETs to an SRAM. Non-Patent Document 2 (T. Part et al, IEDM, 2003, p. 27 to 30) and Non-Patent Document 3 (Jeong-Hwan Yang et al, IEDM, 2003, p. 23 to 26) describe examples in which FIN type FETs are applied to an SRAM.

DISCLOSURE OF THE INVENTION

An object of the present invention is to provide a high-density semiconductor device having superior element characteristics, comprising an SRAM that uses FIN type FETs.

The present invention includes aspects described in the following items (1) to (31) below.

(1) A semiconductor device having SRAM cell units each comprising a pair of a first driving transistor and a second driving transistor, a pair of a first load transistor and a second load transistor, and a pair of a first access transistor and a second access transistor, wherein:

each of the transistors comprises a semiconductor layer projecting upward from a substrate plane, a gate electrode extending on opposite sides of the semiconductor layer so as to stride over a top of the semiconductor layer, a gate insulating film interposed between the gate electrode and the semiconductor layer, and a pair of source/drain areas formed in the semiconductor layer; and the first and second driving transistors each have a channel width larger than that of at least either each of the load transistors or each of the access transistors.

(2) The semiconductor device according to item (1), wherein the first and second driving transistors each have a channel width larger than that of each of the access transistors.

(3) The semiconductor device according to item (1) or (2), wherein the first and second driving transistors and the first and second access transistors each have a channel width larger than that of each of the load transistors, (4) The semiconductor device according to item (1), wherein the first and second driving transistors each have a plurality of the semiconductor layers in one transistor, and the number of the semiconductor layers is larger than that of semiconductor layers constituting each of the access transistors.

(5) The semiconductor device according to item (1) or (4), wherein the first and second driving transistors and the first and second access transistors each have a plurality of the semiconductor layers in one transistor, and the number of the semiconductor layers is larger than that of semiconductor layers constituting each of the load transistors.

(6) The semiconductor device according to item (1), wherein the semiconductor layer of each of the first and second driving transistors has a height in a direction perpendicular to the substrate plane which height is larger than that of the semiconductor layer constituting each of the access transistors.

(7) The semiconductor device according to item (1) or (6), wherein the semiconductor layer of each of the first and second driving transistors and first and second access transistors has a height in a direction perpendicular to the substrate plane which height is larger than that of the semiconductor layer constituting each of the load transistors.

(8) The semiconductor device according to any one of items (1) to (7), wherein longitudinal directions of the semiconductor layers constituting the transistors in the SRAM cell unit each are located along a first direction, and between the adjacent SRAM cell units in the first direction; the semiconductor layer in one of the corresponding transistors is placed on a center line of the semiconductor layer of the other transistor which center line extends along the first direction.

(9) The semiconductor device according to item (8), wherein the semiconductor layers constituting the transistors in the SRAM cell unit have an equal width in a second direction parallel to the substrate plane and perpendicular to the first direction, and the semiconductor layers are arranged so that intervals between center lines of the semiconductor layers which center lines extend along the first direction are each an integral multiple of the minimum one of the intervals.

(10) The semiconductor device according to item (9), wherein in the SRAM cell unit, the first driving transistor has a semiconductor layer placed on a center line of the semiconductor layer of the first access transistor which center line extends along the first direction, and the second driving transistor has a semiconductor layer placed on a center line of the semiconductor layer of the second access transistor which center line extends along the first direction;

the first load transistor has a semiconductor layer adjacent to the semiconductor layer of the first driving transistor, and the second load transistor has a semiconductor layer adjacent to the semiconductor layer of the second driving transistor; and the first load transistor and the second load transistor are arranged so that the interval between the center line of the semiconductor layer of the first load transistor and the center line of the semiconductor layer of the second load transistor is equal to the minimum interval.

(11) The semiconductor device according to item (9), wherein in the SRAM cell unit, the first load transistor has a semiconductor layer placed on a center line of the semiconductor layer of the first access transistor which center line extends along the first direction, and the second load transistor has a semiconductor layer placed on a center line of the semiconductor layer of the second access transistor which center line extends along the first direction;

the first driving transistor has a semiconductor layer adjacent to the semiconductor layer of the first load transistor, and the second driving transistor has a semiconductor layer adjacent to the semiconductor layer of the second load transistor; and the first driving transistor and the second driving transistor are arranged so that the interval between the center line of the semiconductor layer of the first driving transistor and the center line of the semiconductor layer of the second driving transistor is equal to the minimum interval.

(12) The semiconductor device according to any one of items (9) to (11), wherein the interval between the center lines extending along the first direction of the semiconductor layers of the first driving transistor and the first load transistor which are adjacent to each other is at least double the minimum interval; and the interval between the center lines extending along the first direction of the semiconductor layers of the second driving transistor and the second load transistor which are adjacent to each other is at least double the minimum interval.

(13) The semiconductor device according to any one of items (9) to (12), wherein between the adjacent SRAM cell units in the second direction, the access transistors of one and the other of the SRAM cell units are arranged adjacent to each other, and the interval between the center lines extending along the first direction of the semiconductor layers of one and the other of the access transistors is at least double the minimum interval.

(14) The semiconductor device according to any one of items (8) to (13), wherein in the SRAM cell unit, the gate electrode of the first driving transistor and the gate electrode of the first load transistor are formed of a first wire extending along the second direction perpendicular to the first direction, and the gate electrode of the second driving transistor and the gate electrode of the second load transistor are formed of a second wire extending along the second direction; and the gate electrode of the first access transistor is formed of a third wire placed on a center line of the second wire extending along the second direction and the gate electrode of the second access transistor is formed of a fourth wire placed on a center line of the first wire extending along the second direction.

(15) The semiconductor device according to any one of items (8) to (14), wherein a ground line contact connected to the source area of the first driving transistor, a power source line contact connected to the source area of the first load transistor, and a bit line contact connected to the source/drain area of the second access transistor are arranged on one line at one of cell unit boundaries extending along the second direction; and a ground line contact connected to the source area of the second driving transistor, a power source line contact connected to the source area of the second load transistor, and a bit line contact connected to the source/drain area of the first access transistor are arranged on one line at the other cell unit boundary extending along the second direction.

(16) The semiconductor device according to any one of items (8) to (15), wherein each of the ground line contacts, the power source line contacts, and the bit line contacts has a width in the second direction which is larger than the width in the second direction of the semiconductor layer under the gate electrode, and is connected to a pad semiconductor layer integrated with the semiconductor layer.

(17) The semiconductor device according to any one of items (8) to (16), wherein the adjacent SRAM cell units are in a mirror image relationship with respect to the cell unit boundary, which serves as a symmetry axis.

(18) The semiconductor device according to any one of items (1) to (17), wherein each of the semiconductor layers constituting the transistors in the SRAM cell unit is made of a semiconductor layer provided on an insulating layer.

(19) The semiconductor device according to any one of items (8) to (17), wherein in the SRAM cell unit, each of the semiconductor layers constituting the transistors is made of a semiconductor layer provided on an insulating layer; and the first driving transistor has a semiconductor layer integrated with the semiconductor layer of the first access transistor and the semiconductor layer of the first load transistor, and the second driving transistor has a semiconductor layer integrated with the semiconductor layer of the second access transistor and the semiconductor layer of the second load transistor.

(20) The semiconductor device according to any one of items (8) to (17), wherein in the SRAM cell unit, each of the semiconductor layers constituting the transistors is made of a semiconductor layer provided on an insulating layer;

the SRAM cell unit has, on the insulating layer, a first semiconductor layer area integrated with the semiconductor layer of the first driving transistor, the semiconductor layer of the first load transistor and the semiconductor layer of the first access transistor and having a junction between an area of the first conductivity type and an area of the second conductivity type together, and a second semiconductor layer area integrated with the semiconductor layer of the second driving transistor, the semiconductor layer of the second load transistor and the semiconductor layer of the second access transistor and having a junction between an area of the first conductivity type and an area of the second conductivity type together; and the first node contact connected to a drain area of the first driving transistor and to a drain area of the first load transistor is connected to the first semiconductor layer area, and the second node contact connected to a drain area of the second driving transistor and to a drain area of the second load transistor is connected to the second semiconductor layer area.

(21) The semiconductor device according to any one of items (1) to (17), wherein each of the semiconductor layers constituting the transistors in the SRAM cell unit is formed of a part of a semiconductor substrate and projects from a top surface of an isolating insulating film on the semiconductor substrate.

(22) A method for manufacturing a semiconductor device according to any one of items (8) to (17), comprising the steps of:

pattering a semiconductor layer to form a semiconductor pattern having a striped pattern in which elongate semiconductor layers extending in a first direction and having an equal width in a second direction perpendicular to the first direction are arranged at equal intervals;

removing a part of the striped pattern;

forming a gate insulating film on sides of the remaining elongate semiconductor layers;

depositing a gate electrode material and pattering the gate electrode material deposit film to form gate electrodes each extending on opposite surfaces of the elongate semiconductor layer along the second direction so as to stride over a top of the elongate semiconductor layer; and doping impurities into each elongate semiconductor layer to form source/drain areas.

(23) The method for manufacturing a semiconductor device according to item (22), wherein the semiconductor layer patterns are line symmetric with respect to each of four sides of a rectangular unit boundary corresponding to an SRAM cell unit boundary, which serves as a symmetry axis.

(24) The method for manufacturing a semiconductor device according to item (22) or (23), further comprising the steps of, in the step of forming the semiconductor layer pattern, forming a band-like pattern which crosses the elongate semiconductor layers and which has a width in a first direction which is larger than the width in a second direction of the elongate semiconductor layers;

in the step of removing a part of the striped pattern, also removing a part of the band-like pattern to form pad semiconductor layers each having a width in the second direction which is larger than the with in the second direction of each of the elongate semiconductor layers; and forming contact plugs that connect to the pad semiconductor layers after forming an interlayer insulating film all over the surface.

(25) The semiconductor device according to any one of items (1) to (7), wherein in the SRAM cell unit, semiconductor layers of a first access transistor and a second access transistor are located so that their longitudinal directions extend along a first direction and the semiconductor layers are arranged adjacent and parallel to one another along the second direction perpendicular to the first direction;

gate electrodes of the first and second access transistors are formed of a common word wire placed along the second direction so as to cross the semiconductor layers of the access transistors;

semiconductor layers of a first driving transistor and a first load transistor are located so that their longitudinal directions extend along the second direction and the semiconductor layers are arranged adjacent and parallel to one another along the first direction; and semiconductor layers of a second driving transistor and a second load transistor are located so that their longitudinal direction extend along the second direction and so that the semiconductor layers are arranged adjacent and parallel to one another along the first direction.

(26) The semiconductor device according to item (25), wherein in the SRAM cell unit, each of the semiconductor layers constituting the transistors is made of a semiconductor layer provided on an insulating layer; and the first driving transistor has a semiconductor layer integrated with the semiconductor layer of the first access transistor and the semiconductor layer of the first load transistor, and the second driving transistor has a semiconductor layer integrated with the semiconductor layer of the second access transistor and the semiconductor layer of the second load transistor.

(27) The semiconductor device according to item (25), wherein in the SRAM cell unit, each of the semiconductor layers constituting the transistors is made of a semiconductor layer provided on an insulating layer;

the SRAM cell unit has, on the insulating layer, a first semiconductor layer area integrated with the semiconductor layer of the first driving transistor, the semiconductor layer of the first load transistor, and the semiconductor layer of the first access transistor and having a junction between an area of a first conductivity type and an area of a second conductivity type which junction is perpendicular to the substrate plane, and a second semiconductor layer area integrated with the semiconductor layer of the second driving transistor, the semiconductor layer of the second load transistor, and the semiconductor layer of the second access transistor and having a junction between an area of a first conductivity type and an area of a second conductivity type which junction is perpendicular to the substrate plane; and a first node contact that connects to the drain area of the first driving transistor and to the drain area of the first load transistor connects to the first semiconductor layer area, and a second node contact that connects to the drain area of the second driving transistor and to the drain area of the second load transistor connects to the second semiconductor layer area.

(28) The semiconductor device according to any one of items (25) to (27), wherein between the adjacent SRAM cell units, a semiconductor layer pattern including the semiconductor layers constituting the transistors and a gate wire pattern constituting the gate electrodes are in a mirror image relationship with respect to a cell unit boundary that serves as a symmetry axis.

(29) A method for manufacturing the semiconductor device according to item (1), the method comprising the steps of:

partly thinning a part of a semiconductor layer so that at least either an area in which the access transistors are to be formed or an area in which the load transistors are to be formed is thinner than an area in which the driving transistors are to be formed;

patterning the semiconductor layer partly thinned in the thinning step to form a semiconductor layer pattern having the semiconductor layers constituting the transistors;

forming a gate insulating layer on sides of each of the semiconductor layers;

depositing a gate electrode material and patterning the gate electrode material deposited film to form gate electrodes on opposite sides of the semiconductor layer constituting each transistor so that the gate electrode strides over the top of the semiconductor layer; and forming source/drain areas in the semiconductor layer.

(30) The method for manufacturing the semiconductor device according to item (29), wherein in the thinning step, the semiconductor layer is partly thinned so that the areas in which the access transistors are to be formed is thinner than the areas in which the driving transistors are to be formed; and an SRAM cell unit is formed in which the semiconductor layers constituting the first and second driving transistors each have a height in a direction perpendicular to the substrate plane which height is larger than that of each of the semiconductor layers constituting the first and second access transistors.

(31) The method for manufacturing the semiconductor device according to item (29) or (30), wherein in the thinning step, the semiconductor layer is partly thinned so that the areas in which the load transistors are to be formed is thinner than the areas in which the driving transistors and the access transistors are to be formed; and an SRAM cell unit is formed in which the semiconductor layers constituting the first and second driving transistors and first and second access transistors each have a height in a direction perpendicular to the substrate plane which height is larger than that of each of the semiconductor layers constituting the first and second load transistors.

The present invention can provide a high-density semiconductor device having superior element characteristics, to which FIN type FETs are applied.

BEST MODE FOR CARRYING OUT THE INVENTION

[Configuration of a FIN Type FET]

Figure 4:
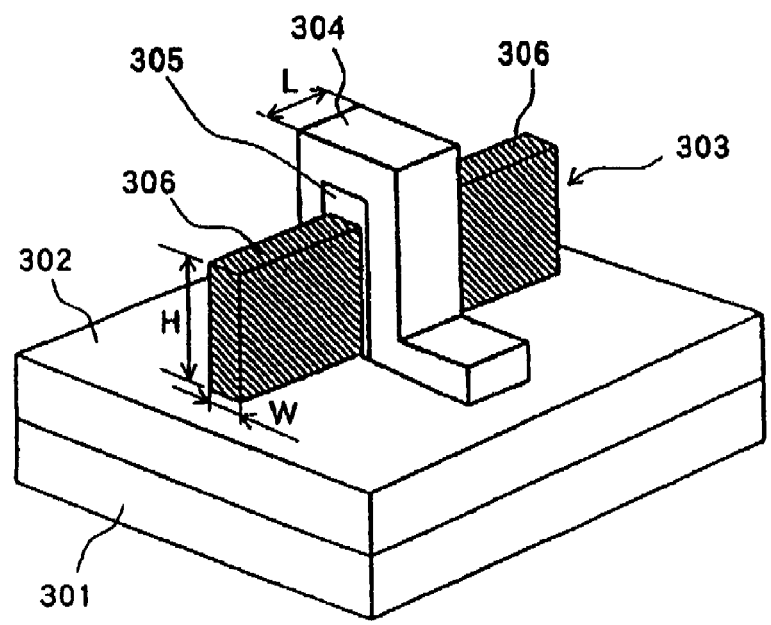
FIG. 4 is a diagram illustrating an element structure of an FIN type FET that is applied to the present invention.

A FIN type FET that is applied to an SRAM structure according to the present invention may be a field effect transistor having a semiconductor layer 303 that projects upward perpendicularly to a substrate plane, a gate electrode 304 that extends on the opposite sides of the semiconductor layer so as to stride over its top, a gate insulating film 305 interposed between the gate electrode 304 and the semiconductor layer 303, and a source/drain area 306 formed in the semiconductor layer 303, for example, as shown in FIG. 4.

The semiconductor layer (hereinafter referred to as a "projecting semiconductor layer") projecting upward perpendicularly to the substrate plane, constituting the FIN type FET, may be provided on a base insulating film 302 on a semiconductor substrate 301, for example, as shown in FIG. 4. In the present invention, the substrate plane is an arbitrary surface parallel to the substrate, in this case, the surface of the base insulating film. The base insulating film itself may be a substrate. Further, as described later, the semiconductor substrate may be patterned to form a semiconductor pattern so that the semiconductor layer portion projecting upward from the surface of the isolating insulation layer provided in the semiconductor pattern can be used as the projecting semiconductor layer of the FIN type FET. The latter configuration is advantageous in heat radiation and suppression of a substrate floating effect because the element can be driven to release heat or charges generated from the semiconductor layer to the semiconductor substrate. The projecting semiconductor layer of the FIN type FET may be shaped like a rectangular parallelepiped in accordance with machining accuracy. However, a shape different from the rectangular parallelepiped may be used provided that desired element characteristics are obtained.

In the FIN type FET according to the present invention, the gate electrode extends on the opposite sides of the projecting semiconductor layer so as to stride over its top. The gate insulating film is interposed between the gate electrode and the projecting semiconductor layer. Impurities are doped into a part under the gate electrode of the projecting semiconductor layer at a relatively low concentration depending on a predetermined threshold voltage. A voltage is applied to the gate electrode to form a channel. The insulating film interposed between each side (surface perpendicular to the substrate plane) of the projecting semiconductor layer and the gate electrode is allowed to function as a gate insulating film to enable a channel to be formed on the opposite sides of the projecting semiconductor layer. A thick cap insulating film can be provided between the top surface of the projecting semiconductor layer and the gate electrode to avoid forming a channel on the top surface of the projecting semiconductor layer. On the other hand, an insulating film that is as thin as the gate insulating film provided on the sides can be provided between the top surface of the projecting semiconductor layer and the gate electrode to allow a channel to be also formed on the top surface of the projecting semiconductor layer. Here, the channel length direction is the longitudinal direction of the projecting semiconductor layer 303, that is, a gate length L direction. The source/drain area 306 is normally constructed on the opposite sides of the gate electrode of the projecting semiconductor layer 303 using a diffusion layer into which impurities of a high concentration are doped. Alternatively, what is called a schottky source/drain transistor may be provided by forming the source/drain area of metal.

The FIN type FET according to the present invention may have what is called a multi-structure in which a plurality of projecting semiconductor layers are arranged in one transistor in parallel and in which a conductor wire striding over the plurality of projecting semiconductor layers constitutes a gate electrode. An element structure relating to each projecting semiconductor layer may be similar to that described above. In connection with the uniformity of element characteristics and machining accuracy, the projecting semiconductor layers preferably have an equal width W (width parallel to the substrate plane and perpendicular to the channel length direction).

In the Fin type MISFET according to the present invention, a main channel is preferably formed on the opposite sides of the projecting semiconductor layer. Further, the width W of the projecting semiconductor layer under the gate electrode is preferably such that the semiconductor layer is completely depleted by a depletion layer formed from the opposite sides of the semiconductor layer during operation. This configuration is advantageous for the improvement of the cutoff characteristic and carrier mobility and the reduction of the substrate floating effect. An element structure providing this configuration is preferably such that the width W of the projecting semiconductor layer under the gate electrode is at most double the height H of the semiconductor layer or at most the gate length L. Specifically, in connection with machining accuracy, strength, and the like, the width W of the projecting semiconductor layer under the gate electrode is preferably set to at least 5 nm, more preferably at least 10 nm. On the other hand, a dominant channel is formed on the sides of the semiconductor layer, and is preferably set to at most 60 nm, more preferably at most 30 nm, in order to provide a completely depleted structure.

The specific dimensions and the like of the FIN type FET according to the present invention can be appropriately set, for example, as follows. The projecting semiconductor layer has a width W of 5 to 100 nm, a height of 20 to 200 nm, and a gate length of 10 to 100 nm. The gate insulating film has a thickness of 1 to 5 nm (in the case of $SiO_2$). The concentration of impurities in the channel formed area is 0 to $1 \times 10^{19}$ $cm^{-3}$. The concentration of impurities in the source/drain area is $1 \times 10^{19}$ to $1 \times 10^{21}$ $cm^{-3}$. The height H of the projecting semiconductor layer means the length of a part of the semiconductor layer which projects upward from the surface of the base insulating film or isolating insulation film; the length is perpendicular to the substrate plane. Further, the channel formed area refers to a part of the projecting semiconductor layer which is located under the gate electrode.

In the above described element structure, a material for the base insulating film or isolating insulation film is not particularly limited provided that it has a desired insulating property. Examples of the material include metal oxide such as $SiO_2$, $Si_3N_4$, AlN, or alumina, and an organic insulating material.

The semiconductor forming the projecting semiconductor layer of the FIN type FET is preferably single crystal silicon.

The substrate under the base insulating film may be a silicon substrate. However, the present invention is not limited to the silicon substrate but can be established provided that an insulator is present under the projecting semiconductor layer. For example, a structure such as SOS (Silicon ON Sapphire, Silicon On Spinnel) may be used in which the insulator itself under the semiconductor layer constitutes a support substrate. The insulating support substrate may be, instead of the SOS, a quartz substrate or an AlN substrate. Manufacturing techniques (laminating process and thin film forming process) for SOI (Silicon On Insulator) enable the semiconductor layer to be provided on these support substrates.

A material for the gate electrode according to the present invention may be a conductor having a desired conductivity and a desired work function. Examples of the material include, for example, impurities-doped semiconductor such as impurities-doped polycrystalline silicon, polycrystalline SiGe, polycrystalline Ge, or polycrystalline SiC, metal such as Mo, W, or Ta, metal nitride such as TiN or WN, and a silicide compound such as cobalt suicide, nickel silicide, platinum silicide, or erbium silicide. Further, the structure of the gate electrode may be, instead of a singe layer, a stack structure such as a stack film of a polycrystalline silicon film and a metal film, a stack film of metal films, or a stack film of a polycrystalline silicon film and a silicide film.

The gate insulating film according to the present invention may be an $SiO_2$ film or an SiON film, or what is called a high-dielectric-constant film (High-K film). Examples of the High-K film may include, for example, a metal oxide film such as a $Ta_2O_5$ film, an $Al_2O_3$ film, an $La_2O_3$ film, an $HfO_2$ film, or a $ZrO_2$ film, and composite metal oxide indicated by a composition formula such as HfSiO, ZrSiO, HfAlO, or ZrAlO. Further, the gate insulating film may have a stack structure, for example, a stack structure in which a silicon containing oxide film such as $SiO_2$ or HfSiO is formed on a semiconductor layer such as silicon, with a High-K film provided on the silicon containing oxide film.

[Circuit Configuration of the SRAM Cell Unit]

Figure 1:
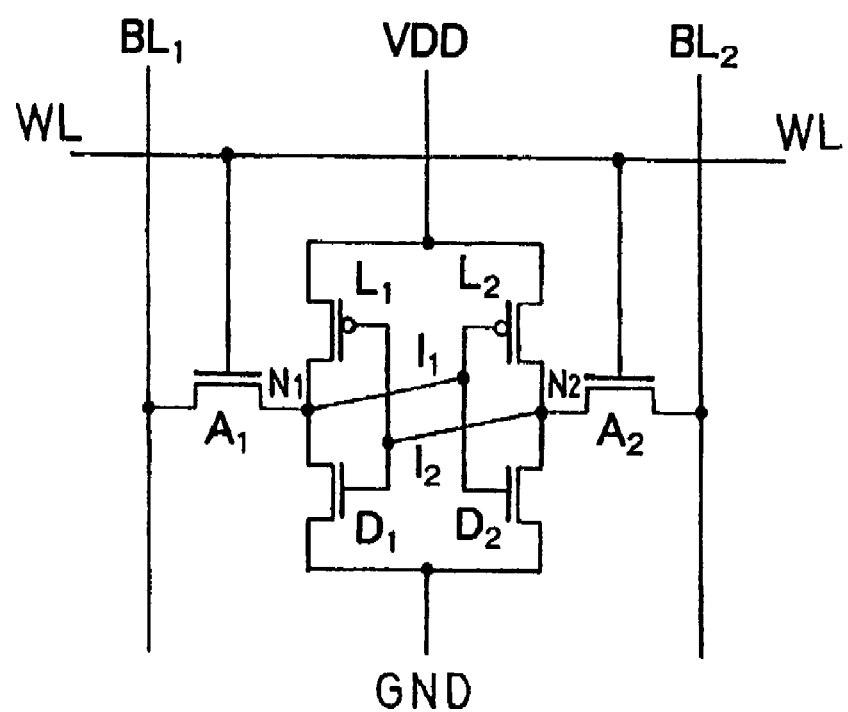
FIG. 1 is a circuit diagram of an SRAM.
Figure 2:
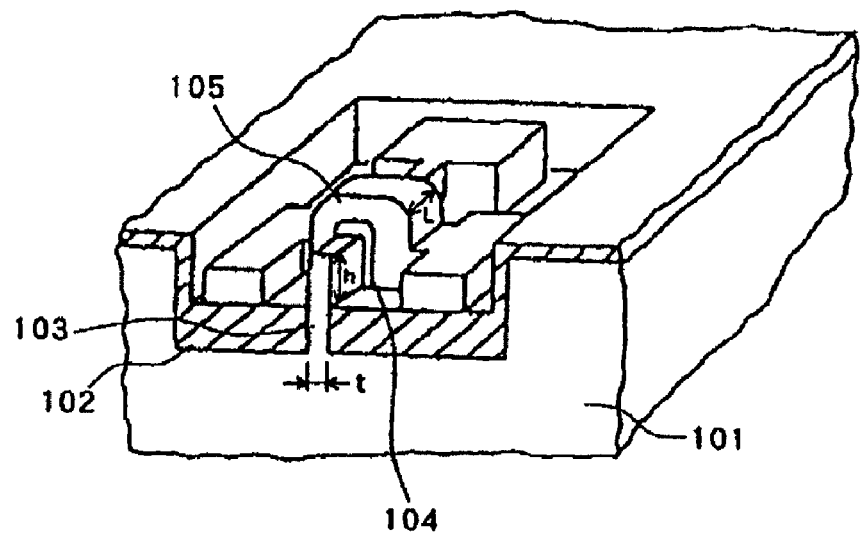
FIG. 2 is a diagram illustrating an element structure of a conventional FIN type FET.
Figure 2:
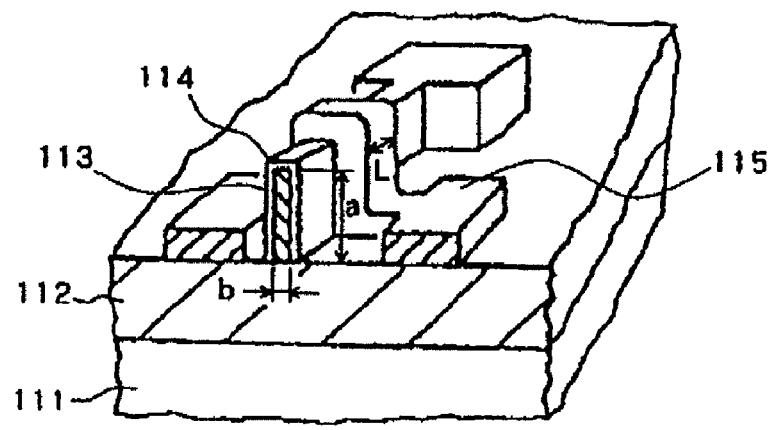
Figure 3:
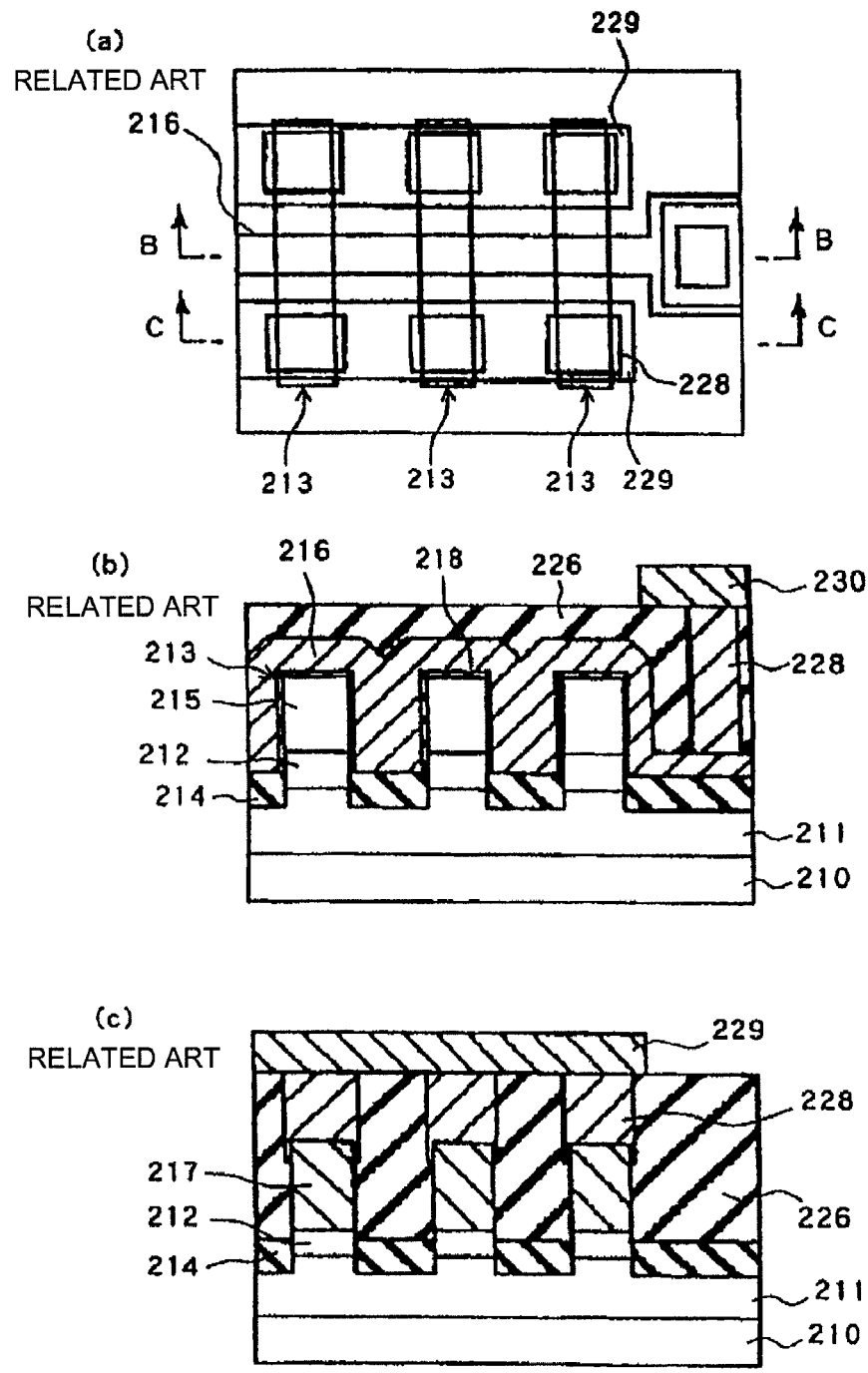
FIG. 3 is a diagram illustrating an element structure of a conventional FIN type FET.

The SRAM memory cell unit preferable for the present invention has a circuit shown in the circuit diagram in FIG. 1. The SRAM memory cell unit has six transistors, a pair of driving transistors $D_1$ and $D_2$, a pair of load transistors $L_1$ and $L_2$, and a pair of access transistors $A_1$ and $A_2$. The paired driving transistors $D_1$ and $D_2$ and the paired access transistors $A_1$ and $A_2$ are field effect transistors of a first conductivity type (for example, an n channel type). The paired load transistors $L_1$ and $L_2$ are field effect transistors of a second conductivity type (for example, a p channel type).

The paired driving transistors $D_1$ and $D_2$ and the paired load transistors $L_1$ and $L_2$ constitute a flip flop circuit serving as an information storing section that stores 1-bit information. The flip flop circuit is composed of a pair of CMOS inverters each composed of one driving transistor $D_1$ ($D_2$) and one load transistor $L_1$ ($L_2$).

One of source and drain of the access transistor $A_1$ ($A_2$) is connected to drains of the load transistor $L_1$ ($L_2$) and driving transistor $D_1$ ($D_2$), with the other connected to a bit line $BL_1$ ($BL_2$). Gates of the paired access transistors $A_1$ and $A_2$ are connected to a word line WL.

A gate of the driving transistor $D_1$ and load transistor $L_1$ constituting one of the CMOS inverters is connected to a drain (storage node $N_2$) of the driving transistor $D_2$ and load transistor $A_2$ constituting the other CMOS inverter. Further, a gate of the driving transistor $D_2$ and load transistor $L_2$ constituting the latter CMOS inverter is connected to a drain (storage node $N_1$) of the driving transistor $D_1$ and load transistor $L_1$ constituting the former CMOS inverter. Thus, between the pair of CMOS inverters, the I/O section (storage node) of one of the CMOS inverters is cross coupled to the gate of the other CMOS inverter via a pair of wires 11 and 12 called local wires.

A reference voltage (for example, GND) is supplied to a source of the driving transistors $D_1$ and $D_2$. A power supply voltage (VDD) is supplied to a source of the load transistors $L_1$ and $L_2$.

[Element Structure of the SRAM]

In the SRAM shown in FIG. 1, when the access transistor is turned on to read data, the data is likely to be destroyed. The magnitude of noise required to destroy data with the access transistor on is referred to as a noise margin. Noise resistance increases consistently with the noise margin. To increase the noise margin, the driving capacity of the driving transistor is desirably set larger than that of the access transistor. On the other hand, the operation speed of the SRAM increases in proportion to the driving capacities of the driving transistor and access transistor. Accordingly, for the operation speed, the driving capacities of the driving transistor and access transistor are desirably increased. The present invention provides a technique for enabling the driving capacity of each transistor to be set taking the required operation speed and noise resistance into account, allowing desired SRAM element characteristics to be obtained.

One of main characteristics of the present invention is that in the SRAM cell unit, the FIN type FET is applied to each transistor and the driving transistors $D_1$ and $D_2$ each have a larger channel width than at least either each of the load transistors ($L_1$ and $L_2$) or each of the access transistors ($A_1$ and $A_2$).

The driving capacity can be increased by increasing the channel widths of the driving transistors $D_1$ and $D_2$ and access transistors $A_1$ and $A_2$. Further, by setting the channel width of the driving transistors $D_1$ and $D_2$ larger than that of the access transistors $A_1$ and $A_2$, it is possible to increase the noise margin to provide a semiconductor device with a high noise resistance.

Forms having the above structure include a form (A) in which the transistors in the SRAM cell unit have different numbers of projecting semiconductor layers constituting one transistor and a form (B) in which the transistors in the SRAM cell unit have different projecting semiconductor layer heights, Specific forms will be described below.

(A-1) Form in which the driving transistors $D_1$ and $D_2$ and access transistors $A_1$ and $A_2$ each have a plurality of projecting semiconductor layers in one transistor, and the number of projecting semiconductor layers constituting one transistor is larger than that of projecting semiconductor layers constituting each of the load transistors $L_1$ and $L_2$.

(A-2) Form in which the driving transistors $D_1$ and $D_2$ each have a plurality of projecting semiconductor layers in one transistor, and the number of projecting semiconductor layers in the driving transistor is larger than that of projecting semiconductor layers constituting each of the access transistors $A_1$ and $A_2$.

(B-1) Form in which the projecting semiconductor layer of each of the driving transistors $D_1$ and $D_2$ and access transistors $A_1$ and $A_2$ has a height H in a direction perpendicular to the substrate plane which height is larger than that of each of the projecting semiconductor layers constituting each load transistor.

(B-2) Form in which the projecting semiconductor layer of each of the driving transistors $D_1$ and $D_2$ has a height H in a direction perpendicular to the substrate plane which height is larger than that of each of the projecting semiconductor layers constituting each of the access transistors $A_1$ and $A_2$.

The forms (A-1) and (A-2), in which the transistors have different numbers of projecting semiconductor layers, have what is called a multi-structure in which one transistor contains a plurality of projecting semiconductor layers that use their sides perpendicular to the substrate plane as a channel width. This enables a reduction in the planar area required per channel width, which is advantageous for miniaturization. Further, with the forms having the multi-structure, if plural types of transistors with different channel widths are provided in the SRAM cell unit, the desired channel width can be set by varying the number of projecting semiconductor layers in one transistor. These forms can thus be manufactured easily. Furthermore, with the fixed height of the projecting semiconductor layers, their channel width can be controlled by the number of projecting semiconductors of the same shape. This enables the uniformity of element characteristics to be improved.

On the other hand, with the forms (B-1) and (B-2), in which the transistors have different heights of the projecting semiconductor layers, if plural types of transistors with different channel widths are provided in the SRAM cell unit, the channel width can be controlled by the heights of the projecting semiconductor layers, which use their sides perpendicular to the substrate plane as the channel width. This enables a reduction in the planar area required per channel width, which is advantageous for miniaturization. The ratio of projecting semiconductor layers of different heights can be appropriately set depending on the desired element characteristics. For example, the ratio of the height of higher projecting semiconductor layers to the height of lower projecting semiconductor layers can be set within the range of 1.2 to 5, typically within the range of 1.5 to 3. Too small a value of this ratio prevents the desired characteristics from being offered. Too large a value of this ratio degrades the uniformity of the element characteristics.

With reference to the drawings, description will be given of the element structure of an SRAM unit preferable for the present invention.

First, the basic element structure of SRAM cell unit of the present invention will be described with reference to the structure shown in FIGS. 5 to 7. In these figures, for simplification of the description and illustration, the transistors in the SRAM cell unit have the same number of projecting semiconductor layers, the same projecting semiconductor layer height, and a fixed channel width. With this structure, any of the forms (A-1), (A-2), (B-1), and (B-2) provides a preferable SRAM structure for the present invention.

Figure 5:
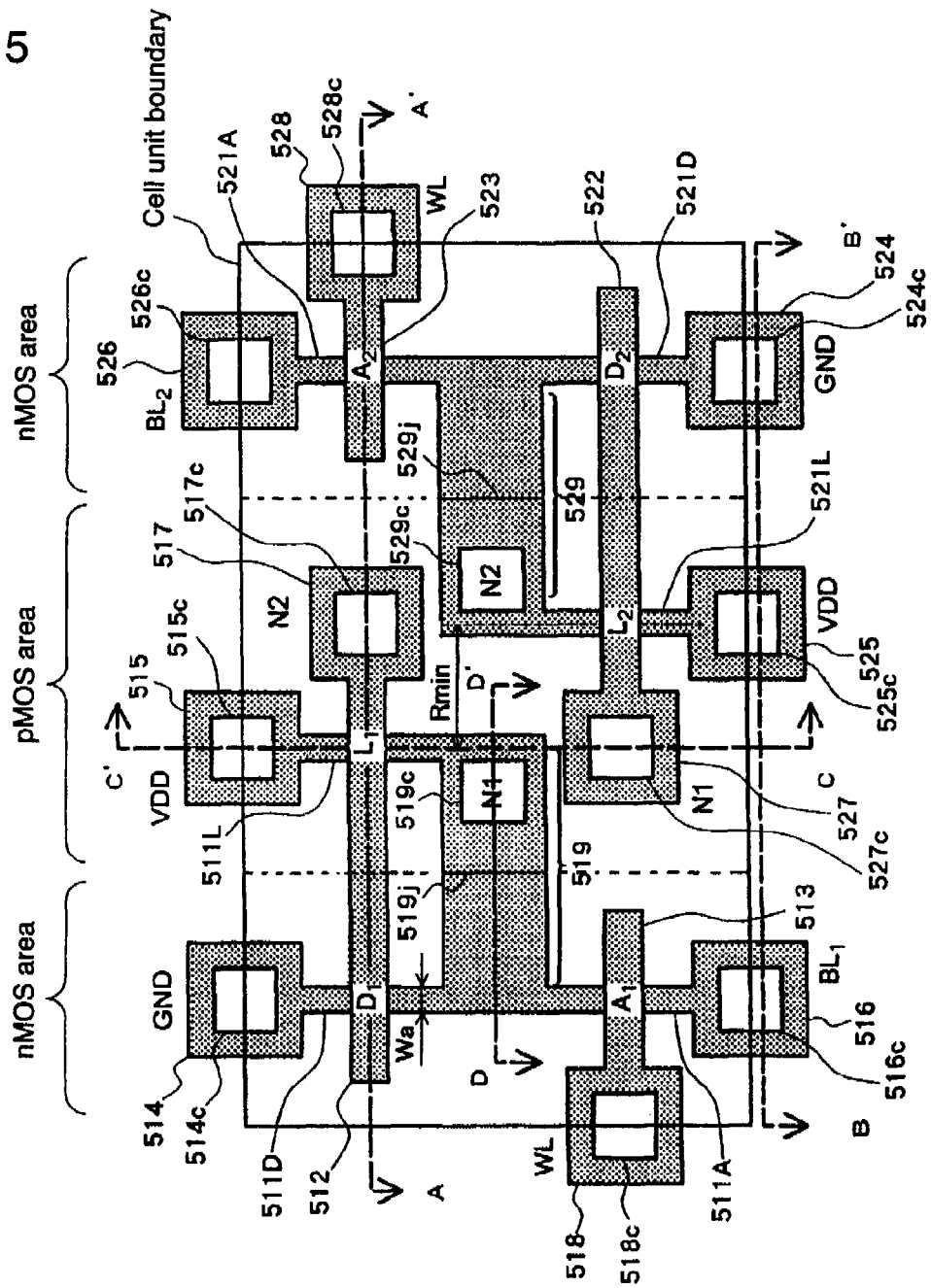
FIG. 5 is a diagram illustrating a basic element structure of an SRAM cell unit according to the present invention (plan view)

FIG. 5 is a plan view, FIG. 6(a) is a sectional view taken along line A-A', and FIG. 6(b) is a sectional view taken along line B-B'. FIG. 6(c) is a sectional view taken along line C-C', and FIG. 7 is a sectional view taken along line D-D'. In FIG. 5, side wall insulating films 508 are omitted. In FIGS. 6(a) to 6(c), vertical broken lines in the right and left of the figures indicate cell unit boundaries.

As shown in FIG. 5, inside the cell unit boundaries, the n-channel type driving transistors $D_1$ and $D_2$, the p-channel type load transistors $L_1$ and $L_2$, and the n-channel type access transistors $A_1$ and $A_2$ are arranged on an insulating layer 502 so as to constitute the circuit in FIG. 1; the insulating layer 502 is provided on a semiconductor substrate 501. The semiconductor layer portion in an nMOS area is an n-type area. The semiconductor layer portion in a pMOS area is a p-type area.

The driving transistor $D_1$ has a projecting semiconductor layer 511D, a gate electrode 512 extending on the opposite sides of the projecting semiconductor layer 511D so as to stride over its top, a gate insulating film 505 interposed between the gate electrode 512 and the projecting semiconductor layer 511D, and a source/drain area formed in the projecting semiconductor layer 511D on the opposite sides of the gate electrode (FIG. 6(a)). In this example, a cap insulating film 504 is provided between the top of the projecting semiconductor layer and the gate electrode. No channel is formed on the top surface of the projecting semiconductor layer. The other transistors also have cap insulating films. The other driving transistor $D_2$ has a projecting semiconductor layer 521D, a gate electrode 522 extending on the opposite sides of the projecting semiconductor layer 521D so as to stride over its top, the gate insulating film 505 interposed between the gate electrode 522 and the projecting semiconductor layer 521D, and a source/drain area formed in the projecting semiconductor layer 521D on the opposite sides of the gate electrode.

The load transistor $L_1$ has a projecting semiconductor layer 511L, the gate electrode 512 extending on the opposite sides of the projecting semiconductor layer 511L so as to stride over its top, the gate insulating film 505 interposed between the gate electrode 512 and the projecting semiconductor layer 511L, and a source/drain area formed in the projecting semiconductor layer 511L on the opposite sides of the gate electrode (FIGS. 6(a) and 6(c)). The other load transistor $L_2$ has a projecting semiconductor layer 521L, the gate electrode 522 extending on the opposite sides of the projecting semiconductor layer 521L so as to stride over its top, the gate insulating film 505 interposed between the gate electrode 522 and the projecting semiconductor layer 521L, and a source/drain area formed in the projecting semiconductor layer 521L on the opposite sides of the gate electrode.

The access transistor $A_1$ has a projecting semiconductor layer 511A, a gate electrode 513 extending on the opposite sides of the projecting semiconductor layer 511A so as to stride over its top, the gate insulating film 505 interposed between the gate electrode 513 and the projecting semiconductor layer 511A, and a source/drain area formed in the projecting semiconductor layer 511A on the opposite sides of the gate electrode. The other access transistor $A_2$ has a projecting semiconductor layer 521A, a gate electrode 523 extending on the opposite sides of the projecting semiconductor layer 521A so as to stride over its top, the gate insulating film 505 interposed between the gate electrode 523 and the projecting semiconductor layer 521A, and a source/drain area formed in the projecting semiconductor layer 521A on the opposite sides of the gate electrode (FIG. 6(a)).

Figure 36:
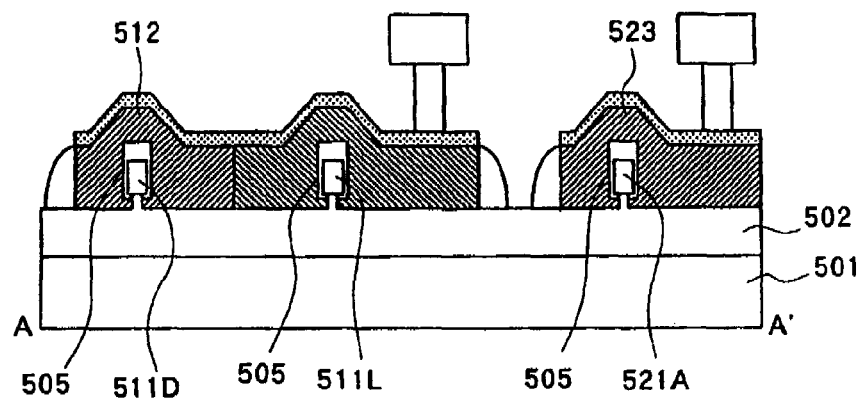
FIG. 36 is a diagram illustrating an element structure of an SRAM cell unit according to the present invention (Sectional view).

The transistors constituting the SRAM may have a structure shown in FIG. 36. FIG. 36 shows a sectional structure corresponding to FIG. 6(a) and in which a gate insulating film and a gate electrode are formed under a projecting semiconductor layer. This structure enables the bottom surface of the projecting semiconductor layer to be utilized as a channel, improving the ability to drive the transistors. This structure can be obtained by, for example, using the projecting semiconductor layer as a mask to isotropically etch the insulating layer 502 with fluoric acid or the like so that the insulating layer 502 is withdrawn under the projecting semiconductor layer, and then forming a gate insulating film and a gate electrode.

The source area of the driving transistor $D_1$ is connected to a ground line (GND) via a contact plug 514c that connects to a pad semiconductor layer 514 integrated with the projecting semiconductor layer 511D. On the other hand, the drain area of the driving transistor $D_1$ is connected to the gate electrode 522 of the driving transistor $D_2$ and load transistor $L_2$ via a contact plug 519c that connects to a first node semiconductor layer 519 integrated with the projecting semiconductor layer 511D.

The source area of the load transistor $L_1$ is connected to a power supply line VDD (upper layer wire 601g) via a contact plug 515c that connects to a pad semiconductor layer 515 integrated with the projecting semiconductor layer 511L. On the other hand, the drain area of the load transistor $L_1$ is connected to the gate electrode 522 of the driving transistor $D_2$ and load transistor $L_2$ via the contact plug 519c that connects to the first node semiconductor layer 519 integrated with the projecting semiconductor layer 511L.

One of source and drain areas of the access transistor $A_1$ is connected to the bit line $BL_1$ (upper layer wire 601c) via a contact plug 516c that connects to a pad semiconductor layer 516 integrated with the projecting semiconductor layer 511A. The other of source and drain areas of the access transistor $A_1$ is connected to the gate electrode 522 of the driving transistor $D_2$ and load transistor $L_2$ via the contact plug 519c that connects to the first node semiconductor layer 519 integrated with the projecting semiconductor layer 511A.

The source area of the driving transistor $D_2$ is connected to the ground line GND (upper layer wire 601e) via a contact plug 524c that connects to a pad semiconductor layer 524 integrated with the projecting semiconductor layer 521D. On the other hand, the drain area of the driving transistor $D_2$ is connected to the gate electrode 512 of the driving transistor $D_1$ and load transistor $L_1$ via a contact plug 529c that connects to a second node semiconductor layer 529 integrated with the projecting semiconductor layer 521D.

The source area of the load transistor $L_2$ is connected to the power supply line VDD (upper layer wire 601d) via a contact plug 525c that connects to a pad semiconductor layer 525 integrated with the projecting semiconductor layer 521L. On the other hand, the drain area of the load transistor $L_2$ is connected to the gate electrode 512 of the driving transistor $D_1$ and load transistor $L_1$ via the contact plug 529c that connects to the second node semiconductor layer 529 integrated with the projecting semiconductor layer 521L.

One of source and drain areas of the access transistor $A_2$ is connected to the bit line $BL_2$ via a contact plug 526c that connects to a pad semiconductor layer 526 integrated with the projecting semiconductor layer 521A. The other of source and drain areas of the access transistor $A_2$ is connected to the gate electrode 512 of the driving transistor $D_1$ and load transistor $L_1$ via the contact plug 529c that connects to the second node semiconductor layer 529 integrated with the projecting semiconductor layer 521A.

The gate electrode of the driving transistor $D_1$ and load transistor $L_1$ is composed of a common gate wire 512 and connected to the second node semiconductor layer 529 via an upper layer wire 601a and a contact plug 517c that connects to a pad electrode 517 having a width larger than that (gate length L) of the gate electrode.

The gate electrode of the driving transistor $D_2$ and load transistor $L_2$ is composed of a common gate wire 522 and connected to the first node semiconductor layer 519 via an upper layer wire 601f and a contact plug 527c that connects to a pad electrode 527 having a width larger than that (gate length L) of the gate electrode.

The gate electrode 513 of the access transistor $A_1$ is placed so that the longitudinal center line of its gate electrode 513 aligns with the longitudinal center line of the gate wire 522. The gate electrode 513 is connected to the word line WL via a contact plug 518c that connects to a pad electrode 518 having a width larger than that (gate length) of the gate electrode.

The gate electrode 523 of the access transistor $A_2$ is placed so that the longitudinal center line of its gate electrode 523 aligns with the longitudinal center line of the gate wire 512. The gate electrode 513 is connected to the word line WL (upper layer wire 601b) via a contact plug 528c that connects to a pad electrode 528 having a width larger than that (gate length) of the gate electrode.

In the SRAM structure according to the present invention, the adjacent SRAM cell units are preferably in a mirror image relationship with respect to the cell unit boundary, which serves as a symmetry axis. That is, between the adjacent SRAM cell units, the semiconductor layer patterns constituting the projecting semiconductor layers, the wire patterns constituting the gate electrodes, and the layout of the contacts are preferably arranged line-symmetrically (mirror inversion) with respect to each of the four sides of the cell unit boundary, which serves as a symmetry axis.

The above configuration enables the formation of dense SRAM cell units. Moreover, for example, a layout configuration shown in FIG. 5 and described below makes it possible to provide an SRAM structure which is easier to manufacture and which can be accurately formed.

The projecting semiconductor layers constituting the transistors in the SRAM cell unit are arranged so that their longitudinal direction (channel length direction) extends along the first direction (vertical direction of FIG. 5, that is, the direction of line C-C') and so that the intervals between the center lines of the projecting semiconductor layers which extend along the first direction are each an integral multiple of the minimum one of these intervals. These projecting semiconductor layers have an equal width W (Wa). Preferably, the minimum interval Rmin is the interval between the center line of projecting semiconductor layer of the load transistor $L_1$ and the center line of projecting semiconductor layer of the load transistor $L_2$. The center line of the projecting semiconductor layer is a line extending along the longitudinal direction (channel length direction) of the projecting semiconductor layer and passing though the middle point of width W (width parallel to the substrate plane and perpendicular to the channel length direction) of the projecting semiconductor layer.

As for any of these projecting semiconductor layers, between the adjacent SRAM cell units in the first direction, the center lines of the projecting semiconductor layers of one and the other of the corresponding transistors are preferably arranged on one line. However, sufficient effects can be exerted if the deviation is at most 20% of the minimum interval, preferably at most 10% of the minimum interval.

In the SRAM cell unit shown in FIG. 5, the driving transistor $D_1$ has a semiconductor layer that is formed integral with the projecting semiconductor layer of the access transistor $A_1$ and that is placed on the center line thereof. The other driving transistor $D_2$ has a semiconductor layer that is formed integral with the projecting semiconductor layer of the other access transistor $A_2$ and that is placed on the center line thereof. The load transistor $L_1$ has a semiconductor layer adjacent to the projecting semiconductor layer of the driving transistor $D_1$. The other load transistor $L_2$ has a semiconductor layer adjacent to the projecting semiconductor layer of the other driving transistor $D_2$.

In the SRAM cell unit according to the present invention, to ensure sufficient spaces for inter-gate separation and pn separation and a sufficient contact area, the layout configuration described below is preferably adopted, for example, as shown in FIG. 5.

(i) The interval between the center lines of the projecting semiconductor layers of the driving transistor $D_1$ and the adjacent load transistor $L_1$ and the interval between the center lines of the semiconductor layers of the other driving transistor $D_2$ and the adjacent other load transistor $L_2$ are each at least double the minimum interval Rmin.

(ii) Between the adjacent SRAM cell units in a second direction (lateral direction of FIG. 5; this will apply to the following description) perpendicular to the first direction, the interval between the center lines of the semiconductor layers of one and the other of the transistors is at least double the minimum interval Rmin.

Too large values of these intervals increase the area of the cell unit. Each of these intervals is thus preferably at most three times as large as the minimum interval Rmin.

Requirement (i) ensures sufficient spaces (between 517 and 523 and between 513 and 527) for inter-gate separation and sufficient spaces (near 519 and near 529) for pn separation. Requirement (ii) ensures sufficient spaces (near 518 and near 528) for contact with the word lines.

Further, with the SRAM cell unit according to the present invention, the layout of the contacts described below and, for example, shown in FIG. 5 serves to increase the density and to provide an SRAM structure that is easy to manufacture.

That is, the ground line contact 514c connected to the source area of the driving transistor $D_1$, the power source line contact 515c connected to the source area of the load transistor $L_1$, and the bit line contact 526c connected to the source/drain area of the access transistor $A_2$ are arranged on one line on one of the cell unit boundaries extending along the second direction. The ground line contact 524c connected to the source area of the other driving transistor $D_2$, the power source line contact 525c connected to the source area of the other load transistor $L_2$, and the bit line contact 516c connected to the source/drain area of the other access transistor $A_1$ are arranged on one line on the other cell unit boundary extending along the second direction.

Figure 6:
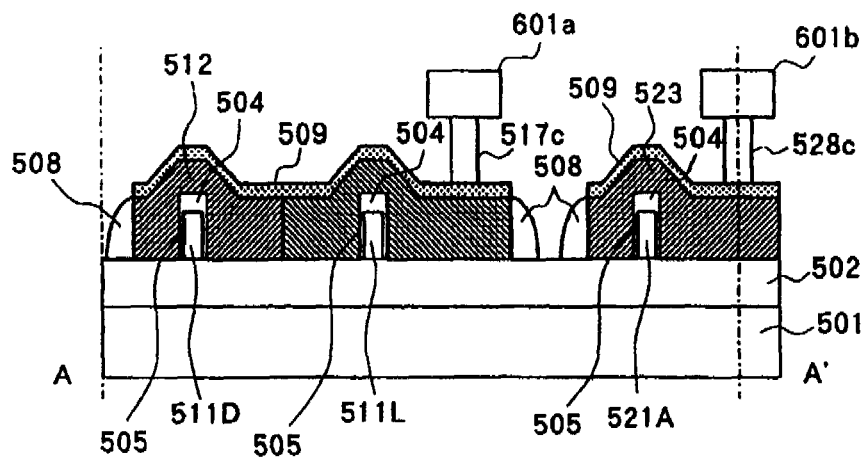
FIG. 6 is a diagram illustrating the basic element structure of the SRAM cell unit according to the present invention (sectional view)
Figure 6:
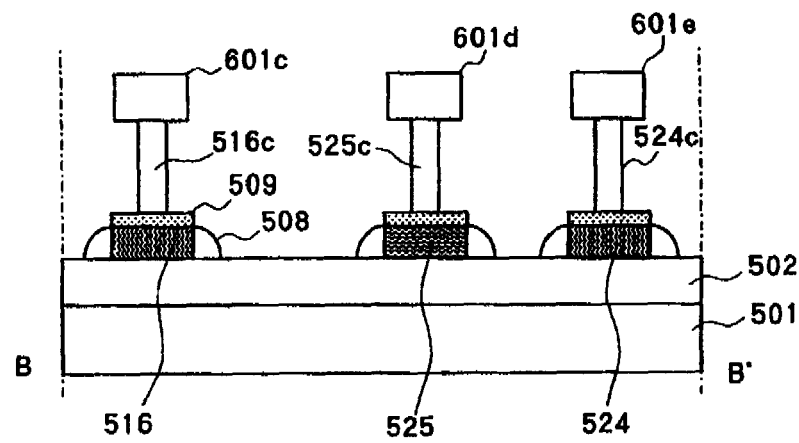
Figure 6:
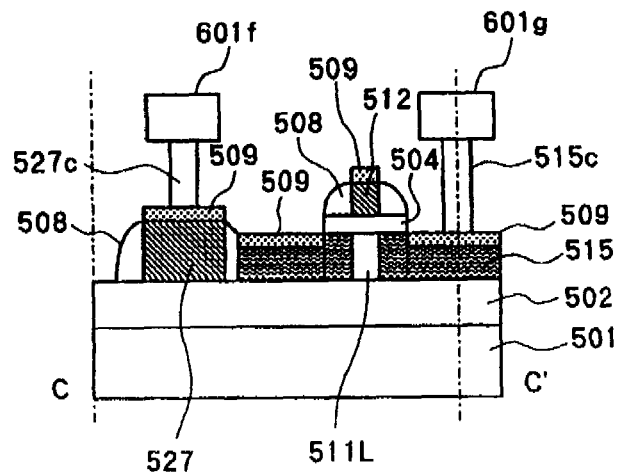
Figure 7:
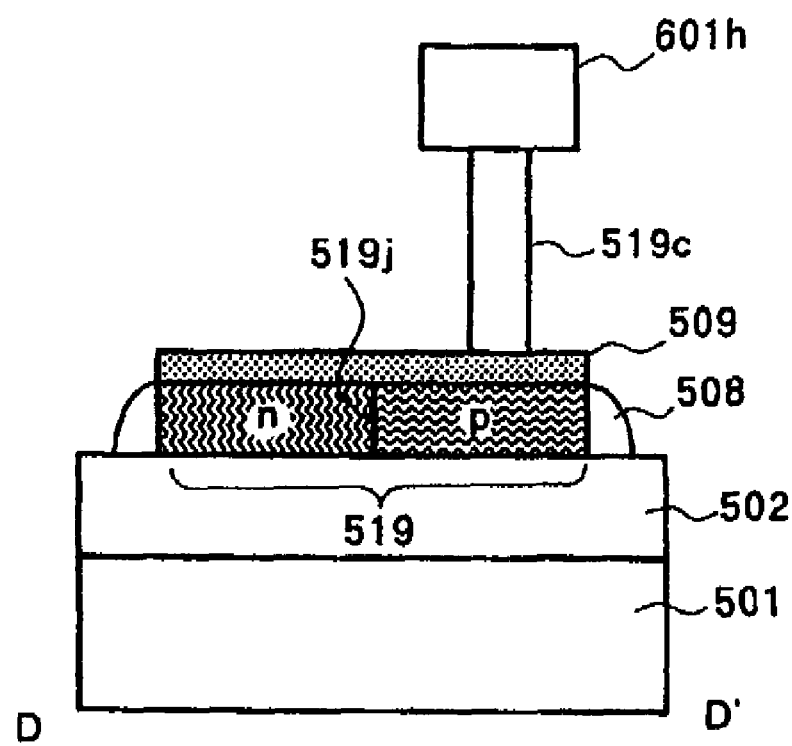
FIG. 7 is a diagram illustrating the basic element structure of the SRAM cell unit according to the present invention (sectional view)

In the SRAM structure shown in FIGS. 5 to 7, the projecting semiconductor layers of the transistors are provided on the insulating layer 502. A structure described below is available for this configuration. That is, for example, as shown in FIG. 5, in the SRAM cell unit, the driving transistor $D_1$ has a semiconductor layer 511D integrated with the semiconductor layer 511A of the access transistor $A_1$ and the semiconductor layer 511L of the load transistor $L_1$. The other driving transistor $D_2$ has a semiconductor layer 521D integrated with the semiconductor layer 521A of the other access transistor $A_2$ and the semiconductor layer 521L of the other load transistor $L_2$.

Moreover, this configuration may have the first node semiconductor layer 519 (FIG. 7) integrated with the semiconductor layer 511D of the driving transistor $D_1$, the semiconductor layer 511L of the load transistor $L_1$ and the semiconductor layer 511A of the access transistor $A_1$, and having a pn junction 519j of a p-type area and an n-type area; and the second node semiconductor layer 529 integrated with the semiconductor layer 521D of the driving transistor $D_2$, the semiconductor layer 521L of the load transistor $L_2$ and the semiconductor layer 521A of the access transistor $A_2$, and having a pn junction 529j of a p-type area and an n-type area.

According to the configuration, the semiconductor layer constituting the projecting semiconductor layer of each transistor is provided on the insulating layer. Thus, directly joining the p- and n-type areas together enables the drain of the driving transistor to be connected to the drain of the load transistor. The p-type area and the n-type area can be electrically short circuited by the silicide layer 509. This enables a reduction in the SRAM cell unit area. In contrast, a structure having a well area under the semiconductor layer requires an insulating isolation area to be interposed between the p-type area and the n-type area. This correspondingly increases the area. The above structure eliminates such an isolating insulation area, enabling an increase in density.

Further, in this structure, the node contact 519*c* connected to the upper layer wire 601*h* is connected to the first node semiconductor layer 519. The second node contact 529*c* connected to the upper layer wire is connected to the second node semiconductor layer 529. The first and second node semiconductor layers also function as contact pad layers. This configuration thus makes it possible to ensure a sufficient node contact area while increasing the density.

Now, description will be given of a method for manufacturing an SRAM structure as shown in FIGS. 5 to 7.

First, an SOI substrate is prepared which has a buried insulating film (base insulating film) made of $SiO_2$ on a silicon substrate and a semiconductor layer made of single crystal silicon provided on the buried insulating film. Then, a sacrifice oxide film is formed on the semiconductor layer of the SOI substrate. Impurities are ion implanted in the semiconductor layer via the sacrifice oxide film to form a channel area. The sacrifice oxide film is subsequently removed. A cap insulating film is then formed on the semiconductor layer. Doping impurities to form a channel area can be carried out by oblique ion implantation, Halo implantation or the like following patterning of the semiconductor layer.

Figure 8:
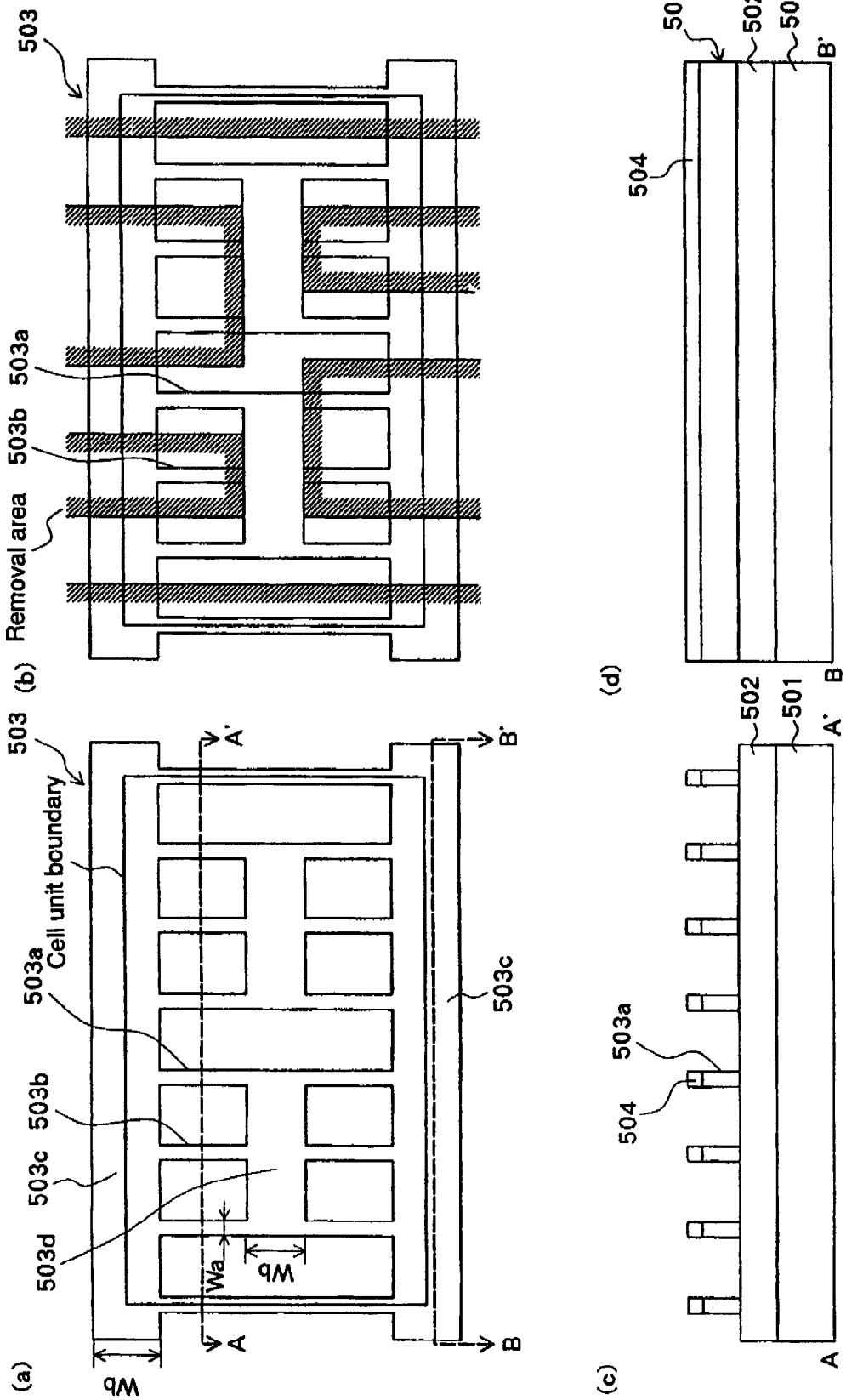
FIG. 8 is a diagram illustrating a method for manufacturing an SRAM structure according to the present invention.

Then, the semiconductor layer and the cap insulating film formed on the semiconductor layer are patterned by photolithography and dry etching to form a semiconductor layer pattern having a striped pattern portion in which elongate semiconductor layers are arranged at equal intervals. This state is shown in FIG. 8. FIGS. 8(*a*) and 8(*b*) are plan views. FIG. 8(*c*) is a sectional view taken along line A-A', FIG. 8(*d*) is a sectional view taken along line B-B'. Areas enclosed by oblique lines show areas from which the semiconductor layer is removed in a subsequent step. Reference numeral 501 in the figures denotes a semiconductor substrate. Reference numeral 502 denotes a buried insulating film. Reference numeral 503 denotes a semiconductor layer. Reference numerals 503*a* and 503*b* denote elongate semiconductor layers. Reference numeral 504 denotes a cap insulating film.

The elongate semiconductor layer 503*a* constitutes a projecting semiconductor layer of a FIN type FET. The elongate semiconductor layer 503*b* is a dummy semiconductor layer that is removed during a subsequent step. The semiconductor layer patterns 503, each including the elongate semiconductor layers 503*a* and 503*b*, are formed to be line symmetric (mirror inversion) with respect to each of four sides of the cell unit boundary corresponding to the SRAM cell unit boundary, which side serves as a symmetry axis. Formation of such high periodic patterns makes it possible to uniformly and accurately form fine patterns in this pattern area.

Band-like semiconductor layer portions 503*c* and 503*d* orthogonal to the elongate semiconductor layers 503*a* and 503*b* are partly removed during a subsequent step so that the remaining portions constitute pad semiconductor layers that contact to contact plugs. The band-like semiconductor layer portions 503*c* are formed into pad semiconductor layers for a ground line contact, a power source line contact, and bit line contacts. The band-like semiconductor layer portions 503*d* are formed into pad semiconductor layers for storage node contacts. The width Wb of each of these band-like semiconductor layers in the first direction is preferably set larger than that Wa of the elongate semiconductor layer in the second direction.

Figure 9:
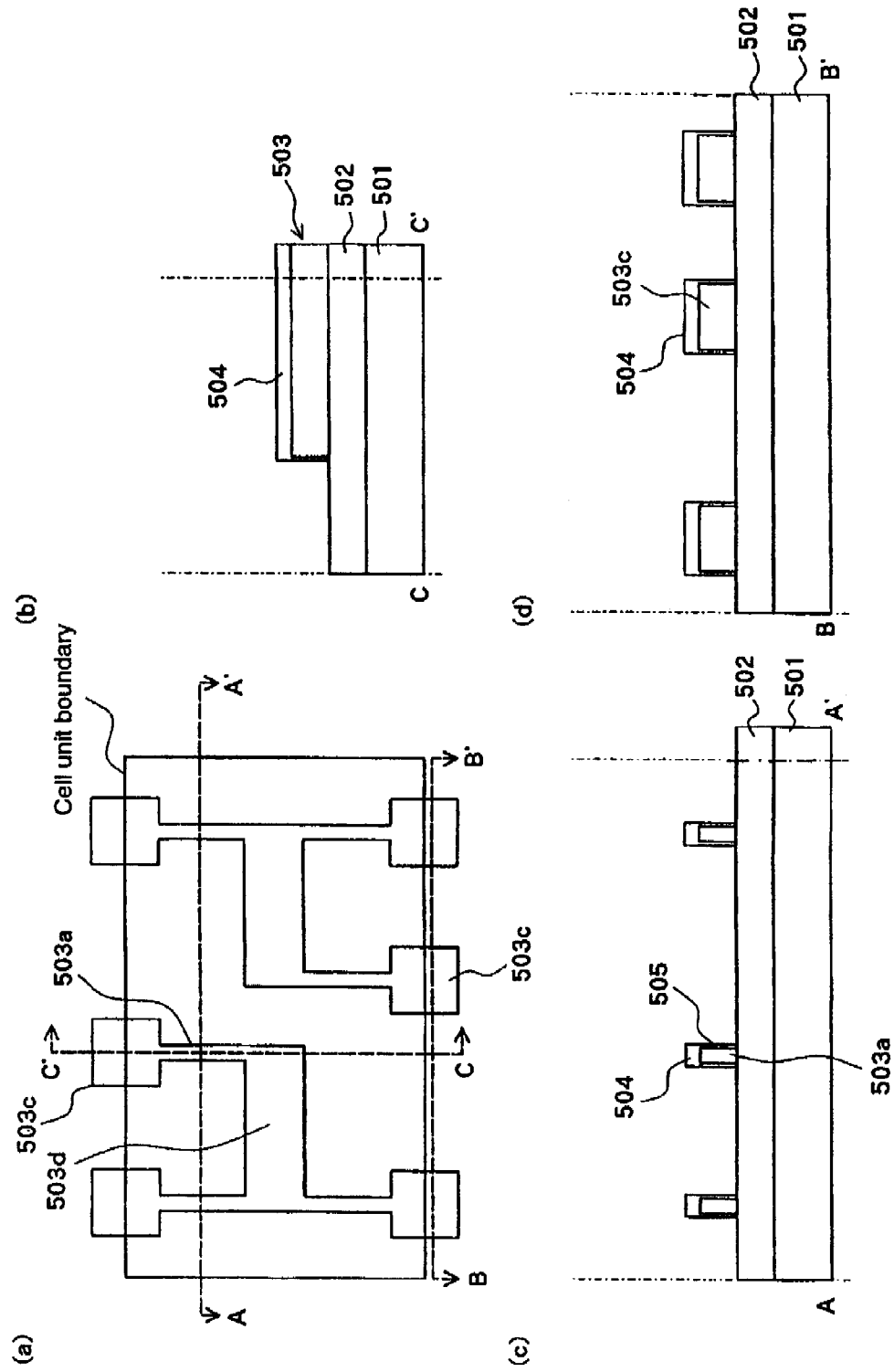
FIG. 9 is a diagram illustrating the method for manufacturing an SRAM structure according to the present invention.

Then, the unwanted portions of the semiconductor layer pattern are removed by lithography and dry etching. A gate oxide film 505 is formed on the sides of the elongate semiconductor layer by a thermal oxidation process or the like. This state is shown in FIG. 9. FIG. 9(*a*) is a plan view. FIG. 9(*b*) is a sectional view taken along line C-C'. FIG. 9(*c*) is a sectional view taken along line A-A'. FIG. 9(*d*) is a sectional view taken along line B-B'. Vertical broken lines in the right and left of each of FIGS. 9(*b*) to 9(*d*) indicate cell unit boundaries.

The remaining elongate semiconductor layer portions 503*a* constitute the projecting semiconductor layers of the FIN type FETs. The remaining band-like semiconductor layer portions 503*c* constitute the pad semiconductor layers for the ground line contact, power source line contact, and bit line contact. The remaining band-like semiconductor layer portions 503*d* constitute the pad semiconductor layers for the storage node contacts.

Then, a gate electrode material is deposited and formed into gate electrodes by lithography and dry etching. For example, polysilicon is deposited and lithography and ion implantation are used to dope n-type impurities (phosphorous, arsenic, or the like) into the nMOS area and p-type impurities (boron or the like) into the pMOS area. Gate wires are then formed by lithography and dry etching. This makes it possible to form gates of n-type polysilicon in the nMOS area and gates of p-type polysilicon in the pMOS area.

Then, impurities are doped into the elongate semiconductor layers through their sides by ion implantation oblique to the substrate plane, to form an extension dope area. On this occasion, lithography is used to dope the n-type impurities (phosphorous, arsenic, or the like) into the nMOS area and the p-type impurities (boron or the like) into the pMOS area. Halo implantation may be carried out before or after the ion implantation for forming the extension dope area; the Halo implantation involves ion implanting impurities of a conductivity type opposite to that of the extension dope area.

Figure 10:
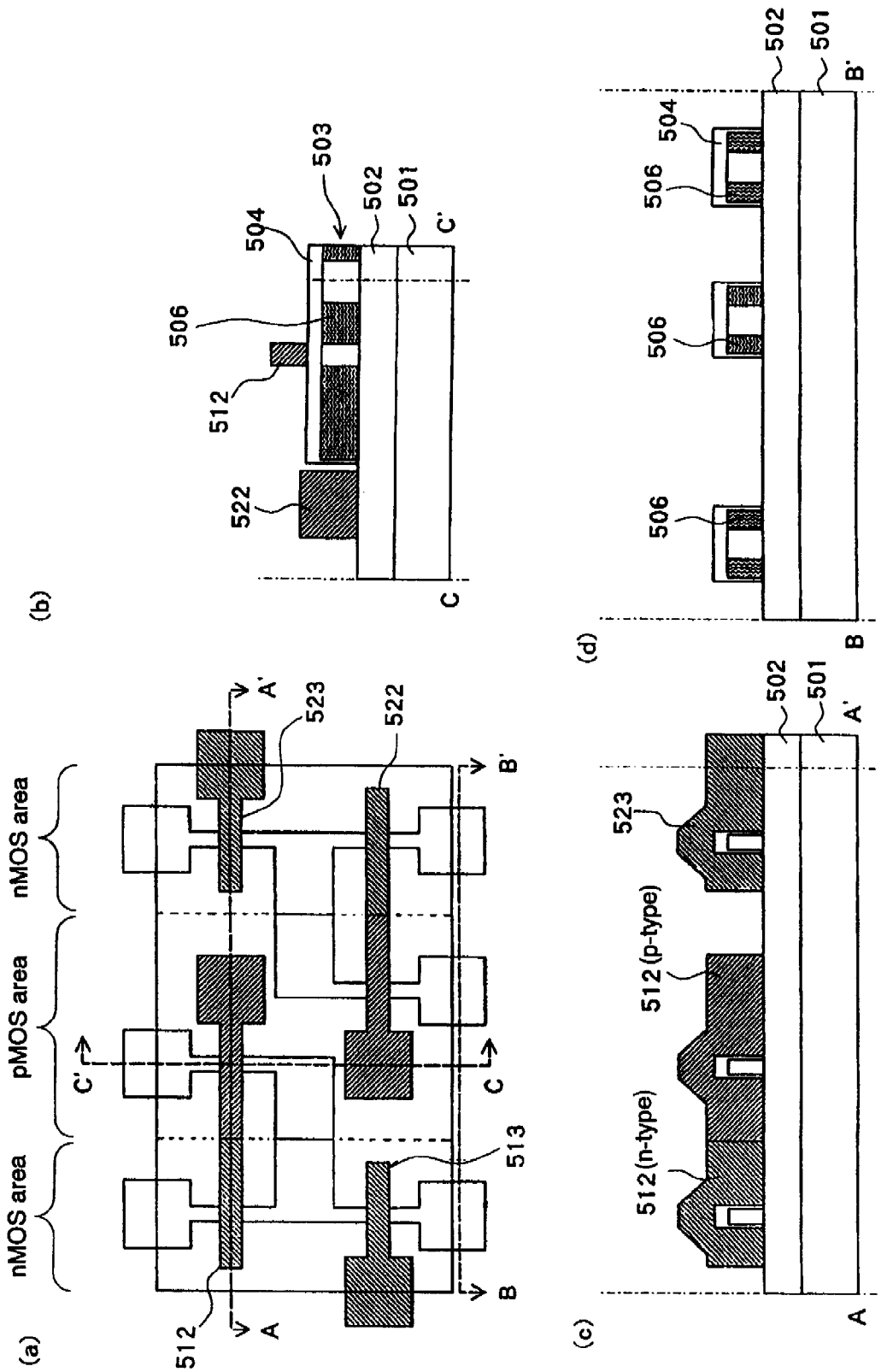
FIG. 10 is a diagram illustrating the method for manufacturing an SRAM structure according to the present invention.

This state is shown in FIG. 10. FIG. 10(*a*) is a plan view. FIG. 10(*b*) is a sectional view taken along line C-C'. FIG. 10(*c*) is a sectional view taken along line A-A'. FIG. 10(*d*) is a sectional view taken along line B-B'. Vertical broken lines in the right and left of each of FIGS. 10(*b*) to 10(*d*) indicate cell unit boundaries. Reference numerals 512, 513, 522, and 523 denote gate wires. Reference numeral 506 denotes an extension dope area.

Then, an insulating film is deposited all over the surface. The insulating film is then etched back by anisotropic etching to form a side wall insulating film. At this time, the cap insulating film 504 is also etched away to expose the top surface of the semiconductor layer except for the side wall insulating film.

Then, ions are implanted perpendicularly to the substrate plane to form a source/drain diffusion area. On this occasion, lithography is used to dope the n-type impurities (phosphorous, arsenic, or the like) into the nMOS area and the p-type impurities (boron or the like) into the pMOS area. The extension dope area, which does not overlap the source/drain diffusion area, constitutes an extension area. What is called an LDD (Lightly Doped Drain) structure is formed.

Figure 11:
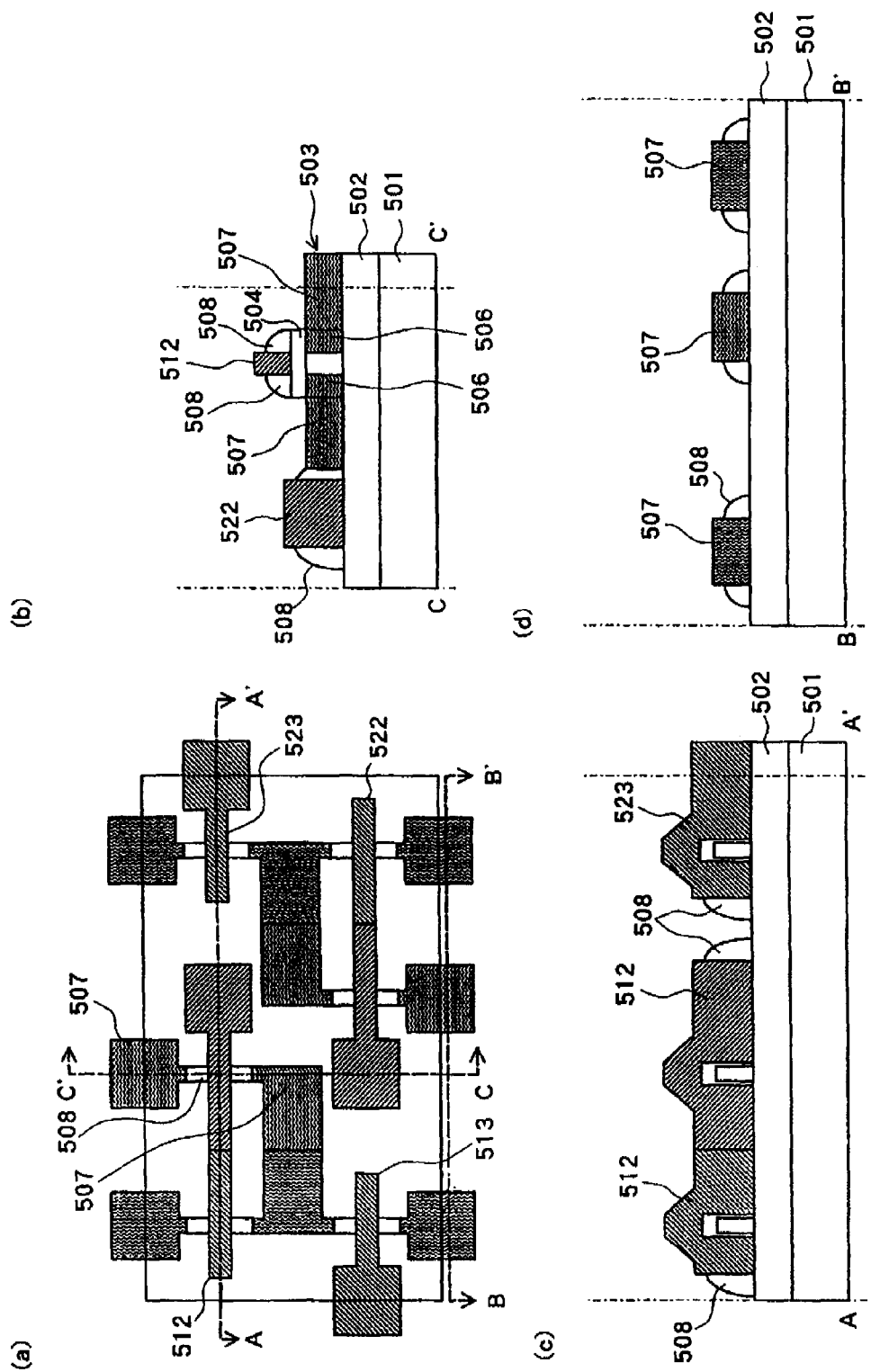
FIG. 11 is a diagram illustrating the method for manufacturing an SRAM structure according to the present invention.

This state is shown in FIG. 11. FIG. 11(*a*) is a plan view. FIG. 11(*b*) is a sectional view taken along line C-C'. FIG. 11(*c*) is a sectional view taken along line A-A'. FIG. 11(*d*) is a sectional view taken along line B-B'. Vertical broken lines in the right and left of each of FIGS. 11(b) to 11(d) indicate cell unit boundaries. Reference numeral 508 denotes a side wall insulating film. Reference numeral 506 denotes an extension area. Reference numeral 507 denotes a source/drain area. FIG. 11(a) shows only a part of the side wall insulating film 508 which overlaps the semiconductor projecting area.

Then, what is called a salicide process is used to form a silicide layer 509 of nickel silicide on the source/drain diffusion areas and gate wires (gate electrodes). A predetermined SRAM structure is subsequently obtained by executing twice a series of the step of forming an interlayer insulating film, the step of forming contact plugs, and the step of forming wires. This state is shown in FIGS. 6 and 7, described above. These figures show only one layer of upper layer wiring. However, the upper layer wiring actually comprises a plurality of layers three-dimensionally crossing one another in both vertical and horizontal directions via interlayer insulating films.

EXAMPLE (1) OF THE SRAM ELEMENT STRUCTURE/FORM A

In an example described below, the SRAM structure described above with reference to FIGS. 5 to 7 adopts the form (form A, described above) in which the transistors in the SRAM cell unit have different numbers of projecting semiconductor layers constituting one transistor.

Figure 12:
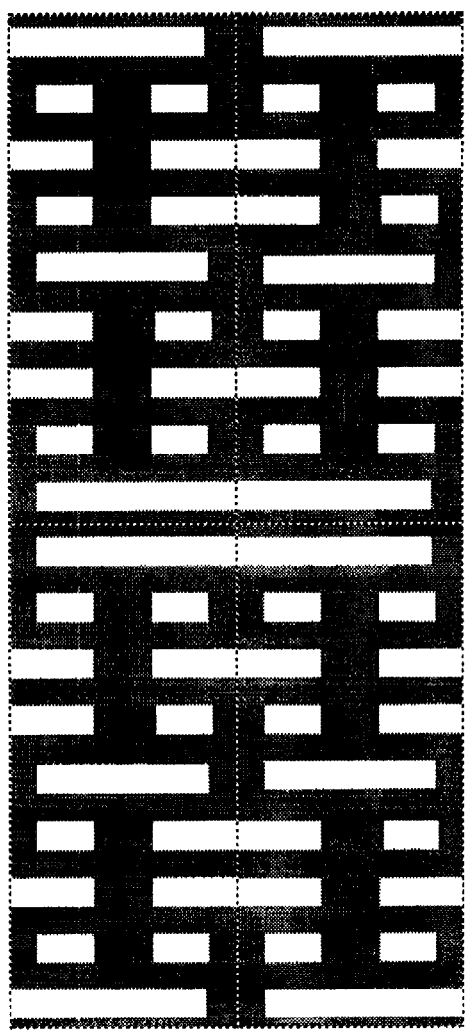
FIG. 12 is a diagram illustrating an element structure of an SRAM cell unit according to the present invention.
Figure 12:
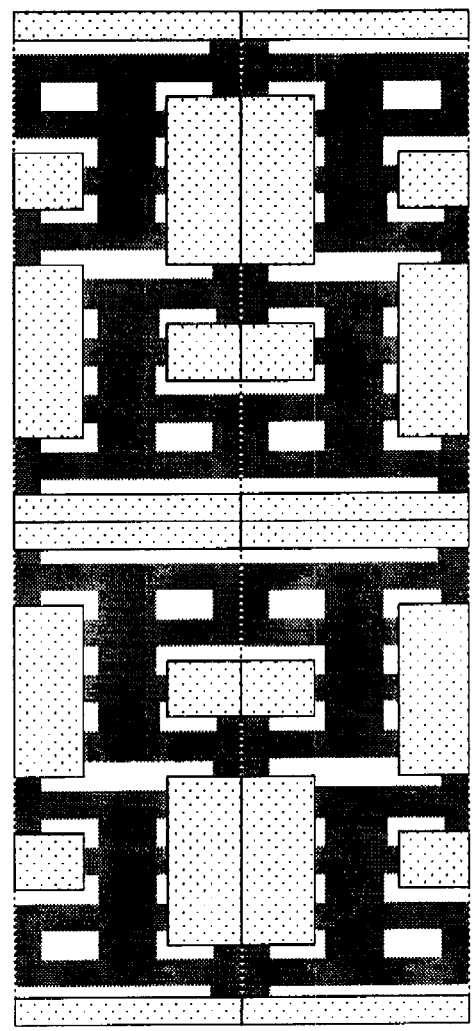
Figure 13:
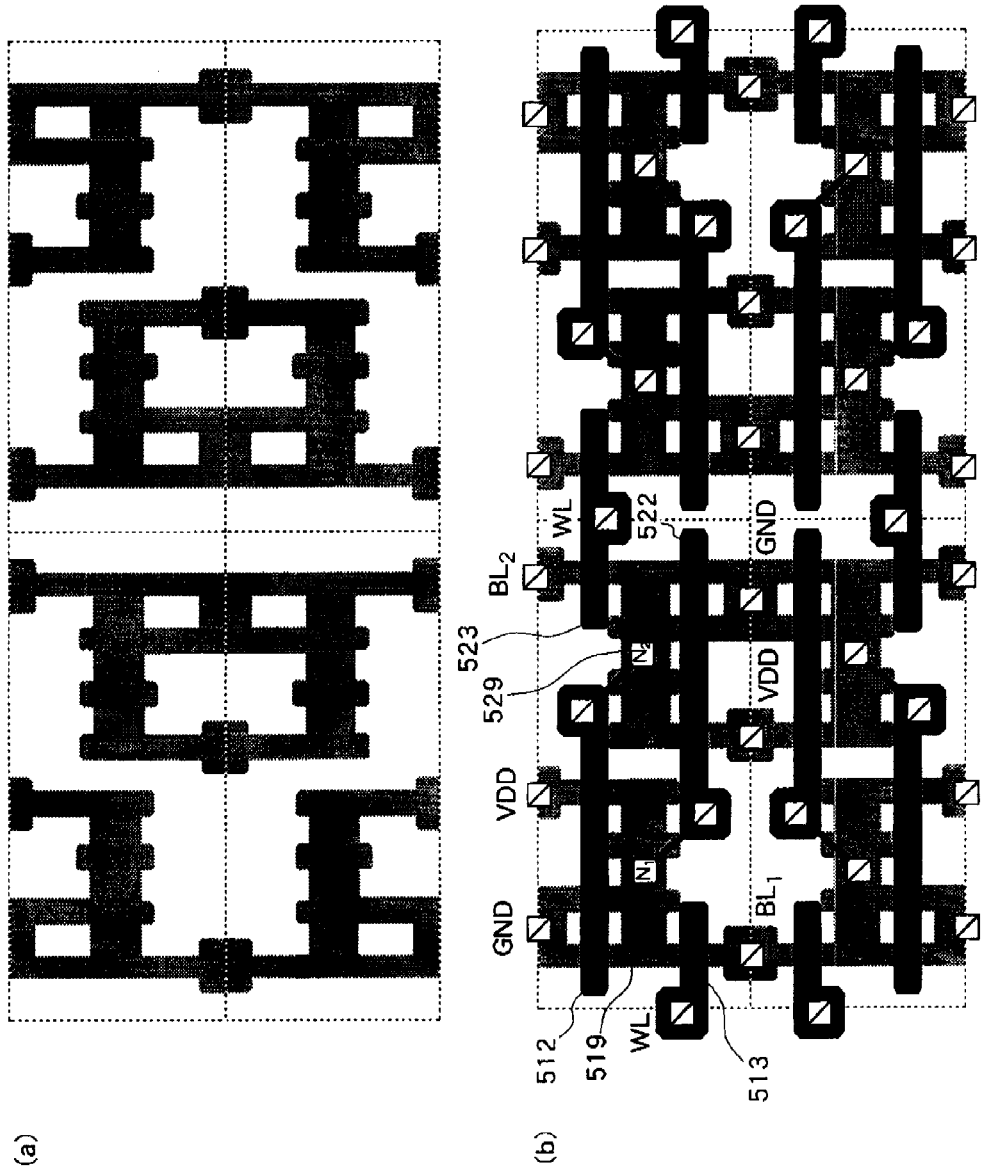
FIG. 13 is a diagram illustrating an element structure of an SRAM cell unit according to the present invention.
Figure 14:
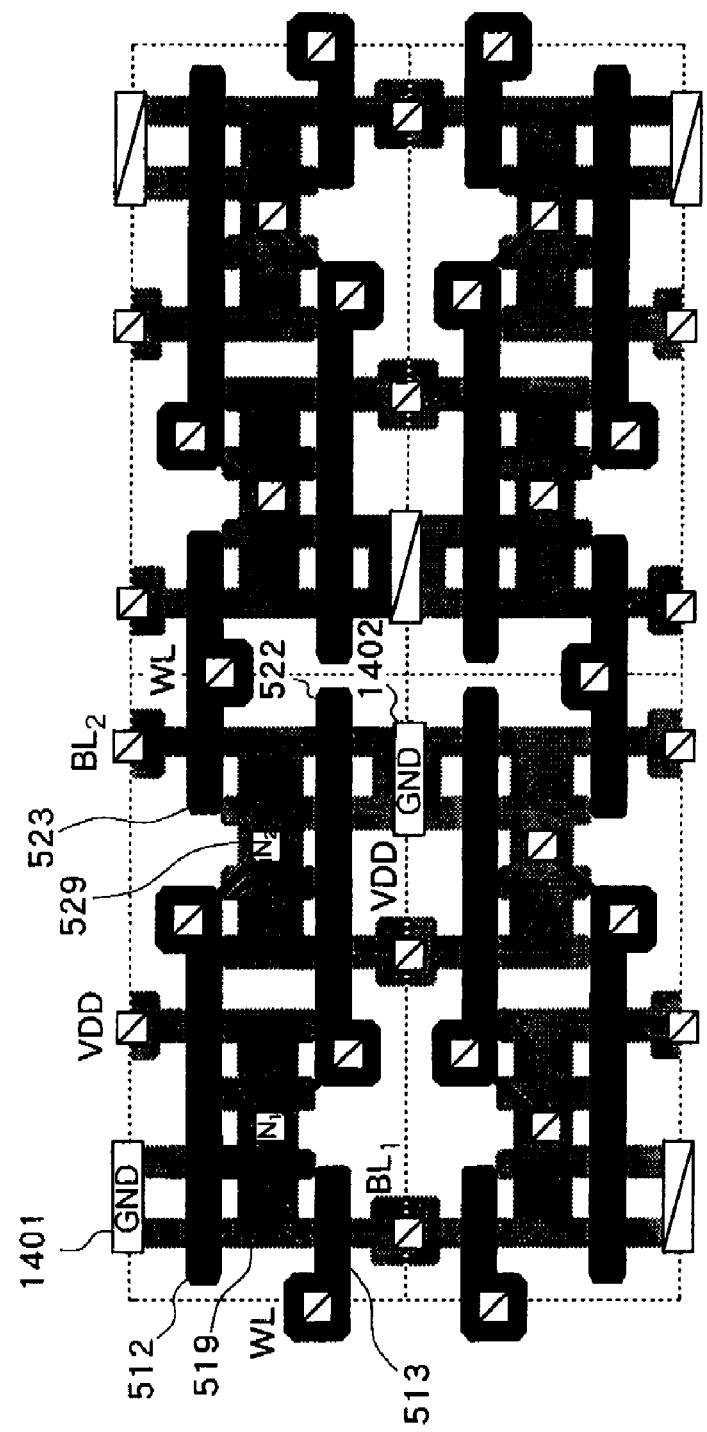
FIG. 14 is a diagram illustrating an element structure of an SRAM cell unit according to the present invention.

In FIGS. 12 to 14, the driving transistor has two projecting semiconductor layers. The access transistor and load transistor each has one projecting semiconductor layer. FIG. 12(a) shows a semiconductor layer pattern corresponding to FIG. 8(a). While FIG. 8(a) shows an area corresponding to one SRAM cell unit, FIGS. 12 to 14 show an area corresponding to 2×2, that is, a total of four SRAM cell units. Dotted lines in the figures indicate cell unit boundaries. FIG. 12(b) shows the semiconductor layer pattern shown in FIG. 12(a) and overlapped by a pattern showing areas from which the semiconductor layer is removed. Unwanted parts of the semiconductor layer pattern are removed to form a semiconductor layer pattern shown in FIG. 13(a). Then, a process similar to the above manufacturing method is conducted to enable the formation of an SRAM structure shown in FIG. 13(b). This structure makes it possible to increase the noise margin to provide a semiconductor device with a high noise resistance.

In the structure shown in FIG. 13(b), two projecting semiconductor layers constituting each driving transistor ($D_1$ or $D_2$) have their opposite ends integrally connected together via semiconductor layer. A contact plug (GND) is connected to the source area-side semiconductor layer. The drain area-side semiconductor layer is integrated with node semiconductor layer (519 or 529). Contact plug ($N_1$ or $N_2$) is connected to the drain area-side transistor layer.

FIG. 14 is a plan view of an SRAM element structure having a structure similar to that shown in FIG. 13(b) except for the source side structure of each driving transistor ($D_1$ or $D_2$). In the structure shown in FIG. 14, the two projecting semiconductor layers constituting each driving transistor are separated from each other on their source area side. The semiconductor layers on the source area side are connected together via a buried conductor wire (1401 or 1402). The buried conductor wire is connected to a ground line (GND) to serve as a contact plug. The buried conductor wire can be formed by forming a groove-like hole in the interlayer insulating film along the second direction, exposing the semiconductor layers to be connected together, in the hole, and then burying a conductive material in the hole. Instead of the structure using the buried conductor wire, a structure can be used in which a contact plug is connected to each of the two projecting semiconductor layers constituting the source of the driving transistor.

FIG. 12(a) shows the semiconductor layer pattern corresponding to FIG. 8(a). However, the semiconductor layers are contiguous to each other on the cell unit boundary in the second direction in FIG. 8(a) but not in FIG. 12(a). Thus, it is possible to pre-remove parts to be removed in the step of removing the semiconductor layer after the step of forming a semiconductor layer pattern, or unwanted parts, during the pattern forming step to the extent that the semiconductor layer can exert desired effects.

Figure 15:
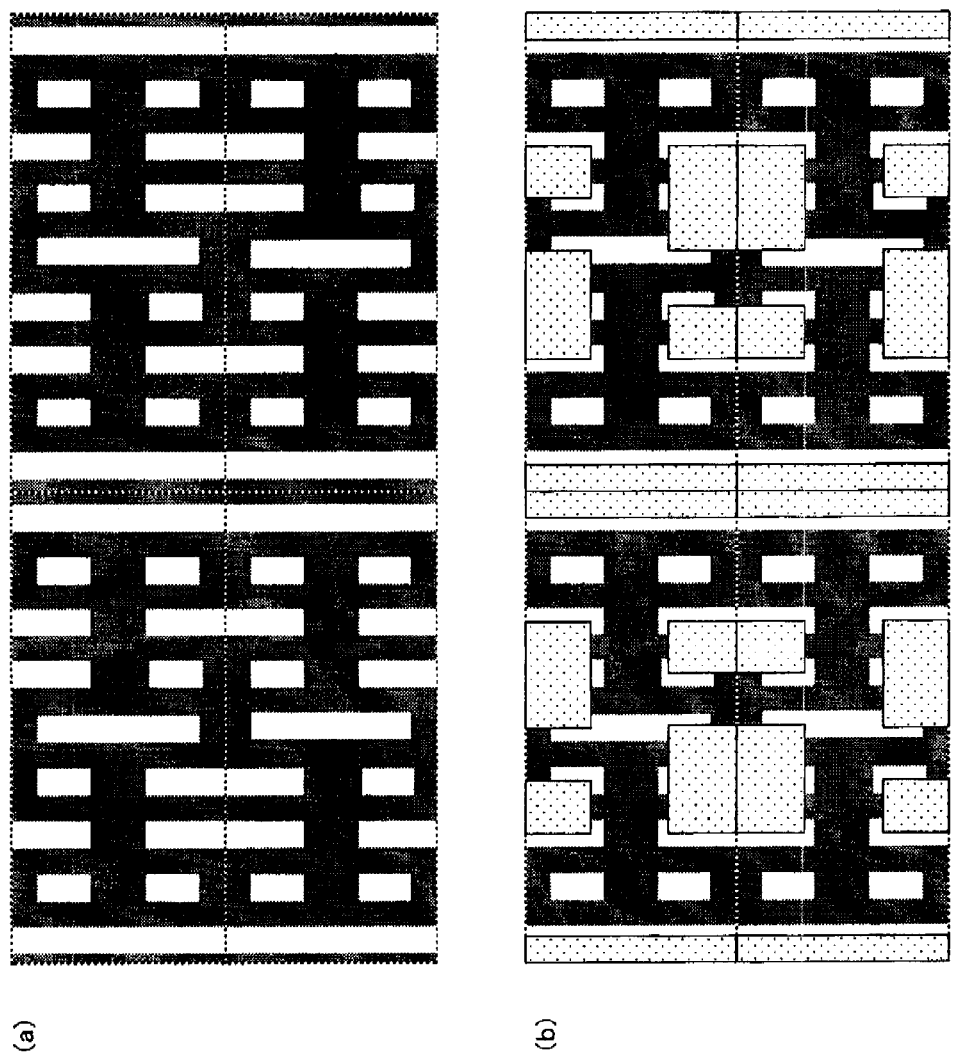
FIG. 15 is a diagram illustrating an element structure of an SRAM cell unit according to the present invention.
Figure 16:
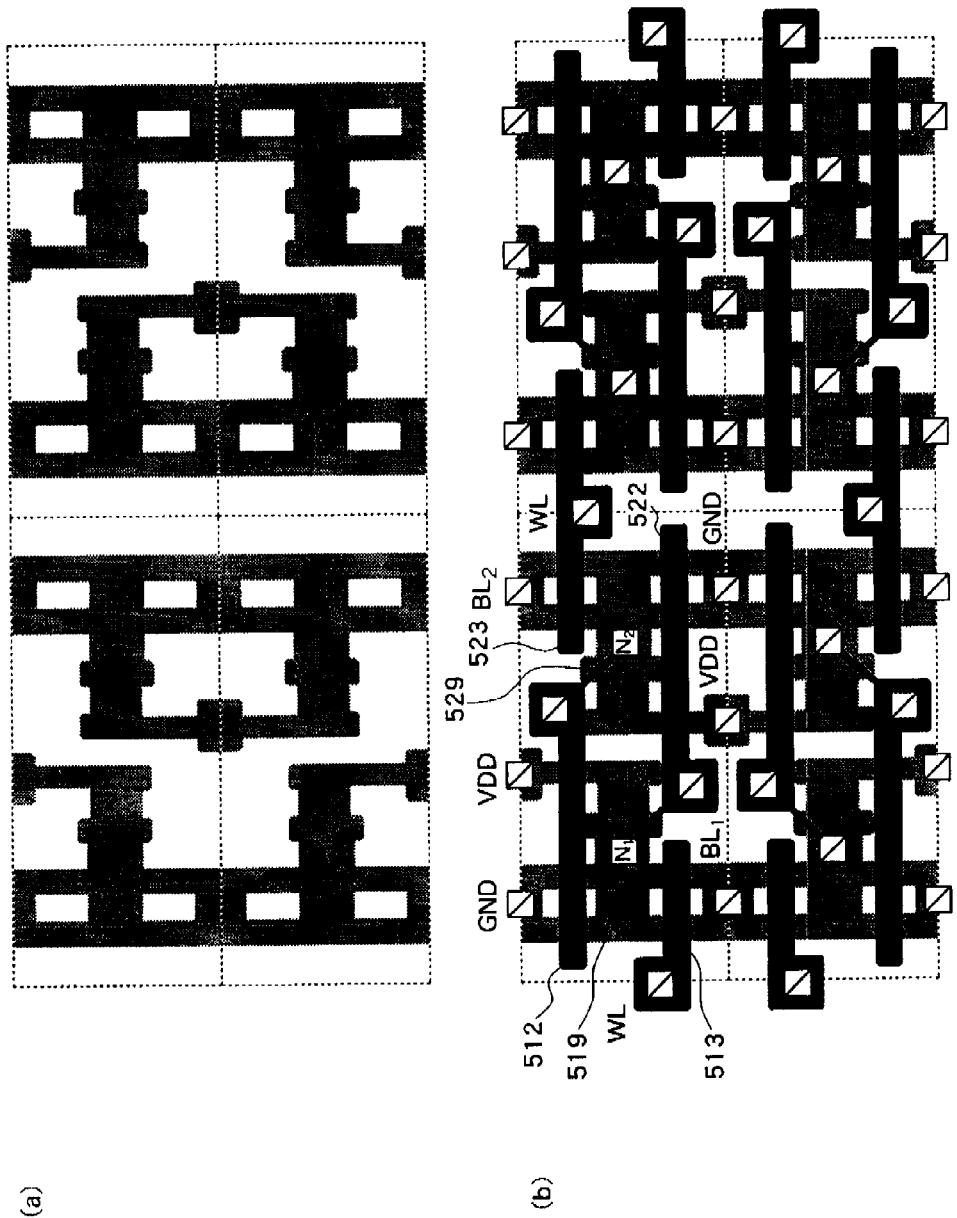
FIG. 16 is a diagram illustrating an element structure of an SRAM cell unit according to the present invention.

FIGS. 15 and 16 show that the driving transistor and access transistor each have two projecting semiconductor layers and that the load transistor has one projecting semiconductor layer. FIG. 15(a) shows a semiconductor layer pattern corresponding to FIG. 8(a). While FIG. 8(a) shows an area corresponding to one SRAM cell unit, FIGS. 15 and 16 show an area corresponding to 2×2, that is, a total of four SRAM cell units. Dotted lines in the figures indicate cell unit boundaries. FIG. 15(b) shows the semiconductor layer pattern shown in FIG. 15(a) and overlapped by a pattern showing areas from which the semiconductor layer is removed. A SRAM structure shown in FIG. 16(b) can be formed by removing unwanted parts of the semiconductor layer pattern to form a semiconductor layer pattern shown in FIG. 16(a) and then conducting a process similar to the above manufacturing method. This structure provides a semiconductor device with a large driving capacity.

Figure 17:
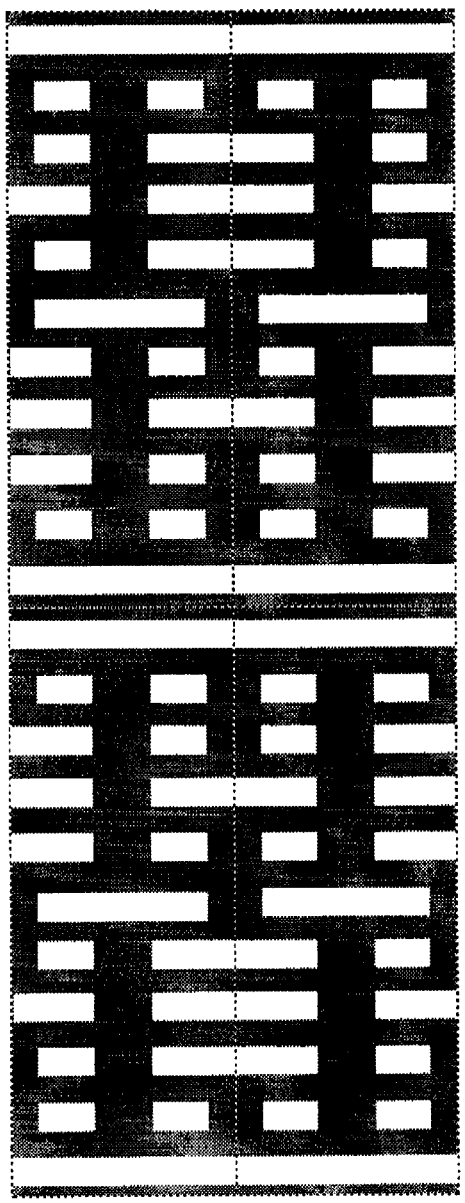
FIG. 17 is a diagram illustrating an element structure of an SRAM cell unit according to the present invention.
Figure 17:
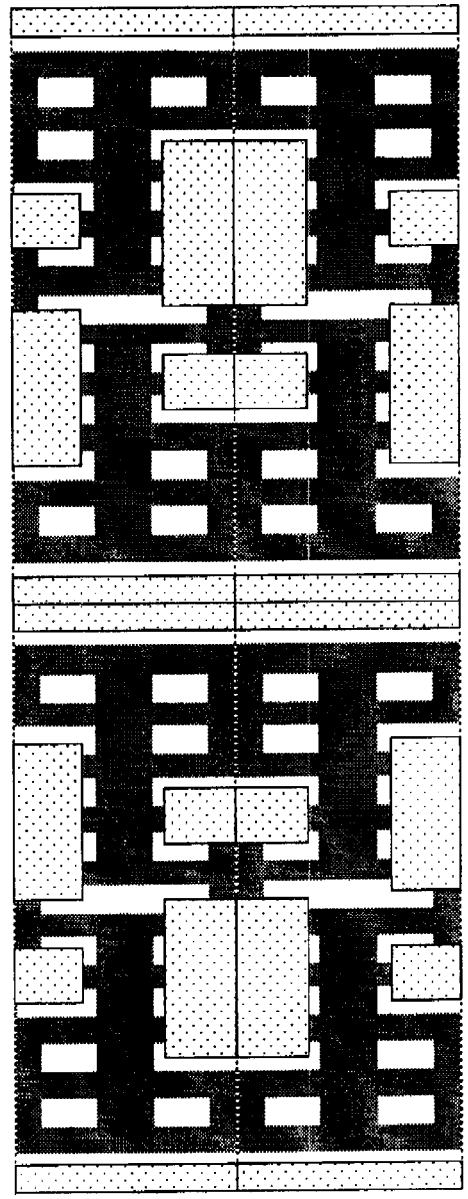
Figure 18:
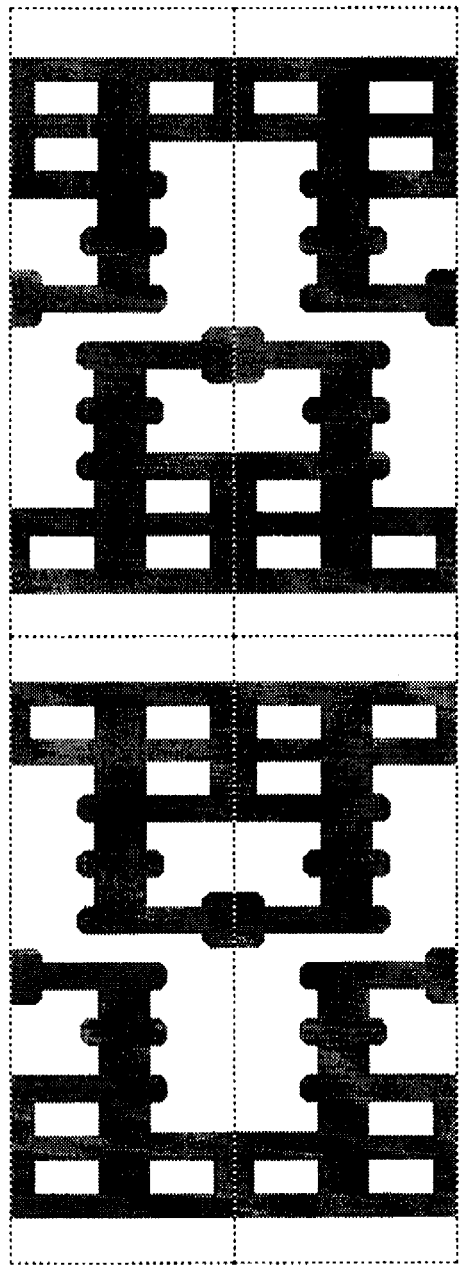
FIG. 18 is a diagram illustrating an element structure of an SRAM cell unit according to the present invention.
Figure 18:
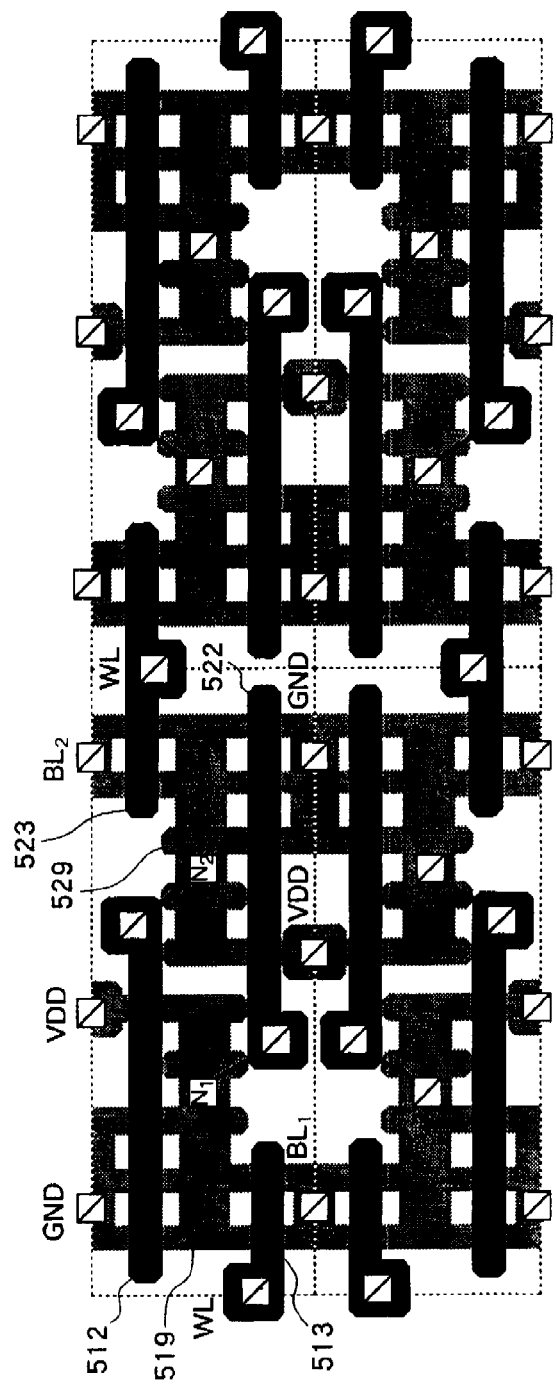

FIGS. 17 and 18 show that the driving transistor has three projecting semiconductor layers and that the access transistor has two projecting semiconductor layers and that the load transistor has one projecting semiconductor layer. FIG. 17(a) shows a semiconductor layer pattern corresponding to FIG. 8(a). While FIG. 8(a) shows an area corresponding to one SRAM cell unit, FIGS. 17 and 18 show an area corresponding to 2×2, that is, a total of four SRAM cell units. Dotted lines in the figures indicate cell unit boundaries. FIG. 17(b) shows the semiconductor layer pattern shown in FIG. 17(a) and overlapped by a pattern showing areas from which the semiconductor layer is removed. A SRAM structure shown in FIG. 18(b) can be formed by removing unwanted parts of the semiconductor layer pattern to form a semiconductor layer pattern shown in FIG. 18(a) and then executing a process similar to the above manufacturing method. This structure provides a semiconductor device with a high driving capacity and a high noise resistance.

Figure 19:
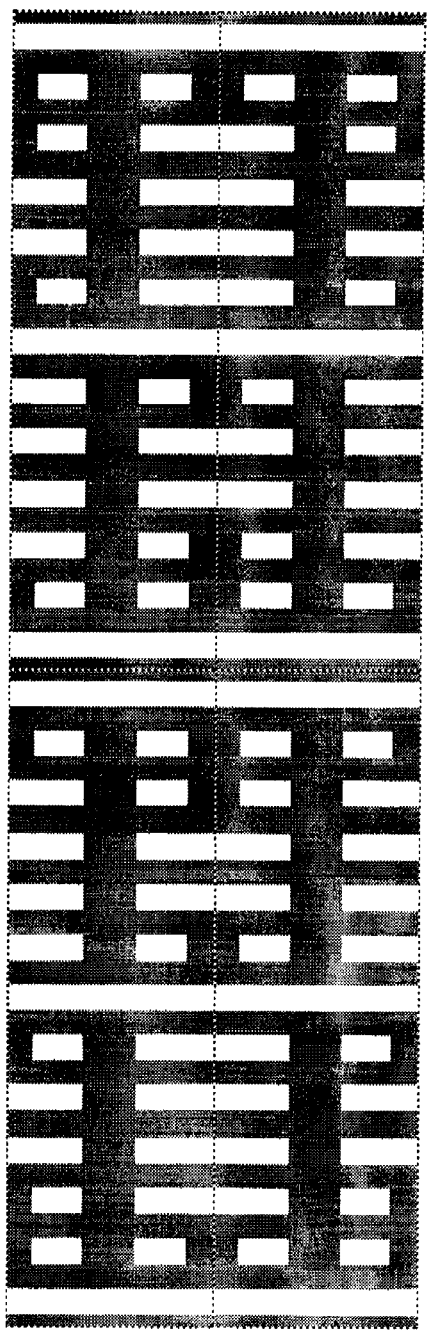
FIG. 19 is a diagram illustrating an element structure of an SRAM cell unit according to the present invention.
Figure 19:
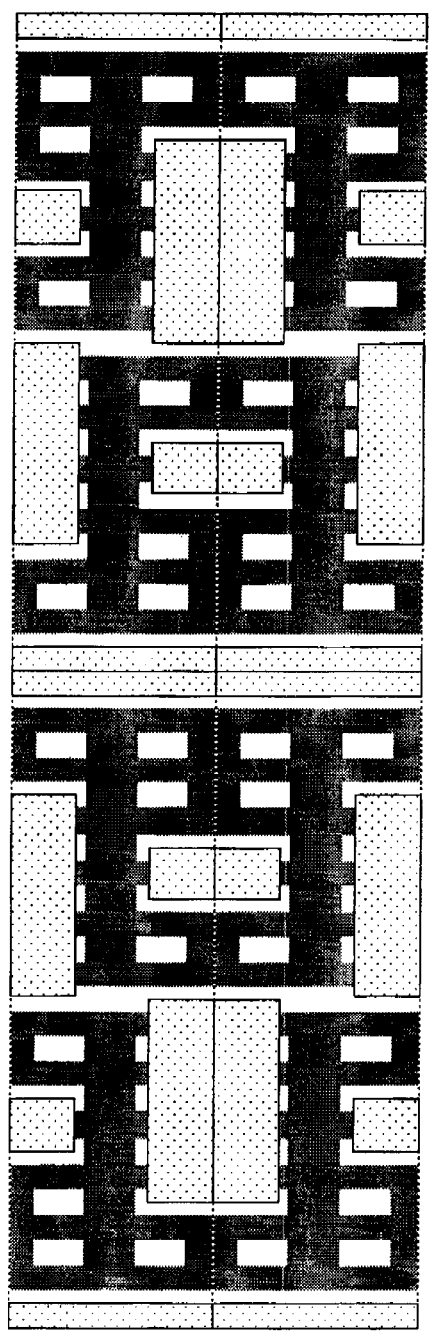
Figure 20:
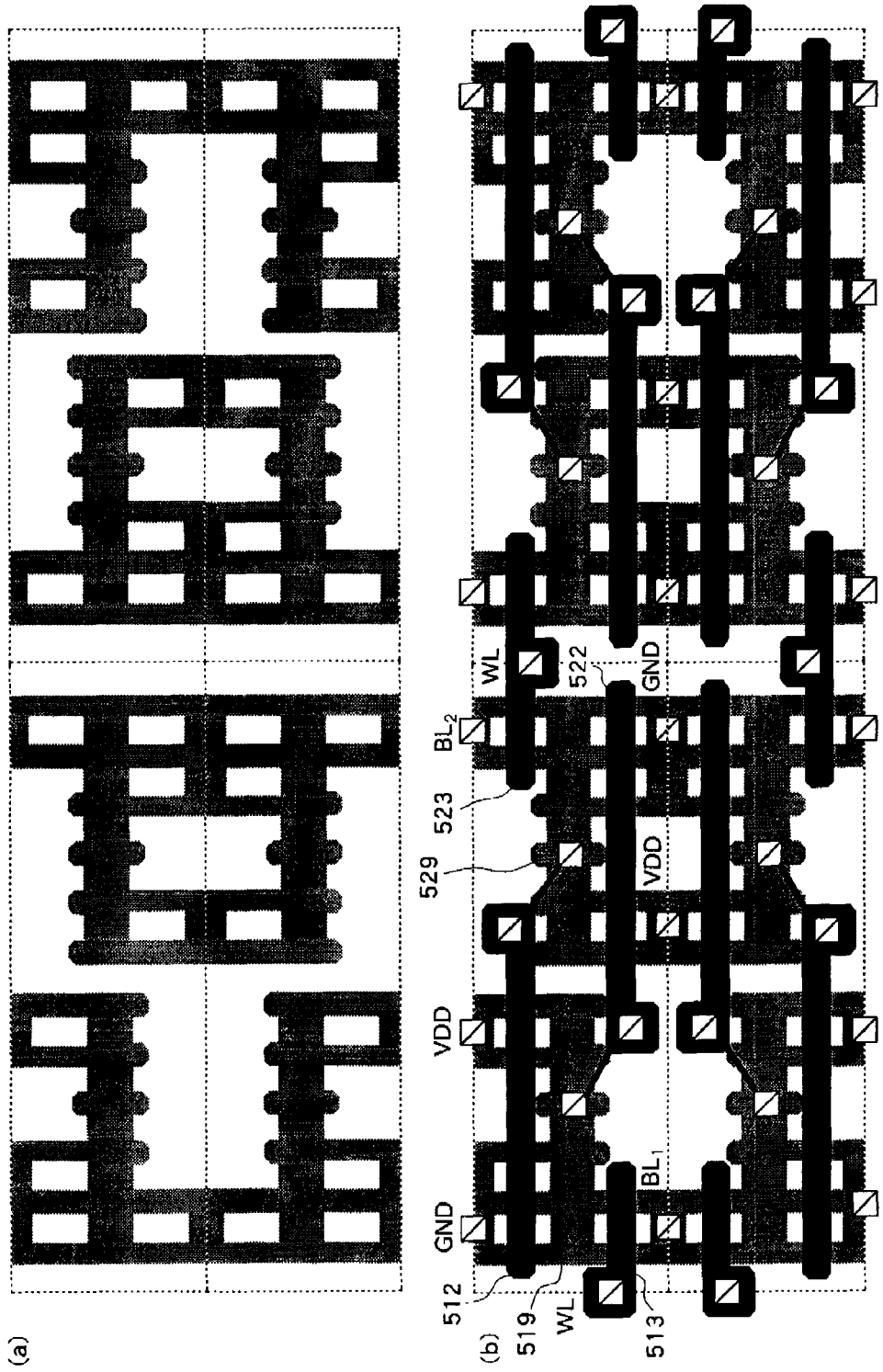
FIG. 20 is a diagram illustrating an element structure of an SRAM cell unit according to the present invention.

FIGS. 19 and 20 show that the driving transistor has three projecting semiconductor layers and that the access transistor and load transistor each have two projecting semiconductor layers. FIG. 19(a) shows a semiconductor layer pattern corresponding to FIG. 8(a). While FIG. 8(a) shows an area corresponding to one SRAM cell unit, FIGS. 19 and 20 show an area corresponding to 2×2, that is, a total of four SRAM cell units. Dotted lines in the figures indicate cell unit boundaries. FIG. 19(b) shows the semiconductor layer pattern shown in FIG. 19(a) and overlapped by a pattern showing areas from which the semiconductor layer is removed. A SRAM structure shown in FIG. 20(b) can be formed by removing unwanted parts of the semiconductor layer pattern to form a semiconductor layer pattern shown in FIG. 20(a) and then executing a process similar to the above manufacturing method. This structure provides a semiconductor device with a high driving capacity and a high noise resistance.

Figure 21:
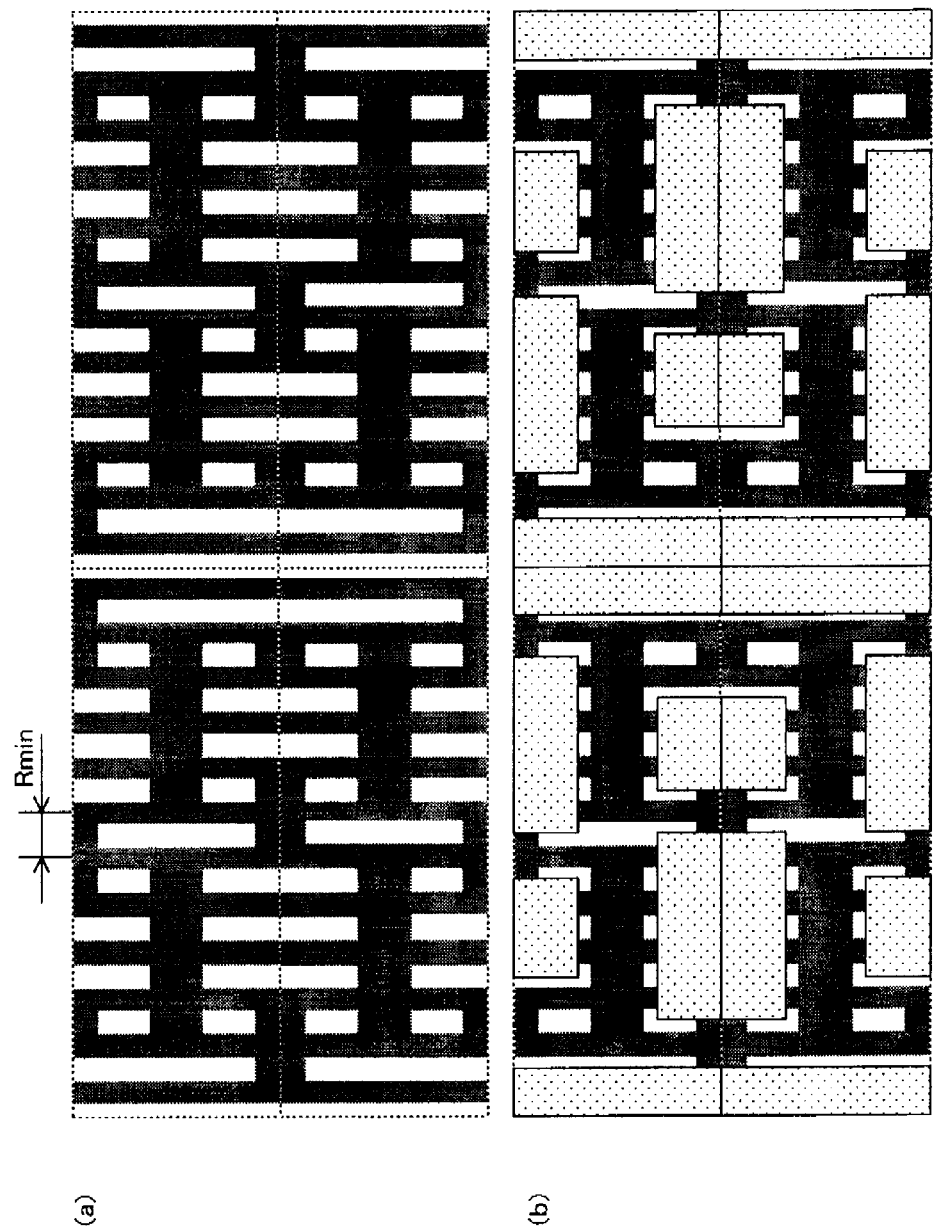
FIG. 21 is a diagram illustrating an element structure of an SRAM cell unit according to the present invention.
Figure 22:
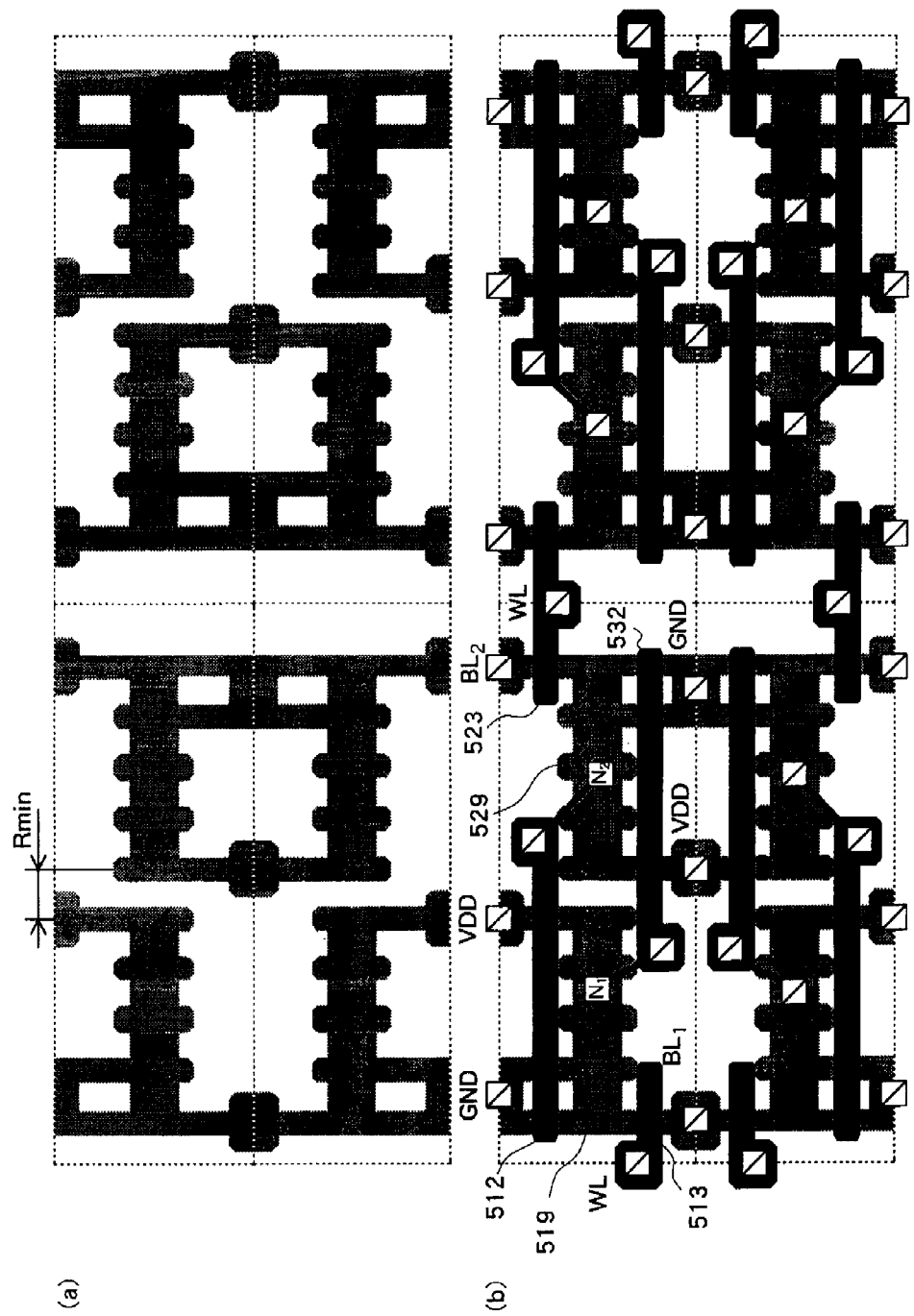
FIG. 22 is a diagram illustrating an element structure of an SRAM cell unit according to the present invention.

FIGS. 21 and 22 show that the driving transistor has two projecting semiconductor layers and that the access transistor and load transistor each have one projecting semiconductor layer. FIGS. 21 and 22 show a structure similar to that shown in FIGS. 12 and 13 except for the interval between the projecting semiconductor layers among the transistors. In this example, two elongate semiconductor layers are removed from between the elongate semiconductor layer (projecting semiconductor layer) constituting the driving transistor and the elongate semiconductor layer (projecting semiconductor layer) constituting the load transistor. As a result, the interval between the center line of the projecting semiconductor layer constituting the driving transistor and the center line of the projecting semiconductor layer constituting the load transistor is three times as large as a minimum interval Rmin. Further, between the adjacent cell unit areas in the second direction (lateral direction of the figure), two elongate semiconductor layers are removed from between the elongate semiconductor layers (projecting semiconductor layers) constituting the adjacent access transistors. As a result, the distance between the center lines of the projecting semiconductor layer constituting the adjacent access transistors is three times as large as a minimum interval Rmin.

Figure 23:
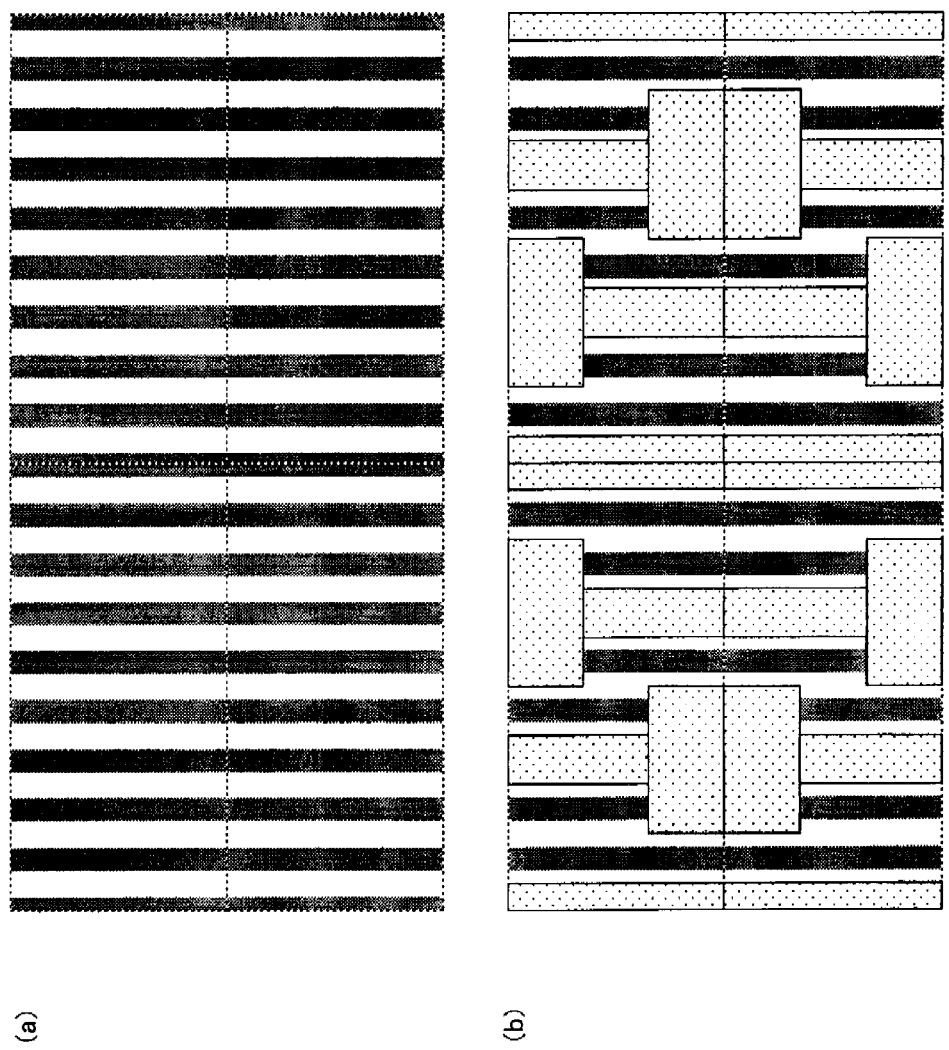
FIG. 23 is a diagram illustrating an element structure of an SRAM cell unit according to the present invention.
Figure 24:
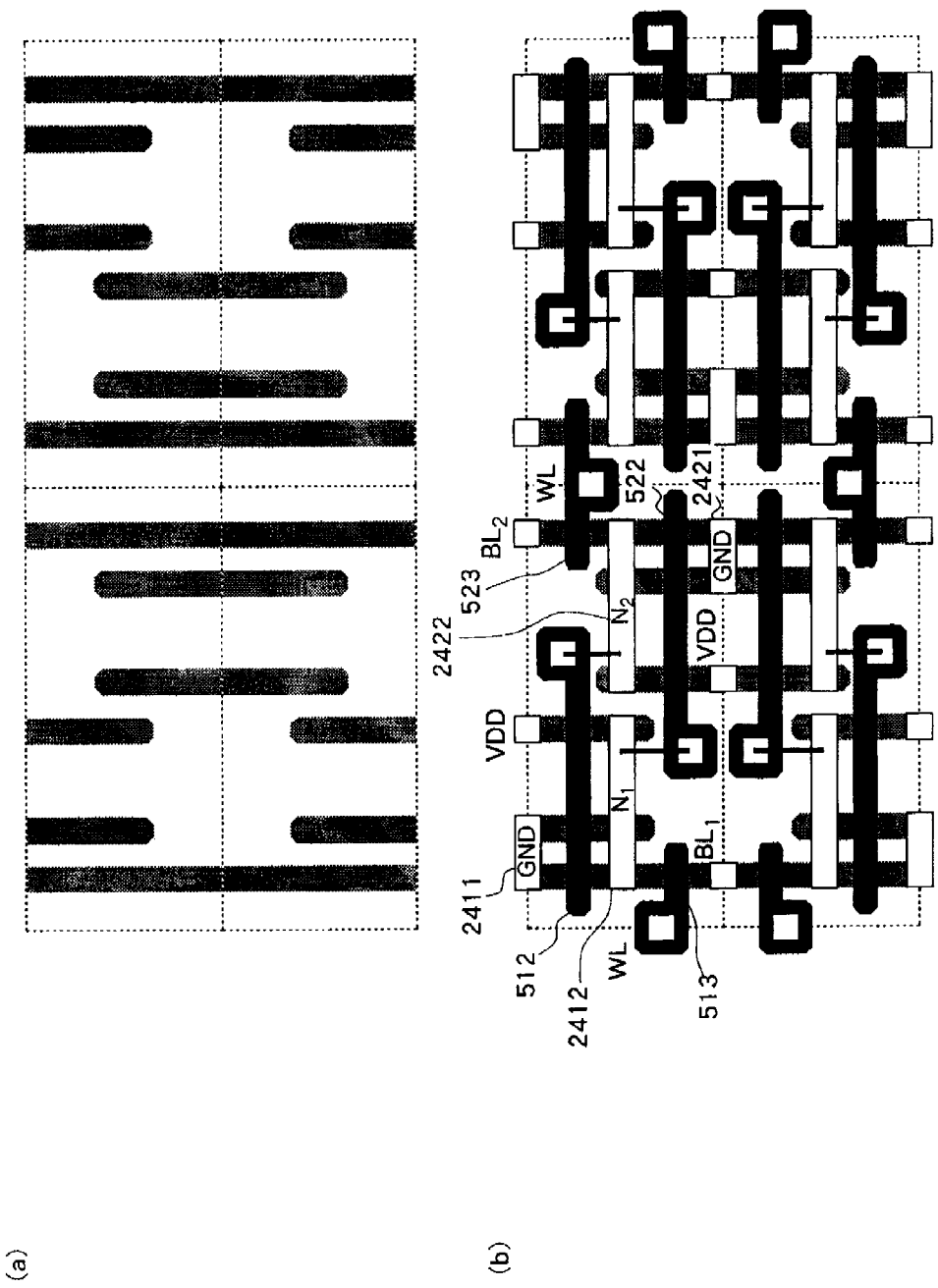
FIG. 24 is a diagram illustrating an element structure of an SRAM cell unit according to the present invention.

FIGS. 23 and 24 show that the driving transistor has two projecting semiconductor layers and that the access transistor and load transistor each have one projecting semiconductor layer. FIGS. 23 and 24 show a structure similar to that shown in FIGS. 12 and 13 except for the semiconductor layer pattern constituting the projecting semiconductor layer. The semiconductor layer pattern (line and space pattern) shown in FIG. 23(*a*) has no pattern in the second direction which crosses the elongate semiconductor layer in the first direction. The semiconductor layer pattern shown in FIG. 23(*a*) is composed only of a striped pattern in which elongate semiconductor layers are arranged at equal intervals over the SRAM formation area. FIG. 23(*b*) shows the semiconductor layer pattern shown in FIG. 23(*a*) and overlapped by a pattern showing areas from which the semiconductor layer is removed. A SRAM structure shown in FIG. 24(*b*) can be formed by removing unwanted parts of the semiconductor layer pattern to form a semiconductor layer pattern shown in FIG. 24(*a*) and then executing a process similar to the above manufacturing method.

In the SRAM structure shown in FIG. 24(*b*), the source areas of the two projecting semiconductor layers constituting the driving transistor are connected together via a buried conductor wire (2411 or 2421). This buried conductor wire is connected to the ground line (GND) to serve as a contact plug. The drain areas of the two projecting semiconductor layers constituting the driving transistor and the drain area of the load transistor are connected together via a buried conductor wire (2412 or 2422). This buried conductor wire is connected to upper layer wiring to serve as a contact plug. These buried conductor wires can be formed by forming a groove-like hole in the interlayer insulating film along the second direction, exposing, in the hole, the semiconductor layers to be connected together, and then burying a conductive material in the hole. Instead of this structure, a structure can be used in which a contact plug is connected to each of the semiconductor layers constituting the source/drain of each transistor so that the semiconductor layers can be connected to the upper layer wiring via these contact plugs.

EXAMPLE (2) OF THE SRAM ELEMENT STRUCTURE/FORM A

Figure 25:
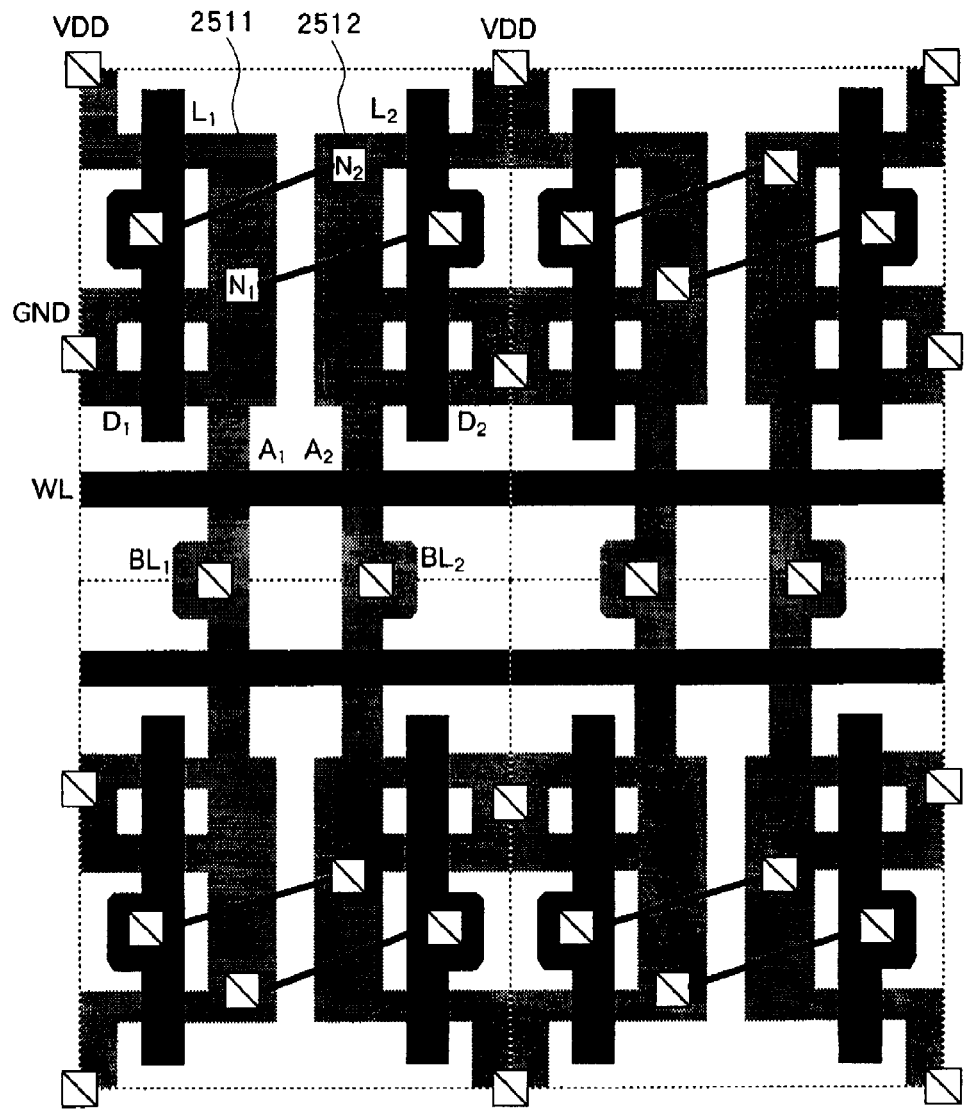
FIG. 25 is a diagram illustrating an element structure of an SRAM cell unit according to the present invention.
Figure 26:
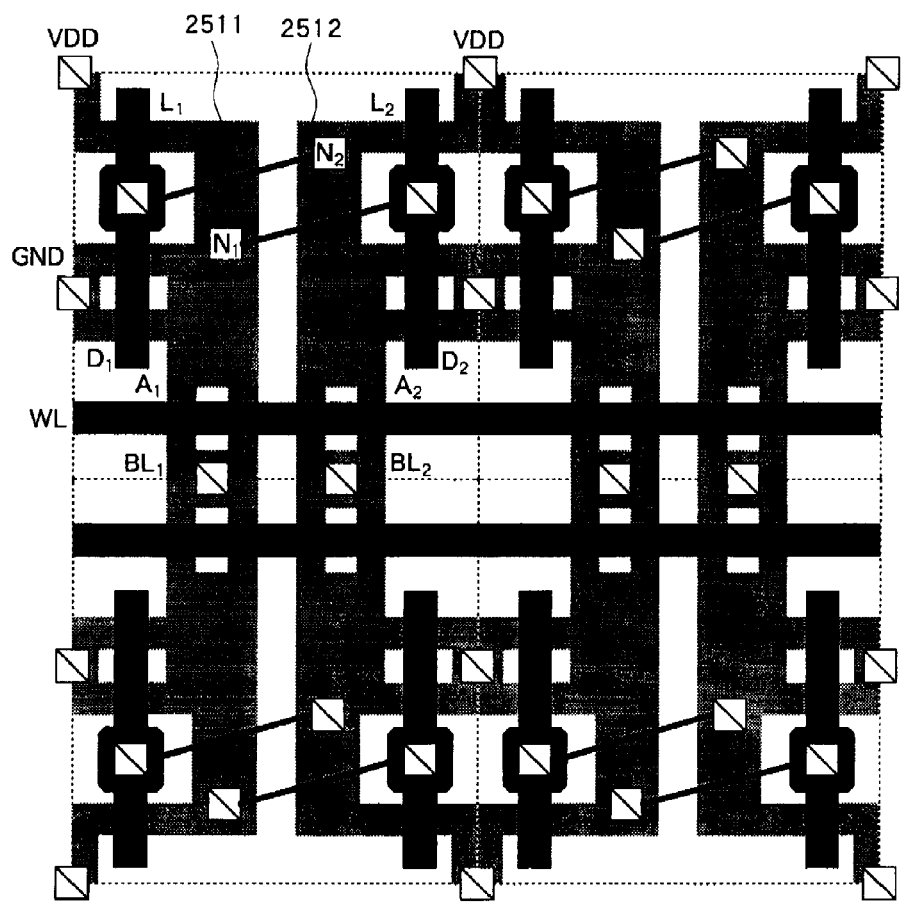
FIG. 26 is a diagram illustrating an element structure of an SRAM cell unit according to the present invention.
Figure 27:
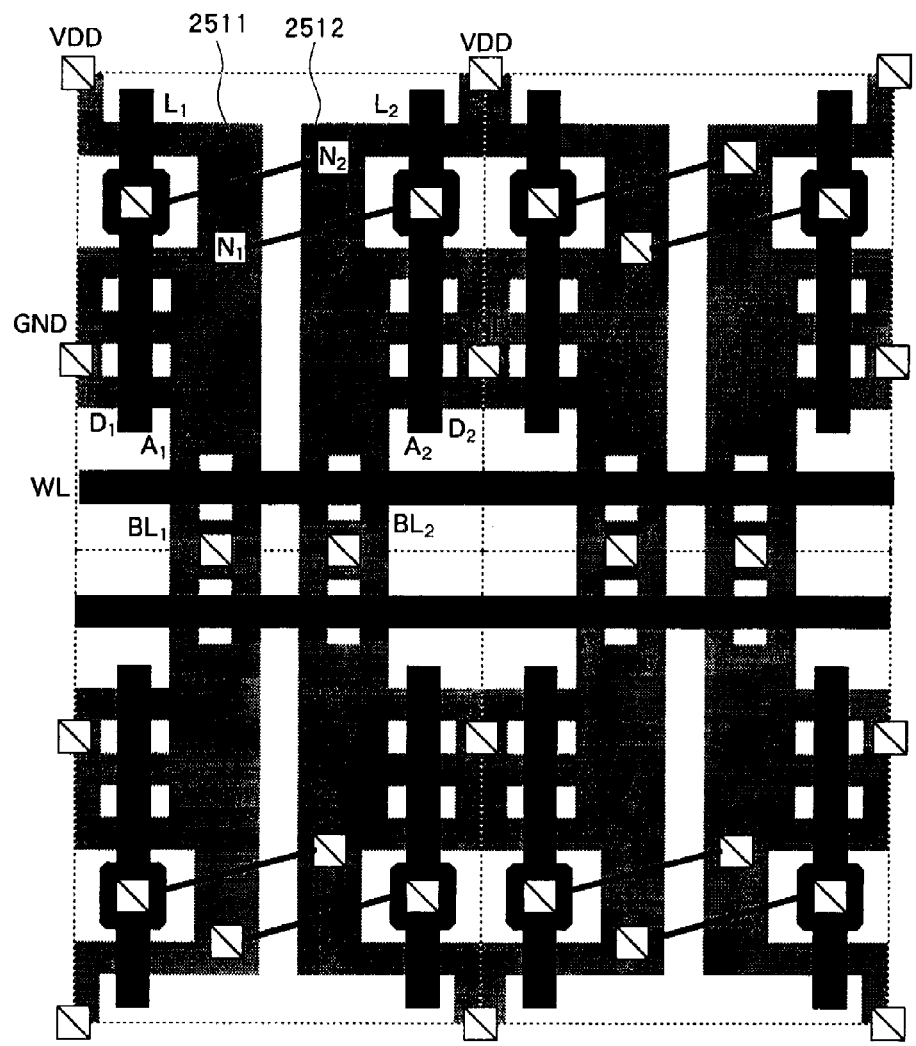
FIG. 27 is a diagram illustrating an element structure of an SRAM cell unit according to the present invention.
Figure 28:
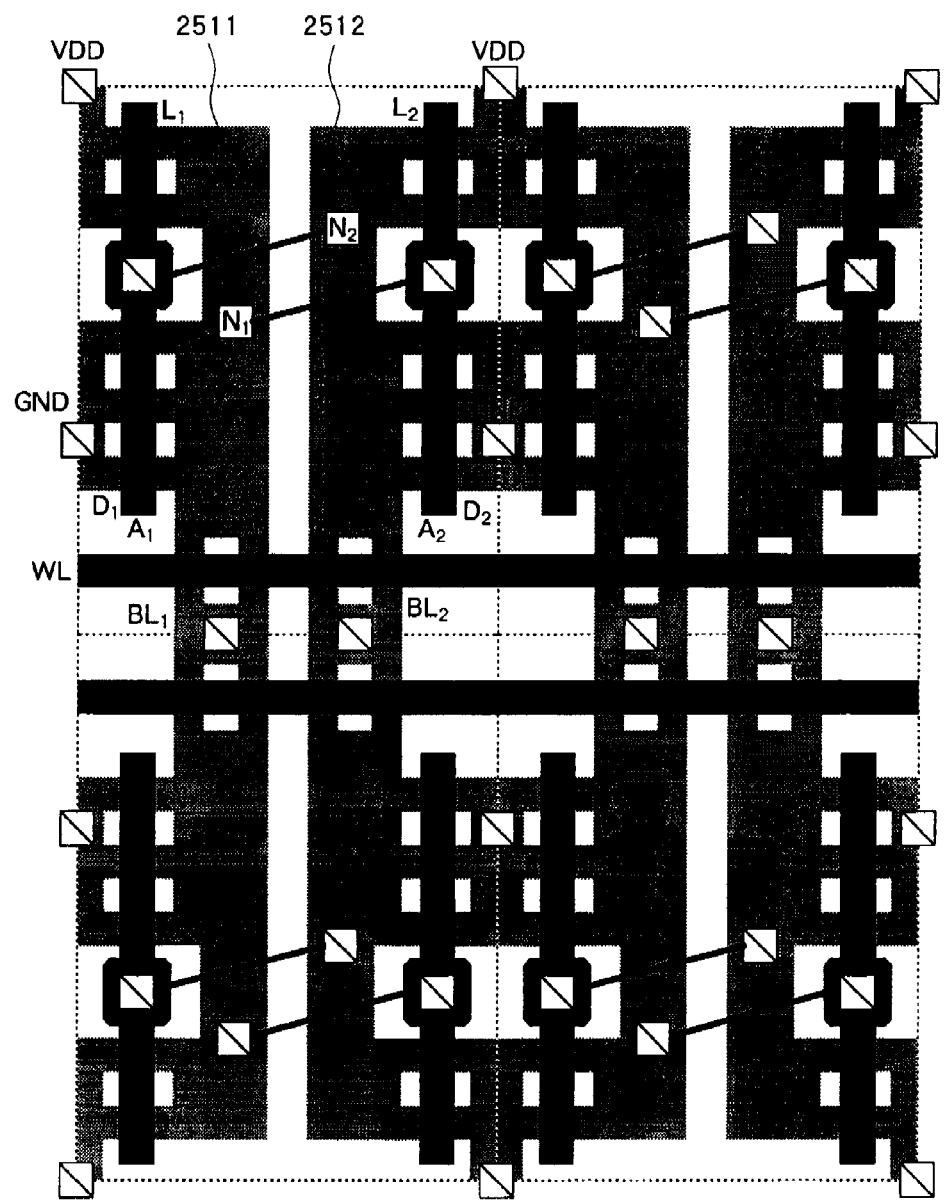
FIG. 28 is a diagram illustrating an element structure of an SRAM cell unit according to the present invention.

FIGS. 25 to 28 show examples of other SRAM element structure having the structure in the form A. FIG. 25 shows that the driving transistor has two projecting semiconductor layers and that the access transistor and load transistor each have one projecting semiconductor layer. FIG. 26 shows that the driving transistor and access transistor each have two projecting semiconductor layers and that the load transistor has one projecting semiconductor layer. FIG. 27 shows that the driving transistor has three projecting semiconductor layers and that the access transistor has two projecting semiconductor layers and that the load transistor is composed of one projecting semiconductor layer. FIG. 28 shows that the driving transistor has three projecting semiconductor layers and that the access transistor and load transistor each have two projecting semiconductor layers.

In the SRAM element structure in the present example, in the SRAM cell unit, the projecting semiconductor layers of the pair of access transistors $A_1$ and $A_2$ are placed so that their longitudinal directions (channel length directions) are along the first direction, and are arranged adjacent to each other and parallel to the second direction, which is perpendicular to the first direction. The gate electrodes of the pair of access transistors $A_1$ and $A_2$ are composed of a common word wire placed along the second direction so as to cross the projecting semiconductor layers of the access transistors. The projecting semiconductor layers of the driving transistor $D_1$ and load transistor $L_1$ have a longitudinal direction along the second direction and are arranged adjacent and parallel to the first direction. The projecting semiconductor layers of the other driving transistor $D_2$ and other load transistor $L_2$ have a longitudinal direction along the second direction and are arranged adjacent and parallel to the first direction.

The driving transistor $D_1$ may have a semiconductor layer integrated with the projecting semiconductor layers of the access transistor $A_1$ and load transistor $L_1$. The other driving transistor $D_2$ may have a semiconductor layer integrated with the projecting semiconductor layers of the other access transistor $A_2$ and other load transistor $L_2$.

This structure may also have, on the insulating layer, a first node semiconductor layer 2511 integrated with the semiconductor layer of the driving transistor $D_1$, the semiconductor layer of the load transistor $L_1$, and the semiconductor layer of the access transistor $A_1$ and having a junction between a p-type area and an n-type area and a second node semiconductor layer 2512 integrated with the semiconductor layer of the other driving transistor $D_2$, the semiconductor layer of the other load transistor $L_2$, and the semiconductor layer of the other access transistor $A_2$ and having a junction between a p-type area and an n-type area. A first node contact $N_1$ connecting the drain areas of the driving transistor $D_1$ and load transistor $L_1$ together may be connected to first node semiconductor layer 2511. A second node contact $N_2$ connecting the drain areas of the other driving transistor $D_2$ and other load transistor $L_2$ together may be connected to second node semiconductor layer 2512.

In FIGS. 25 to 28, the source sides of plural projecting semiconductor layers constituting the driving transistor are connected together via the semiconductor layer and connect to the contact plug (GND). However, the source sides may be connected together via the above buried conductor wire, which may function as a contact plug. Alternatively, a contact plug may be connected to each source side semiconductor layer and to the upper layer wiring. Even if the load transistor has a plurality of projecting semiconductor layers, the source-side connection structure may be similar to the above one.

Further, in the SRAM element structure in the present example, between the adjacent SRAM cell units, a semiconductor layer pattern including the semiconductor layers constituting the transistors and a gate wire pattern constituting the gate electrodes may be arranged in a mirror image relationship with respect to the cell unit boundary, serving as a symmetry axis, as shown in FIGS. 25 to 28.

EXAMPLE (3) OF THE SRAM ELEMENT STRUCTURE/FORM B

Now, description will be given of an example in which the SRAM structure described above with reference to FIGS. 5 to 7 adopts the form (form B, described above) in which the transistors in the SRAM cell unit have different projecting semiconductor layer heights.

Figure 29:
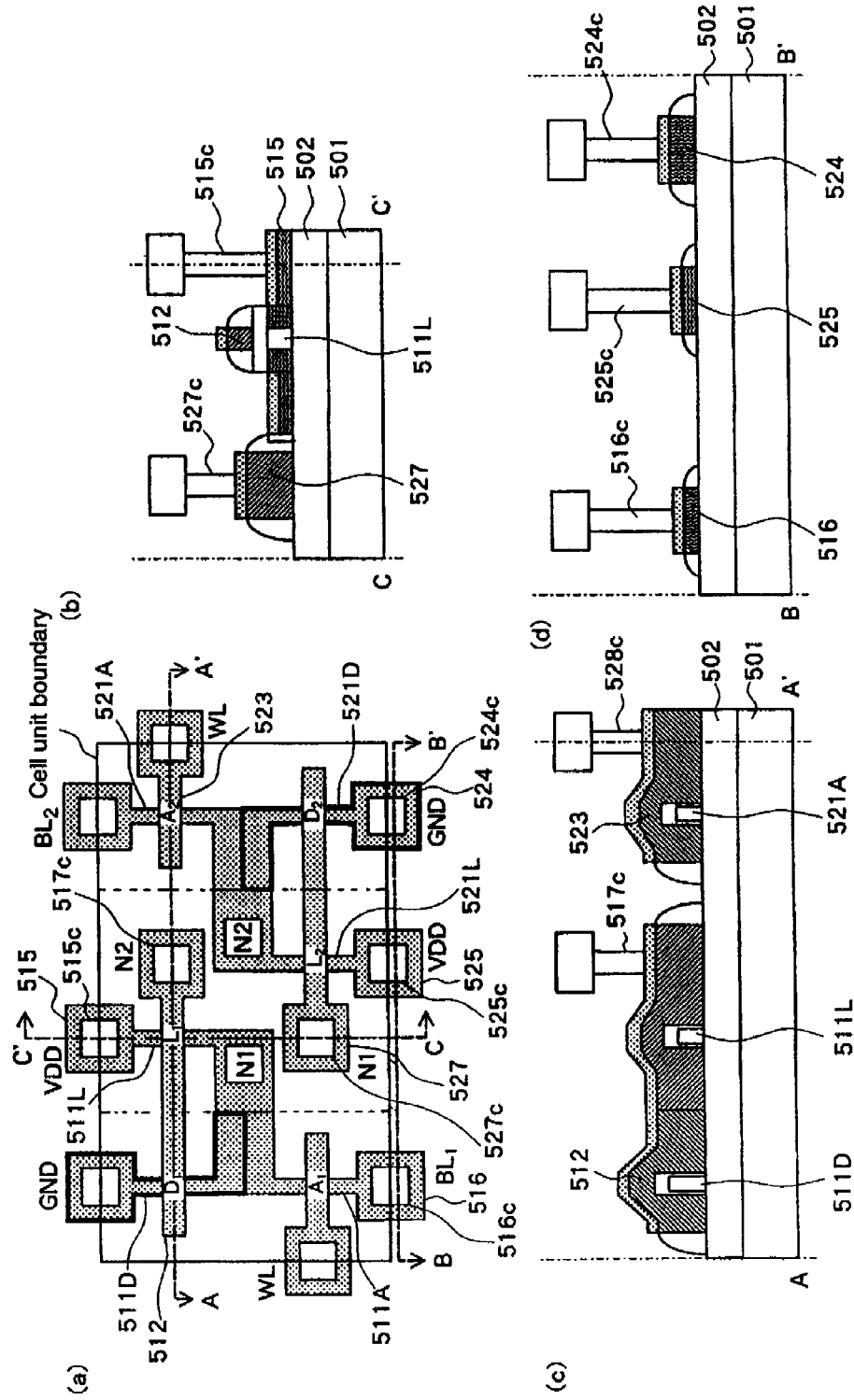
FIG. 29 is a diagram illustrating an element structure of an SRAM cell unit according to the present invention.

FIG. 29 shows that the projecting semiconductor layers of the driving transistors $D_1$ and $D_2$ are higher than any other projecting semiconductor layers. This structure enables the noise margin to be increased to provide a semiconductor device with a high noise resistance. FIGS. 29(a) and 29(b) correspond to FIGS. 5(a) and 6(c), respectively. FIGS. 29(c) and 29(d) correspond to FIGS. 6(a) and 6(b), respectively. In FIG. 29(a), semiconductor layer portions enclosed by thick lines are thicker than the others. The semiconductor layers 511D and 521D are each higher than each of the other semiconductor layers 511A, 511L, 521A, and 521L.

Figure 30:
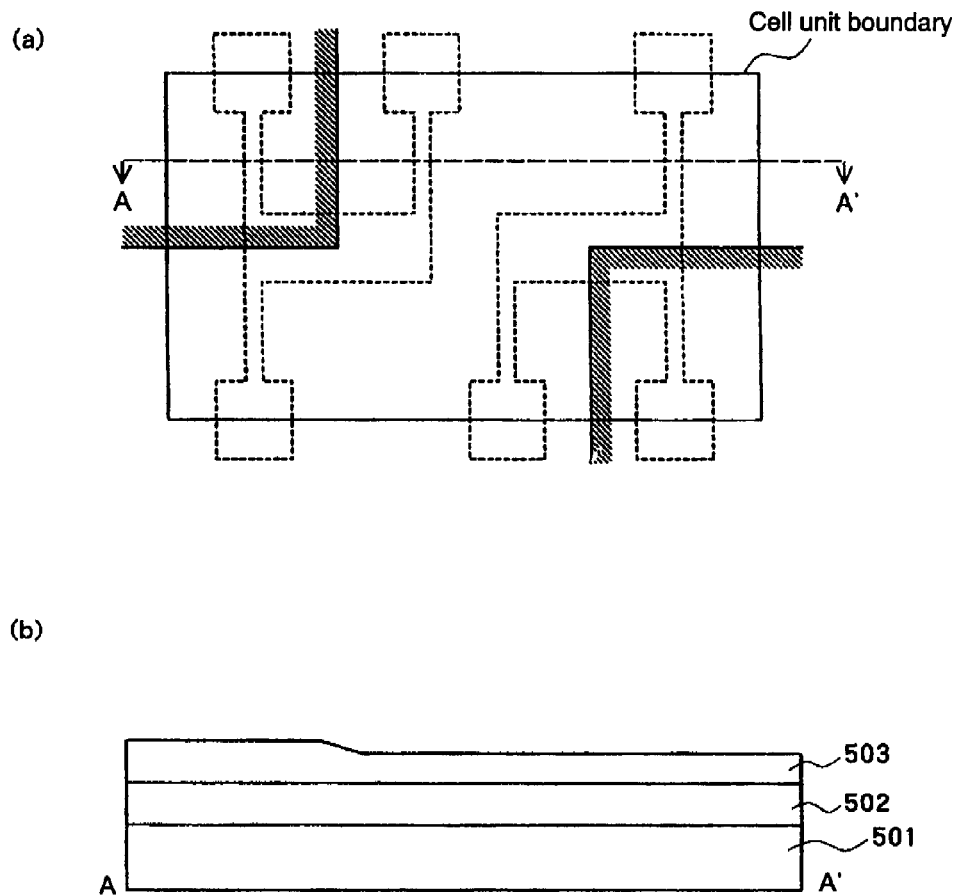
FIG. 30 is a diagram illustrating a method for manufacturing an SRAM structure according to the present invention.
Figure 31:
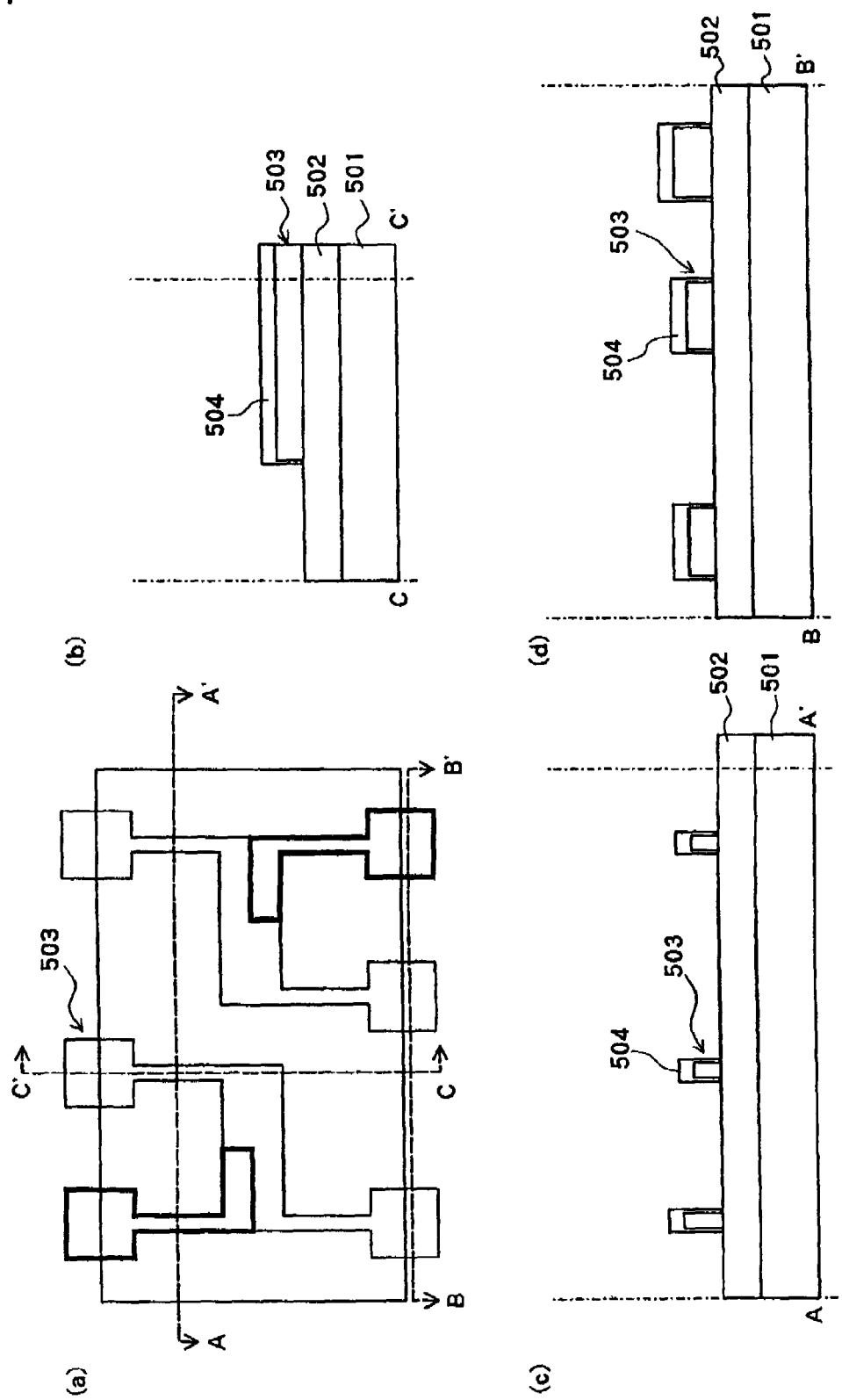
FIG. 31 is a diagram illustrating a method for manufacturing an SRAM structure according to the present invention.

The element structure in the present example may be manufactured as described below, for example, as shown in FIGS. 30 and 31. First, an SOI substrate is prepared which has a buried insulating film (base insulating film) made of $SiO_2$ on a silicon substrate and a semiconductor layer made of single crystal silicon provided on the buried insulating film. Then as shown in FIGS. 30(a) and 30(b), the semiconductor layer is thinned in the areas other than those enclosed by shaded bands. That is, pattern areas (corresponding to areas enclosed by thick lines) including the areas for forming the semiconductor layers 511D and 521D are masked. The semiconductor layer in the remaining area including the areas for forming the semiconductor layers 511A, 511L, 521A, and 521L is dry etched and thinned. Alternatively, thinning may be achieved by selectively oxidizing portions to be thinned and then removing the oxidized portions. Then, a cap insulating film 504 is formed. After that, in a manner similar to the manufacturing method described with reference to FIGS. 8 to 11, a semiconductor layer pattern shown in FIG. 31 is formed and subsequently the SRAM element structure shown in FIG. 29 can be obtained. Dotted lines in FIG. 30(a) indicate a predetermined semiconductor layer pattern to be formed. FIGS. 31(a), 31(b), 31(c), and 31(d) correspond to FIGS. 9(a), 9(b), 9(c), and 9(d), respectively.

Figure 32:
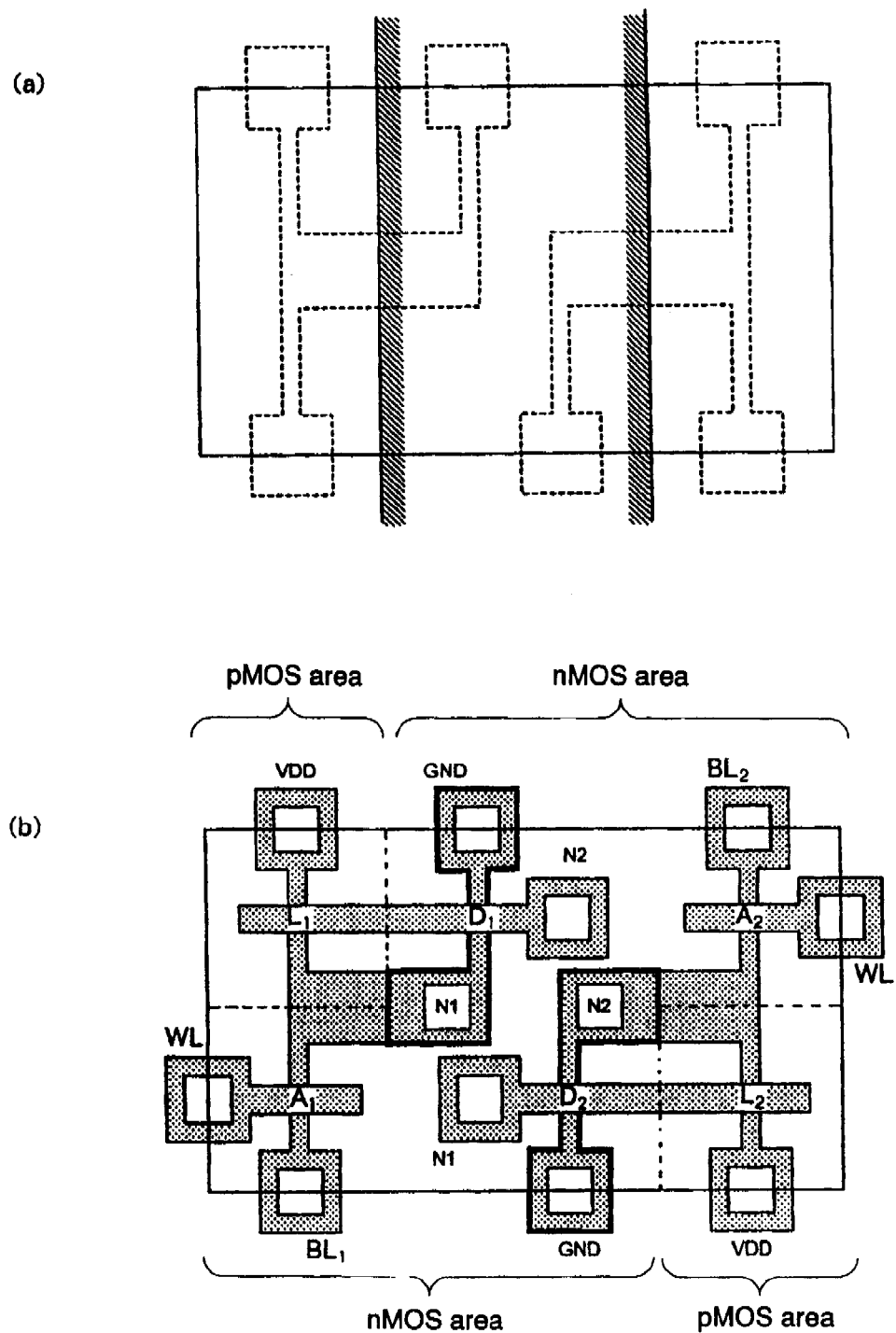
FIG. 32 is a diagram illustrating an element structure of an SRAM cell unit according to the present invention.

FIG. 32 shows another example of the form B. FIGS. 32(a) and 32(b) correspond to FIGS. 31(a) and 29(a), respectively. Like the example shown in FIG. 29(a), the present example shows that the projecting semiconductor layers of the driving transistors $D_1$ and $D_2$ are higher than those of any other transistor. The present example is, as shown in FIG. 32(b), different from the example shown in FIG. 29(a) in that in the second direction (lateral direction of the figure), the arrangement of the driving transistor and load transistor in FIG. 32(b) is opposite to that of the driving transistor and load transistor in the FIG. 29(a). That is, in this arrangement, in the SRAM cell unit, the load transistor $L_1$ has a semiconductor layer integrated with the semiconductor layer of the access transistor $A_1$ and placed on the center line of the semiconductor layer extending along the first direction. The load transistor $A_2$ has a semiconductor layer integrated with the semiconductor layer of the access transistor $A_2$ and placed on the center line of the semiconductor layer extending along the first direction. The driving transistor $D_1$ has a semiconductor layer adjacent to the semiconductor layer of the load transistor $L_1$. The driving transistor $D_2$ has a semiconductor layer adjacent to the semiconductor layer of the load transistor $L_2$. Further, the driving transistors $D_1$ and $D_2$ are arranged so that the interval between the center lines of semiconductor layers of the driving transistors $D_1$ and $D_2$ is equal to the minimum value.

This SRAM element structure can be formed by, before the step of patterning the semiconductor layer, thinning the semiconductor layer except for the areas for forming the projecting semiconductor layers of the driving transistors $D_1$ and $D_2$. That is, as shown in FIG. 32(a), an area (corresponding to an area enclosed by shaded bands) including the areas for forming the driving transistors $D_1$ and $D_2$ is masked. The semiconductor layer in the remaining area including the projecting semiconductor layers of the other transistors is dry etched and thinned. This enables the formation of a semiconductor layer pattern shown by a dotted line in FIG. 32(a) and In which the semiconductor layer is higher in areas enclosed by thick lines in FIG. 32(b) than in the other areas. Then, a cap insulating film 504 is formed. Subsequently, the SRAM element structure shown in FIG. 32(b) can be obtained in a manner similar to the manufacturing method described with reference to FIGS. 8 to 11. In this example, a thick area (high area) and a thin area (low area) can be alternatively formed in the semiconductor layer. This enables the thickness of the semiconductor layer to be easily controlled. In this example, the positions of the nMOS area and pMOS area are varied depending on the arrangement of the transistors as shown in FIG. 32(b).

ANOTHER EXAMPLE OF THE SRAM ELEMENT STRUCTURE

Figure 33:
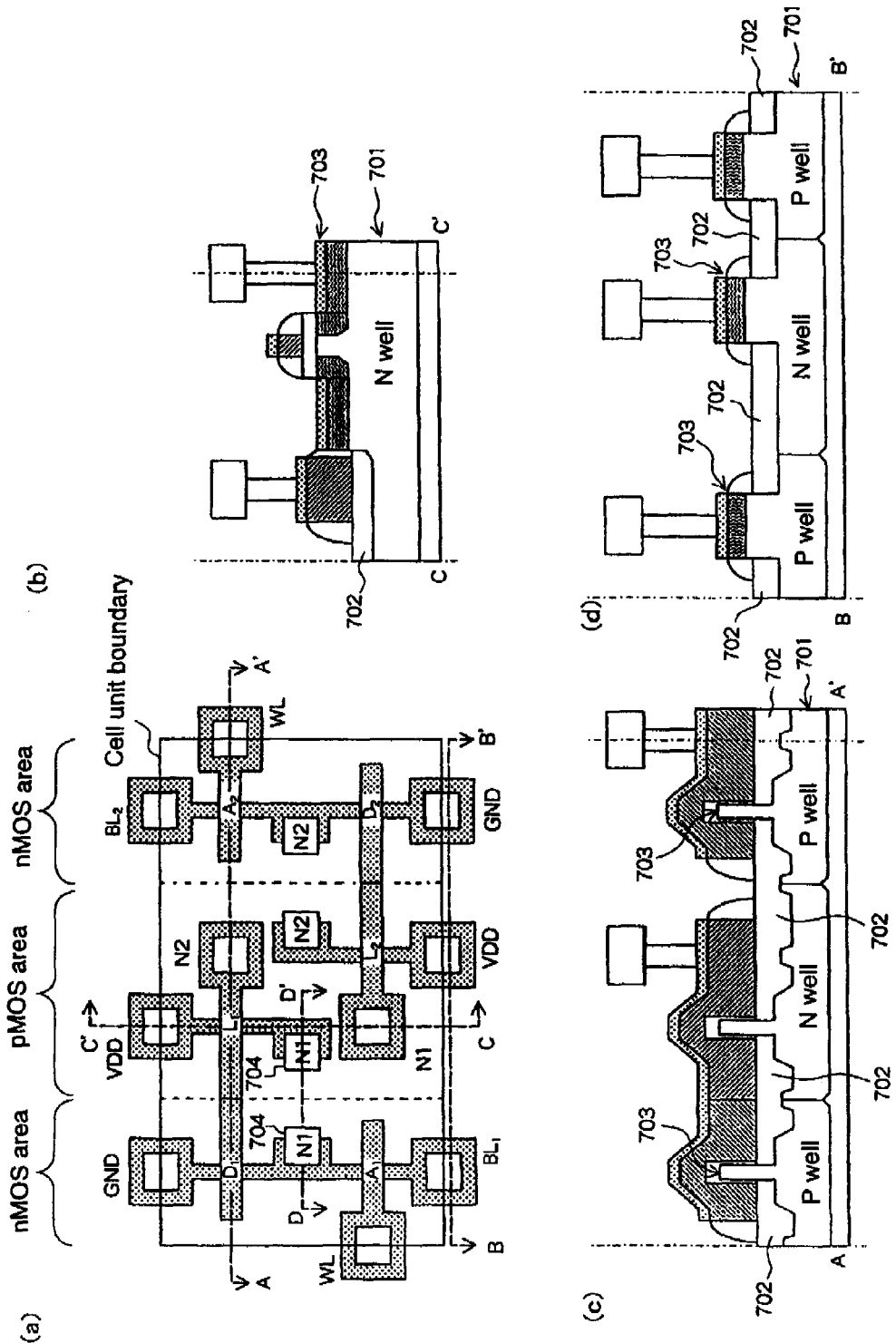
FIG. 33 is a diagram illustrating an element structure of an SRAM cell unit according to the present invention.
Figure 34:
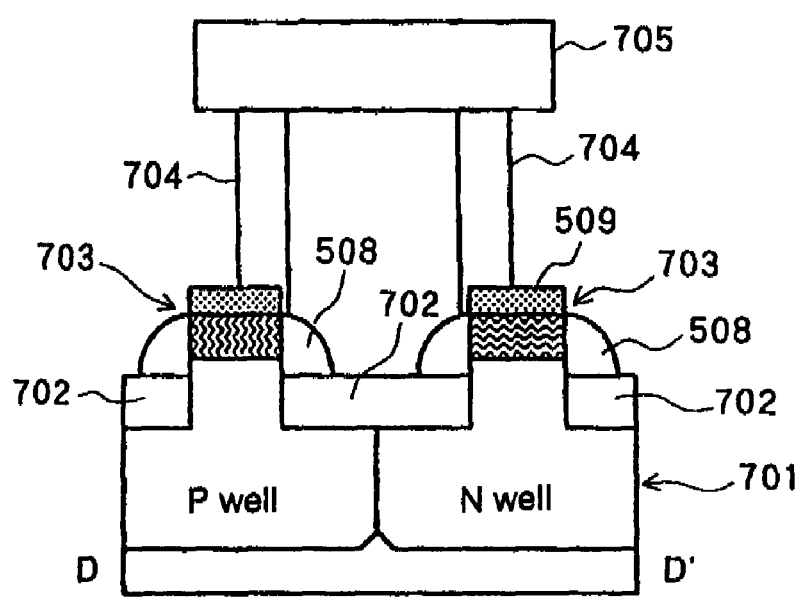
FIG. 34 is a diagram illustrating an element structure of an SRAM cell unit according to the present invention.

FIGS. 33 and 34 show other element structures of the SRAM cell unit. FIG. 33(a) is a plan view. FIG. 33(b) is a sectional view taken along line C-C'. FIG. 33(c) is a sectional view taken along line A-A'. FIG. 33(d) is a sectional view taken along line B-B'. FIG. 34 is a sectional view taken along line D-D'. The side wall insulating films 508 are omitted in FIG. 33(a). Vertical broken lines in the right and left of each of FIGS. 33(b) to 33(d) indicate cell unit boundaries. Further, these drawings show that the transistors have an equal number of projecting semiconductor layers and an equal projecting semiconductor layer height. However, as is the case with the forms A and B, the number of projecting semiconductor layers in each transistor and the height of the projecting semiconductor layers can be set in accordance with the desired characteristics.

In the present example, a bulk semiconductor substrate is used in place of the SOI substrate. The projecting semiconductor layer of the FIN type FET is made of a part of the semiconductor substrate. The projecting semiconductor layer projects upward from the surface of an isolating insulation film provided on the semiconductor substrate. Further, the semiconductor layer portion constituting the drain of the driving transistor is separated from the semiconductor layer portion constituting the drain of the load transistor. The storage node contact is connected to each of the semiconductor layer portions. Except for these points, the structure of the present embodiment is similar to the SRAM structure shown in FIGS. 5 and 6, described above.

A semiconductor pattern 703 in the present example is integrated with a bulk semiconductor substrate 701 and composed of a portion thereof as shown in FIGS. 33(b) and 33(c). The semiconductor layer pattern 703 projects upward from the surface of an isolating insulation film 702 provided on the semiconductor substrate 701. The periphery of the projecting portion is surrounded by the isolating insulation film. That is, the isolating insulation film 702 is provided on the semiconductor substrate except for the projecting semiconductor layer patterns. In the semiconductor substrate area under the semiconductor layer pattern and isolating insulation film, P wells are provided in the nMOS area, whereas N wells are provided in the pMOS area.

In the contact structure of the storage node according to the present example, as shown in FIGS. 33(a) and 34, contact plugs 704 are connected to the semiconductor layer (n type) constituting the drain of the driving transistor and the semiconductor layer (p type) constituting the drain of the load transistor. The contact plugs 704 can be connected together via upper wiring 705. When a pn junction is formed in the semiconductor layer to directly join both drains as shown in FIGS. 5 and 7, the diffusion areas in the projecting semiconductor layers and the underlayer wells are short circuited. Thus, in the present embodiment, the n- and p-type semiconductor layers constituting the drain are isolated from each other by the isolating insulation film 702. The isolated semiconductor layers are connected by the upper layer wiring 705 via the contact plugs 704 that connect to the semiconductor layers. Instead of using this structure, the p-type semiconductor layer and n-type semiconductor layer may be directly connected together via the buried conductor wire shown in FIG. 24(b).

The above configuration can be manufactured, for example, as described below.

A semiconductor substrate, for example, a silicon substrate is prepared in which a P well and an N well are provided in predetermined areas. Ions are implanted in the silicon substrate as required to form a channel area. A cap insulating film is formed all over the surface of the silicon substrate.

Figure 35:
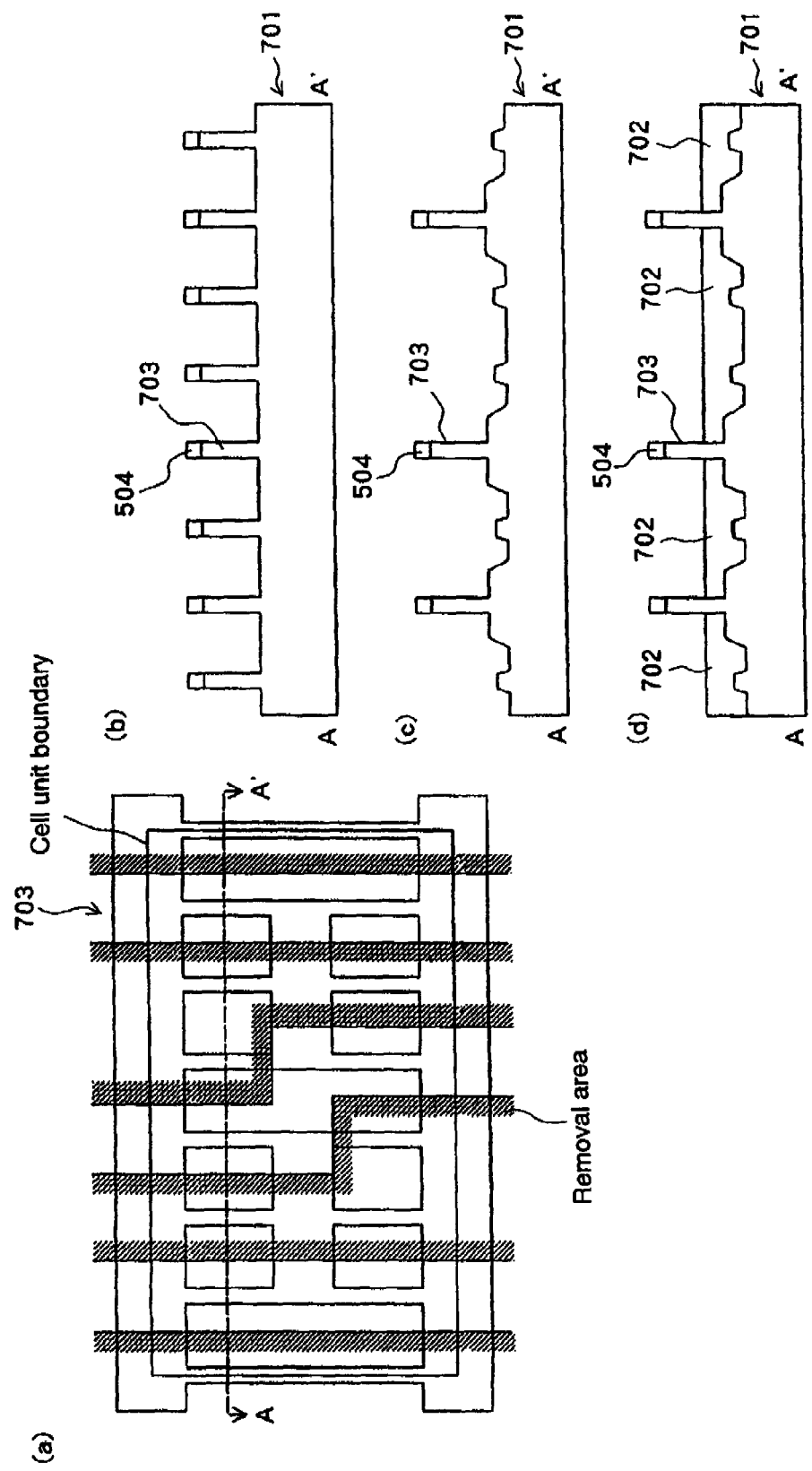
FIG. 35 is a diagram illustrating a method for manufacturing an SRAM structure according to the present invention.

The silicon substrate and the cap insulating film formed on the silicon substrate are patterned by photolithography and dry etching to form a semiconductor layer pattern having a striped pattern in which elongate semiconductor layers are arranged at equal intervals. This state is shown in FIGS. 35(a) and 35(b). FIG. 35(a) is a plan view. FIG. 35(b) is a sectional view taken along line A-A'. Areas enclosed by oblique lines in FIG. 35(a) show areas from which the semiconductor layer pattern is to be removed in the subsequent step.

Unwanted portions of the semiconductor layer pattern are then removed by lithography and dry etching. The sectional view in FIG. 35(c) taken along line A-A' shows how the unwanted portions are removed.

Then, an insulating film is deposited all over the surface so as to bury the remaining semiconductor layer pattern. The surface of the insulating film is flattened by CMP (Chemical Mechanical Polishing). The insulating film is subsequently etched back to expose the top of the semiconductor layer pattern 703. An isolating insulation film 702 is formed around the periphery of the semiconductor layer pattern. The sectional view in FIG. 35(d) taken along line A-A' shows how the isolating insulation film 702 is formed.

Subsequently, the SRAM structure of the present embodiment can be produced in a manner similar to the above-described manner described using FIGS. 8 to 11 except for the steps relating to the contact structure of the storage node.

The invention claimed is:

1. A semiconductor device having SRAM cell units each comprising a pair of a first driving transistor and a second driving transistor, a pair of a first load transistor and a second load transistor, and a pair of a first access transistor and a second access transistor, wherein:
each of the transistors comprises:
a semiconductor layer projecting upward from a substrate plane,
a gate electrode extending on opposite sides of the semiconductor layer so as to stride over a top of the semiconductor layer,
a gate insulating film interposed between the gate electrode and the semiconductor layer, and
a pair of source/drain areas formed in the semiconductor layer;
the semiconductor layers under the respective gate electrodes, the semiconductor layers constituting the transistors in the SRAM cell units, have an equal width in a direction parallel to a substrate plane and perpendicular to a channel length direction; and
at least one of a number or a height of the semiconductor layer of each of the first and second driving transistors is larger than that of at least one of each of the load transistors or each of the access transistors, such that the first and second driving transistors each have a channel width larger than that of at least either each of the load transistors or each of the access transistors.

2. The semiconductor device according to claim 1, wherein the first and second driving transistors each have a channel width larger than that of each of the access transistors.

3. The semiconductor device according to claim 1 or 2, wherein the first and second driving transistors and the first and second access transistors each have a channel width larger than that of each of the load transistors.

4. The semiconductor device according to claim 1, wherein the first and second driving transistors each have a plurality of the semiconductor layers in one transistor, and the number of the semiconductor layers is larger than that of semiconductor layers constituting each of the access transistors.

5. The semiconductor device according to claim 1 or 4, wherein the first and second driving transistors and the first and second access transistors each have a plurality of the semiconductor layers in one transistor, and the number of the semiconductor layers is larger than that of semiconductor layers constituting each of the load transistors.

6. The semiconductor device according to claim 1, wherein the semiconductor layer of each of the first and second driving transistors has a height in a direction perpendicular to the substrate plane which height is larger than that of the semiconductor layer constituting each of the access transistors.

7. The semiconductor device according to claim 1 or 6, wherein the semiconductor layer of each of the first and second driving transistors and first and second access transistors has a height in a direction perpendicular to the substrate plane which height is larger than that of the semiconductor layer constituting each of the load transistors.

8. The semiconductor device according to claim 1, wherein
longitudinal directions of the semiconductor layers constituting the transistors in the SRAM cell unit each are located along a first direction; and
between the adjacent SRAM cell units in the first direction, the semiconductor layer in one of the corresponding transistors is placed on a center line of the semiconductor layer of the other transistor which center line extends along the first direction.

9. The semiconductor device according to claim 8, wherein the semiconductor layers constituting the transistors in the SRAM cell unit have an equal width in a second direction parallel to the substrate plane and perpendicular to the first direction, and the semiconductor layers are arranged so that intervals between center lines of the semiconductor layers which center lines extend along the first direction are each an integral multiple of the minimum one of the intervals.

10. The semiconductor device according to claim 9, wherein in the SRAM cell unit,
the first driving transistor has a semiconductor layer placed on a center line of the semiconductor layer of the first access transistor which center line extends along the first direction, and the second driving transistor has a semiconductor layer placed on a center line of the semiconductor layer of the second access transistor which center line extends along the first direction;
the first load transistor has a semiconductor layer adjacent to the semiconductor layer of the first driving transistor, and the second load transistor has a semiconductor layer adjacent to the semiconductor layer of the second driving transistor; and
the first load transistor and the second load transistor are arranged so that the interval between the center line of the semiconductor layer of the first load transistor and the center line of the semiconductor layer of the second load transistor is equal to the minimum interval.

11. The semiconductor device according to claim 9, wherein in the SRAM cell unit,
the first load transistor has a semiconductor layer placed on a center line of the semiconductor layer of the first access transistor which center line extends along the first direction, and the second load transistor has a semiconductor layer placed on a center line of the semiconductor layer of the second access transistor which center line extends along the first direction;
the first driving transistor has a semiconductor layer adjacent to the semiconductor layer of the first load transistor, and the second driving transistor has a semiconductor layer adjacent to the semiconductor layer of the second load transistor; and
the first driving transistor and the second driving transistor are arranged so that the interval between the center line of the semiconductor layer of the first driving transistor and the center line of the semiconductor layer of the second driving transistor is equal to the minimum interval.

12. The semiconductor device according to claim 9, wherein
the interval between the center lines extending along the first direction of the semiconductor layers of the first driving transistor and the first load transistor which are adjacent to each other is at least double the minimum interval; and
the interval between the center lines extending along the first direction of the semiconductor layers of the second driving transistor and the second load transistor which are adjacent to each other is at least double the minimum interval.

13. The semiconductor device according to claim 9, wherein between the adjacent SRAM cell units in the second direction, the access transistors of one and the other of the SRAM cell units are arranged adjacent to each other, and the interval between the center lines extending along the first direction of the semiconductor layers of one and the other of the access transistors is at least double the minimum interval.

14. The semiconductor device according to claim 9, wherein in the SRAM cell unit:
the first driving transistor has a semiconductor layer placed on a center line of the semiconductor layer of the first access transistor which center line extends along the first direction, and the second driving transistor has a semiconductor layer placed on a center line of the semiconductor layer of the second access transistor which center line extends along the first direction;
the first load transistor has a semiconductor layer adjacent to the semiconductor layer of the first driving transistor, and the second load transistor has a semiconductor layer adjacent to the semiconductor layer of the second driving transistor;
the first load transistor and the second load transistor are arranged so that the interval between the center line of the semiconductor layer of the first load transistor and the center line of the semiconductor layer of the second load transistor is equal to the minimum interval;
the interval between the center lines extending along the first direction of the semiconductor layers of the first driving transistor and the first load transistor which are adjacent to each other is at least double the minimum interval equal to the interval between the center line of the semiconductor layer of the first load transistor and the center line of the semiconductor layer of the second load transistor; and
the interval between the center lines extending along the first direction of the semiconductor layers of the second driving transistor and the second load transistor which are adjacent to each other is at least double the minimum interval equal to the interval between the center line of the semiconductor layer of the first load transistor and the center line of the semiconductor layer of the second load transistor.

15. The semiconductor device according to claim 9, wherein in the SRAM cell unit:
the first load transistor has a semiconductor layer placed on a center line of the semiconductor layer of the first access transistor which center line extends along the first direction, and the second load transistor has a semiconductor layer placed on a center line of the semiconductor layer of the second access transistor which center line extends along the first direction;
the first driving transistor has a semiconductor layer adjacent to the semiconductor layer of the first load transistor, and the second driving transistor has a semiconductor layer adjacent to the semiconductor layer of the second load transistor;
the first driving transistor and the second driving transistor are arranged so that the interval between the center line of the semiconductor layer of the first driving transistor and the center line of the semiconductor layer of the second driving transistor is equal to the minimum interval;
the interval between the center lines extending along the first direction of the semiconductor layers of the first driving transistor and the first load transistor which are adjacent to each other is at least double the minimum interval equal to the interval between the center line of the semiconductor layer of the first driving transistor and the center line of the semiconductor layer of the second driving transistor; and
the interval between the center lines extending along the first direction of the semiconductor layers of the second driving transistor and the second load transistor which are adjacent to each other is at least double the minimum interval equal to the interval between the center line of the semiconductor layer of the first driving transistor and the center line of the semiconductor layer of the second driving transistor.

16. The semiconductor device according to claim 8, wherein in the SRAM cell unit,
the gate electrode of the first driving transistor and the gate electrode of the first load transistor are formed of a first wire extending along the second direction perpendicular to the first direction, and the gate electrode of the second driving transistor and the gate electrode of the second load transistor are formed of a second wire extending along the second direction; and the gate electrode of the first access transistor is formed of a third wire placed on a center line of the second wire extending along the second direction and the gate electrode of the second access transistor is formed of a fourth wire placed on a center line of the first wire extending along the second direction.

17. The semiconductor device according to claim 8, wherein a ground line contact connected to the source area of the first driving transistor, a power source line contact connected to the source area of the first load transistor, and a bit line contact connected to the source/drain area of the second access transistor are arranged on one line at one of cell unit boundaries extending along the second direction; and a ground line contact connected to the source area of the second driving transistor, a power source line contact connected to the source area of the second load transistor, and a bit line contact connected to the source/drain area of the first access transistor are arranged on one line at the other cell unit boundary extending along the second direction.

18. The semiconductor device according to claim 8, wherein each of the ground line contacts, the power source line contacts, and the bit line contacts has a width in the second direction which is larger than the width in the second direction of the semiconductor layer under the gate electrode, and is connected to a pad semiconductor layer integrated with the semiconductor layer.

19. The semiconductor device according to claim 8, wherein the adjacent SRAM cell units are in a mirror image relationship with respect to the cell unit boundary, which serves as a symmetry axis.

20. The semiconductor device according to claim 8, wherein in the SRAM cell unit, each of the semiconductor layers constituting the transistors is made of a semiconductor layer provided on an insulating layer; and the first driving transistor has a semiconductor layer integrated with the semiconductor layer of the first access transistor and the semiconductor layer of the first load transistor, and the second driving transistor has a semiconductor layer integrated with the semiconductor layer of the second access transistor and the semiconductor layer of the second load transistor.

21. The semiconductor device according to claim 8, wherein in the SRAM cell unit, each of the semiconductor layers constituting the transistors is made of a semiconductor layer provided on an insulating layer;

the SRAM cell unit has, on the insulating layer, a first semiconductor layer area integrated with the semiconductor layer of the first driving transistor, the semiconductor layer of the first load transistor and the semiconductor layer of the first access transistor and having a junction between an area of the first conductivity type and an area of the second conductivity type together, and a second semiconductor layer area integrated with the semiconductor layer of the second driving transistor, the semiconductor layer of the second load transistor and the semiconductor layer of the second access transistor and having a junction between an area of the first conductivity type and an area of the second conductivity type together; and the first node contact connected to a drain area of the first driving transistor and to a drain area of the first load transistor is connected to the first semiconductor layer area, and the second node contact connected to a drain area of the second driving transistor and to a drain area of the second load transistor is connected to the second semiconductor layer area.

22. A method for manufacturing a semiconductor device according to claim 8, comprising the steps of:

pattering a semiconductor layer to form a semiconductor pattern having a striped pattern in which elongate semiconductor layers extending in a first direction and having an equal width in a second direction perpendicular to the first direction are arranged at equal intervals;

removing a part of the striped pattern;

forming a gate insulating film on sides of the remaining elongate semiconductor layers;

depositing a gate electrode material and pattering the gate electrode material deposit film to form gate electrodes each extending on opposite surfaces of the elongate semiconductor layer along the second direction so as to stride over a top of the elongate semiconductor layer; and doping impurities into each elongate semiconductor layer to form source/drain areas.

23. The method for manufacturing a semiconductor device according to claim 22, wherein the semiconductor layer patterns are line symmetric with respect to each of four sides of a rectangular unit boundary corresponding to an SRAM cell unit boundary, which serves as a symmetry axis.

24. The method for manufacturing a semiconductor device according to claim 22, further comprising the steps of:

in the step of forming the semiconductor layer pattern, forming a band-like pattern which crosses the elongate semiconductor layers and which has a width in a first direction which is larger than the width in a second direction of the elongate semiconductor layers;

in the step of removing a part of the striped pattern, also removing a part of the band-like pattern to form pad semiconductor layers each having a width in the second direction which is larger than the with in the second direction of each of the elongate semiconductor layers; and forming contact plugs that connect to the pad semiconductor layers after forming an interlayer insulating film all over the surface.

25. The semiconductor device according to claim 1, wherein each of the semiconductor layers constituting the transistors in the SRAM cell unit is made of a semiconductor layer provided on an insulating layer.

26. The semiconductor device according to claim 1, wherein each of the semiconductor layers constituting the transistors in the SRAM cell unit is formed of a part of a semiconductor substrate and projects from a top surface of an isolating insulating film on the semiconductor substrate.

27. The semiconductor device according to claim 1, wherein in the SRAM cell unit, semiconductor layers of a first access transistor and a second access transistor are located so that their longitudinal directions extend along a first direction and the semiconductor layers are arranged adjacent and parallel to one another along the second direction perpendicular to the first direction;

gate electrodes of the first and second access transistors are formed of a common word wire placed along the second direction so as to cross the semiconductor layers of the access transistors;

semiconductor layers of a first driving transistor and a first load transistor are located so that their longitudinal directions extend along the second direction and the semiconductor layers are arranged adjacent and parallel to one another along the first direction; and semiconductor layers of a second driving transistor and a second load transistor are located so that their longitudinal direction extend along the second direction and so that the semiconductor layers are arranged adjacent and parallel to one another along the first direction.

28. The semiconductor device according to claim 27, wherein in the SRAM cell unit, each of the semiconductor layers constituting the transistors is made of a semiconductor layer provided on an insulating layer; and the first driving transistor has a semiconductor layer integrated with the semiconductor layer of the first access transistor and the semiconductor layer of the first load transistor, and the second driving transistor has a semiconductor layer integrated with the semiconductor layer of the second access transistor and the semiconductor layer of the second load transistor.

29. The semiconductor device according to claim 27, wherein in the SRAM cell unit, each of the semiconductor layers constituting the transistors is made of a semiconductor layer provided on an insulating layer;

the SRAM cell unit has, on the insulating layer, a first semiconductor layer area integrated with the semiconductor layer of the first driving transistor, the semiconductor layer of the first load transistor, and the semiconductor layer of the first access transistor and having a junction between an area of a first conductivity type and an area of a second conductivity type which junction is perpendicular to the substrate plane, and a second semiconductor layer area integrated with the semiconductor layer of the second driving transistor, the semiconductor layer of the second load transistor, and the semiconductor layer of the second access transistor and having a junction between an area of a first conductivity type and an area of a second conductivity type which junction is perpendicular to the substrate plane; and a first node contact that connects to the drain area of the first driving transistor and to the drain area of the first load transistor connects to the first semiconductor layer area, and a second node contact that connects to the drain area of the second driving transistor and to the drain area of the second load transistor connects to the second semiconductor layer area.

30. The semiconductor device according to claim 27, wherein between the adjacent SRAM cell units, a semiconductor layer pattern including the semiconductor layers constituting the transistors and a gate wire pattern constituting the gate electrodes are in a mirror image relationship with respect to a cell unit boundary that serves as a symmetry axis.

31. A method for manufacturing the semiconductor device according to claim 1, comprising the steps of:

partly thinning a part of a semiconductor layer so that at least either an area in which the access transistors are to be formed or an area in which the load transistors are to be formed is thinner than an area in which the driving transistors are to be formed;

patterning the semiconductor layer partly thinned in the thinning step to form a semiconductor layer pattern having the semiconductor layers constituting the transistors;

forming a gate insulating layer on sides of each of the semiconductor layers;

depositing a gate electrode material and patterning the gate electrode material deposited film to form gate electrodes on opposite sides of the semiconductor layer constituting each transistor so that the gate electrode strides over the top of the semiconductor layer; and forming source/drain areas in the semiconductor layer.

32. The method for manufacturing the semiconductor device according to the claim 31, wherein in the thinning step, the semiconductor layer is partly thinned so that the areas in which the access transistors are to be formed is thinner than the areas in which the driving transistors are to be formed; and an SRAM cell unit is formed in which the semiconductor layers constituting the first and second driving transistors each have a height in a direction perpendicular to the substrate plane which height is larger than that of each of the semiconductor layers constituting the first and second access transistors.

33. The method for manufacturing the semiconductor device according to the claim 31 or 32, wherein in the thinning step, the semiconductor layer is partly thinned so that the areas in which the load transistors are to be formed is thinner than the areas in which the driving transistors and the access transistors are to be formed; and an SRAM cell unit is formed in which the semiconductor layers constituting the first and second driving transistors and first and second access transistors each have a height in a direction perpendicular to the substrate plane which height is larger than that of each of the semiconductor layers constituting the first and second load transistors.

34. The semiconductor device according to claim 1, wherein longitudinal directions of the semiconductor layers constituting the transistors in the SRAM cell unit each are located along a first direction.

35. The semiconductor device according to claim 34, wherein the semiconductor layers are arranged such that intervals between center lines of the semiconductor layers, the center lines extending along the first direction, are each an integral multiple of the minimum one of the intervals.

* * * * *

UNITED STATES PATENT AND TRADEMARK OFFICE
CERTIFICATE OF CORRECTION

| | | |
|---|---|---|
| PATENT NO. | : 7,830,703 B2 | Page 1 of 1 |
| APPLICATION NO. | : 11/570037 | |
| DATED | : November 9, 2010 | |
| INVENTOR(S) | : Koichi Takeda et al. | |

It is certified that error appears in the above-identified patent and that said Letters Patent is hereby corrected as shown below:

Title Page, Item (56)
Column 2, Line 3: Delete "MEtting," and insert -- Meeting, --

In the Specifications:
Column 1, Line 6: Delete "Dec. 15, 2005," and insert -- Jun. 4, 2004, --
Column 1, Line 46: Delete "11 and 12" and insert -- $l_1$ and $l_2$ --
Column 3, Line 58: Delete "transistors," and insert -- transistors. --
Column 7, Line 12: Delete "with" and insert -- width --
Column 12, Line 7: Delete "ON" and insert -- On --
Column 12, Line 8: Delete "Spinnel)" and insert -- Spinel) --
Column 12, Line 23: Delete "suicide," and insert -- silicide, --
Column 12, Line 25: Delete "singe" and insert -- single --
Column 13, Line 7: Delete "11 and 12" and insert -- $l_1$ and $l_2$ --
Column 13, Line 50: Delete "heights," and insert -- heights. --
Column 19, Line 40: Delete "A-A'," and insert -- A-A'. --
Column 26, Line 15: Delete "In" and insert -- in --

In the Claims:
Column 32, Line 9: In Claim 22, after "according" insert -- to --
Column 32, Line 41: In Claim 24, delete "with" and insert -- width --

Signed and Sealed this

Seventeenth Day of May, 2011

David J. Kappos
*Director of the United States Patent and Trademark Office*